US012733195B2

(12) United States Patent
Nishimura

(10) Patent No.: US 12,733,195 B2
(45) Date of Patent: Sep. 8, 2026

(54) NITRIDE SEMICONDUCTOR DEVICE

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 418 days.

(21) Appl. No.: 18/220,277

(22) Filed: Jul. 11, 2023

(65) Prior Publication Data

US 2024/0021717 A1 Jan. 18, 2024

(30) Foreign Application Priority Data

Jul. 15, 2022 (JP) ................................ 2022-114106
Jul. 25, 2022 (JP) ................................ 2022-117924
Jun. 2, 2023 (JP) ................................ 2023-091746

(51) Int. Cl.
*H10D 30/47* (2025.01)
*H10D 30/01* (2025.01)
*H10D 62/17* (2025.01)
*H10D 62/85* (2025.01)
*H10D 64/00* (2025.01)

(52) U.S. Cl.
CPC ......... *H10D 30/475* (2025.01); *H10D 30/015* (2025.01); *H10D 62/343* (2025.01); *H10D 62/8503* (2025.01); *H10D 64/111* (2025.01)

(58) Field of Classification Search
CPC .. H10D 30/475; H10D 30/015; H10D 62/343; H10D 62/8503; H10D 64/111
See application file for complete search history.

(56) References Cited

U.S. PATENT DOCUMENTS

2007/0194354 A1* 8/2007 Wu ...................... H10D 64/111 257/E29.093
2016/0141404 A1* 5/2016 Tsai ................... H10D 30/4755 438/172
2017/0104091 A1 4/2017 Tanaka
2020/0357905 A1* 11/2020 Lu ........................ H10D 64/251
2021/0217884 A1* 7/2021 Macelwee ........... H01L 21/0254

FOREIGN PATENT DOCUMENTS

CN 113257896 A * 8/2021 ......... H10D 30/4755
JP 2017-073506 A 4/2017

* cited by examiner

*Primary Examiner* — Jay C Kim
*Assistant Examiner* — Woo K Lee
(74) *Attorney, Agent, or Firm* — XSENSUS LLP

(57) ABSTRACT

A nitride semiconductor device includes an electron transit layer, formed above a substrate, and an electron supply layer formed on the electron transit layer and having a larger band gap than the electron transit layer. A gate layer is formed on the electron supply layer and contains an acceptor impurity. A gate electrode is formed on the gate layer. A source electrode and a drain electrode are located at opposite sides of the gate layer and contact the electron supply layer. The gate electrode has a greater length than the gate layer in a first direction in which the source electrode, the gate layer, and the drain electrode are arranged. The gate electrode contacts an entire upper surface of the gate layer and extends from the gate layer toward at least one of the source electrode and the drain electrode.

18 Claims, 42 Drawing Sheets

10
26
27B
27A
26B
18B
18
20
17B
17A
16
14
12
34
26S
27BS
32C
27AS
27BR
27AR
12S
32B
24B
46
24EB
46R
(24R)
46S
(24S)
22B
42
42R
(24R)
22R
42S
(24S)
22S
22
44S
(24S)
24A
44
24EA
44R
(24R)
22A
24
32
32A
26A
18A
+Z
Y
+X 210
26
27B
27A
18
20
16
27AS
27BR
224B
224EB
46S
(224S)
24
46
46R
(224R)
22B
L46
42D
L224
42S
(224S)
42R
(224R)
22R
42
22S
L22
22
42C
22A
L44
44S
(224S)
224A
44
224EA
44R
(224R)
32
+Z
+X
Y 310
26
27B
27A
26B
18B
18
20
17B
17A
16
14
12
34
26S
27BS
32C
27AS
27BR
27AR
12S
32B
324B
46
46R
(324R)
46S
(324S)
42
42R
(324R)
22B
22R
22
22S
42S
(324S)
324
324A
22A
32
32A
26A
18A
+Z
Y
+X 510
26B
27B
27A
26
18B
18
20
17B
17A
16
14
12
34
26S
27BS
32C
27AS
27BR
27AR
12S
32B
556
24B
46
24EB
46R
(24R)
552B
46S
(24S)
42
42R
(24R)
552R
522
552
42S
(24S)
552S
552A
44S
(24S)
24
24A
44
24EA
44R
(24R)
554
32
32A
26A
18A
+Z
+X
Y 610
626
618
620
616
614
612
630 (640)
647
641
626B (626C)
618A
647
626S
631A
631 (647)
624
622
628 (640)
641
626A (626C)
618A
647

NITRIDE SEMICONDUCTOR DEVICE

CROSS-REFERENCE TO RELATED APPLICATIONS

This application is based upon and claims the benefit of priority from Japanese Patent Application No. 2022-117924 filed on Jul. 25, 2022, Japanese Patent Application No. 2022-114106 filed on Jul. 15, 2022, and Japanese Patent Application No. 2023-091746 filed on Jun. 2, 2023, in the Japan Patent Office, the entire disclosures of these applications are incorporated herein by reference.

BACKGROUND

1. Field

This disclosure relates to a nitride semiconductor device.

2. Description of Related Art

High-electron-mobility transistors (HEMTs) are now being commercialized. An HEMT is one type of field effect transistor (FET) that uses a group III semiconductor such as gallium nitride (GaN). A HEMT uses two-dimensional electron gas (2DEG) formed near a semiconductor heterojunction interface as a conduction path (channel). A power device using a HEMT has a lower ON resistance and is operable at a higher speed and higher frequency than a typical silicon (Si) power device.

Japanese Laid-Open Patent Publication No. 2017-73506 describes one example of a nitride semiconductor device. The nitride semiconductor device includes an electron transit layer, which is formed by a gallium nitride (GaN) layer, and an electron supply layer, which is formed by an aluminum gallium nitride (AlGaN) layer. Two-dimensional electron gas (2DEG) is formed in the electron transit layer near the heterojunction interface of the electron transit layer and the electron supply layer. In the nitride semiconductor device, a gate layer (e.g., p-type GaN layer) containing an acceptor impurity is located on the electron transit layer underneath a gate electrode. In this structure, a depletion layer spreading downward from the gate layer depletes the channel located underneath the gate layer and obtains a normally-off state.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
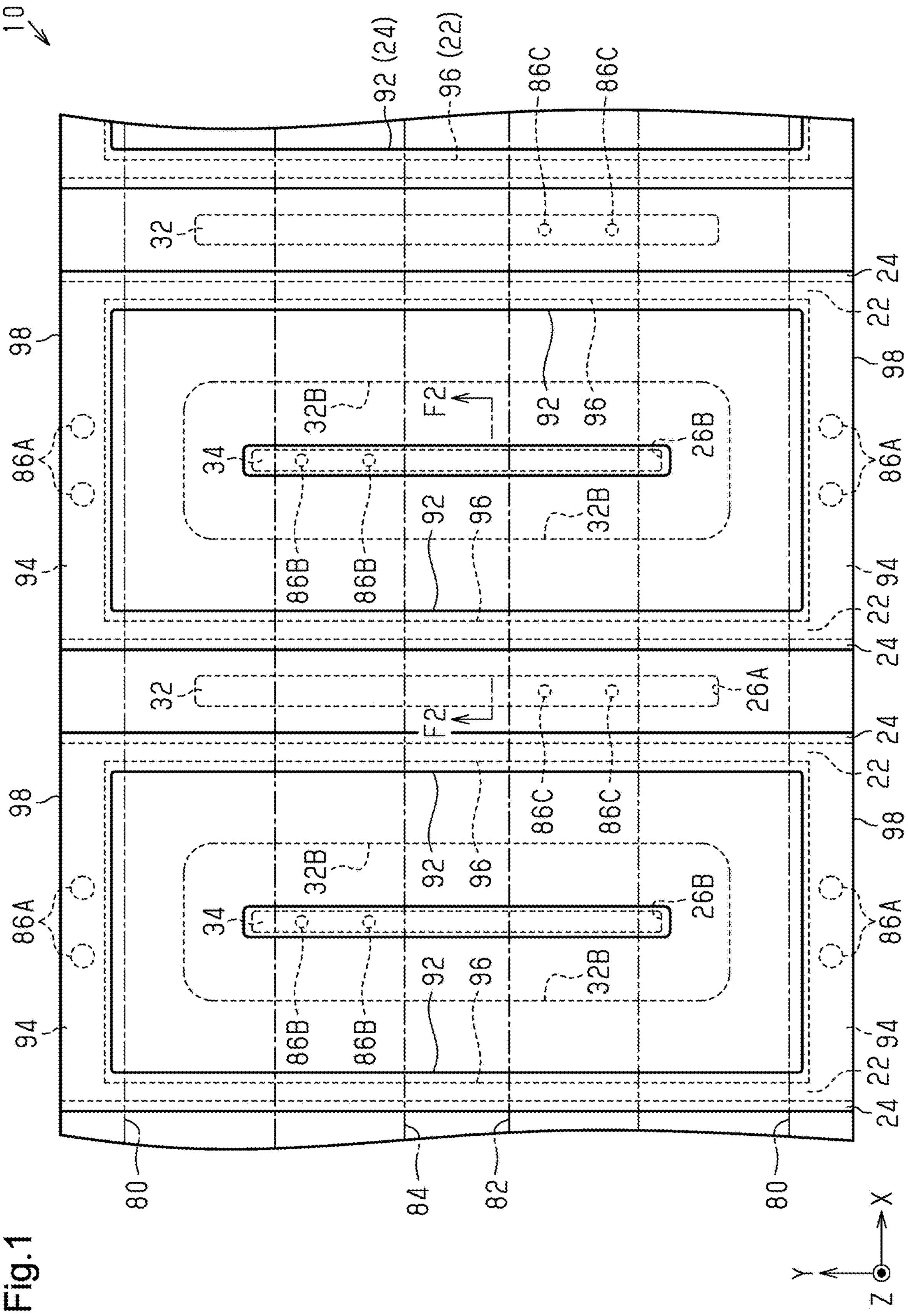
FIG. 1 is a schematic plan view exemplifying a nitride semiconductor device in accordance with a first embodiment.

Several embodiments of a semiconductor device in accordance with the present disclosure will now be described with reference to the accompanying drawings. In the drawings, elements are illustrated for simplicity and clarity and have not necessarily been drawn to scale. To facilitate understanding, hatching lines may not be shown in the cross-sectional drawings. The accompanying drawings illustrate exemplary embodiments in accordance with the present disclosure and are not intended to limit the present disclosure.

This detailed description provides a comprehensive understanding of the methods, apparatuses, and/or systems described. Exemplary embodiments may have different forms, and are not limited to the examples described.

First Embodiment

Cross-Sectional Structure of Nitride Semiconductor Device

Figure 2:
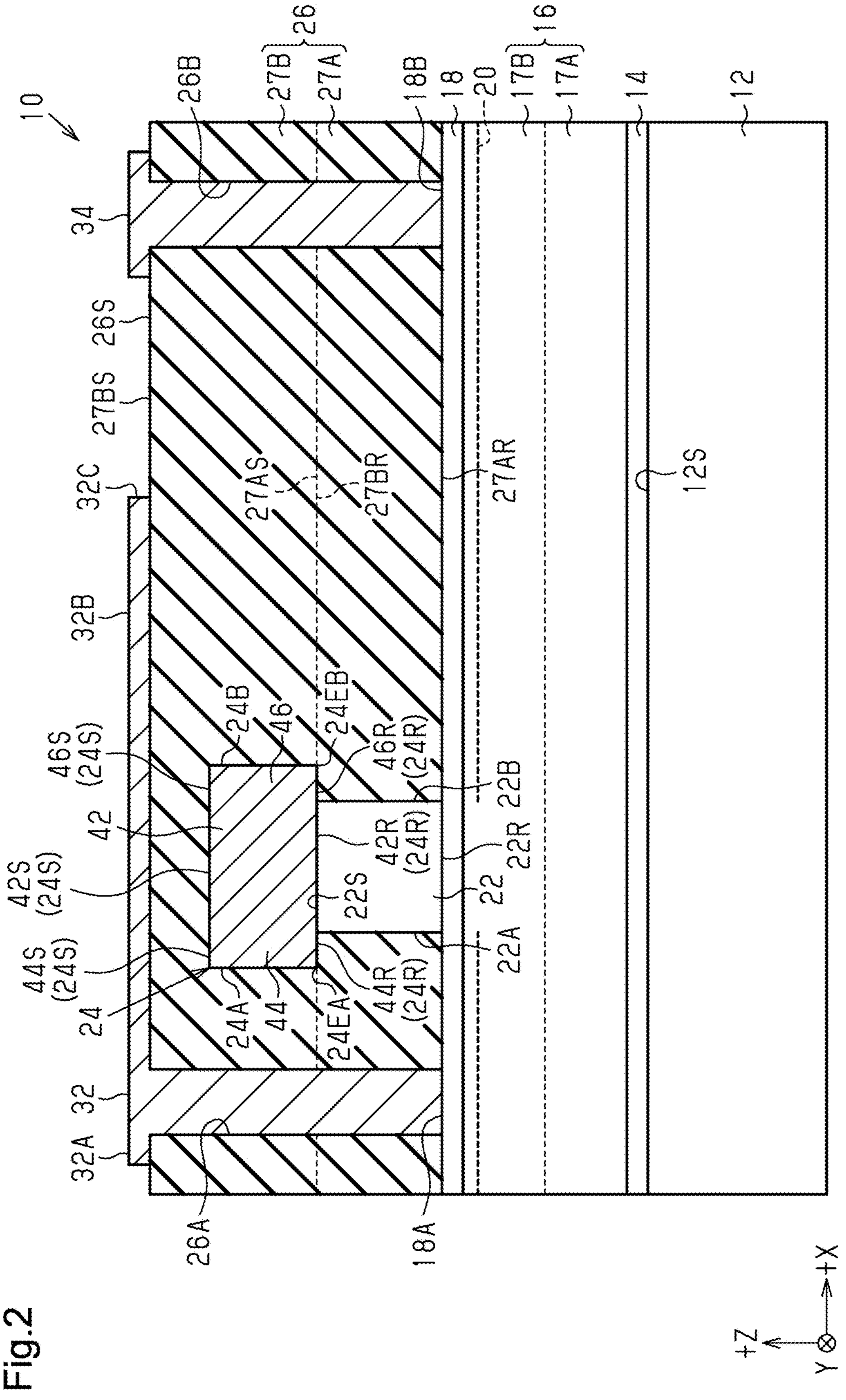
FIG. 2 is a schematic cross-sectional view of the nitride semiconductor device taken along line F2-F2 in FIG. 1.
Figure 3:
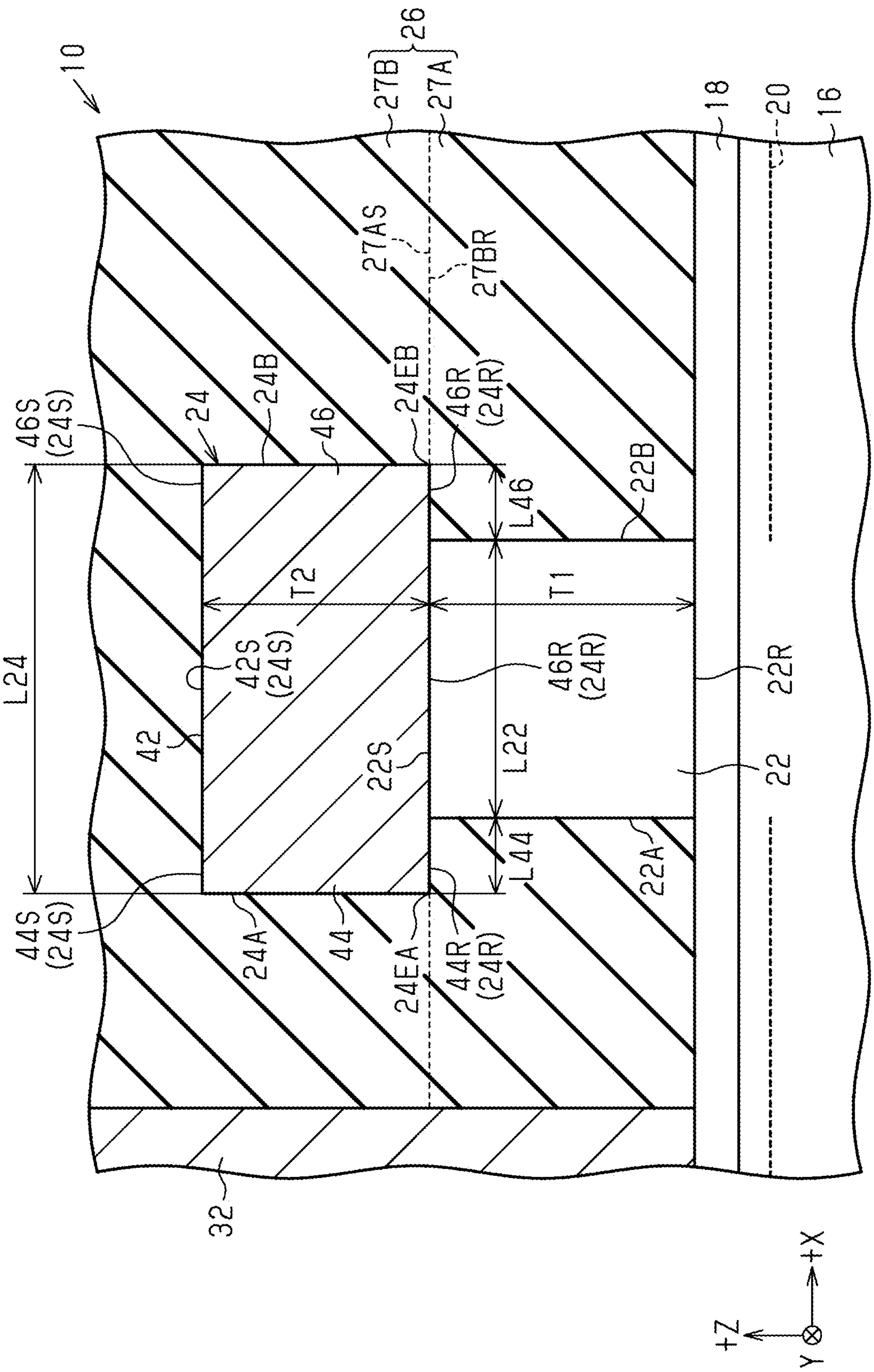
FIG. 3 is a schematic cross-sectional view enlarging part of FIG. 2.

FIG. 2 is a schematic cross-sectional view exemplifying a nitride semiconductor device 10 in accordance with a first embodiment. FIG. 3 is a schematic cross-sectional view enlarging part of FIG. 2.

In this specification, the X-axis, Y-axis, and Z-axis are orthogonal to one another as shown in FIG. 2. The term "plan view" as used in this specification is a view of the nitride semiconductor device 10 taken in the Z-axis direction. Further, in FIG. 2, which shows the nitride semiconductor device 10, the +Z direction corresponds to the upward direction, the −Z direction corresponds to the downward direction, the +X direction corresponds to the rightward direction, and the −X direction corresponds to the leftward direction. Unless otherwise indicated, the term "plan view" will refer to a view taken from above along the Z-axis of the nitride semiconductor device 10.

The nitride semiconductor device 10 may be a high-electron-mobility transistor (HEMT) that uses a nitride semiconductor. The nitride semiconductor device 10 includes a substrate 12, a buffer layer 14 formed on the substrate 12, an electron transit layer 16 formed on the buffer layer 14, and an electron supply layer 18 formed on the electron transit layer 16. The nitride semiconductor device 10 further includes a gate layer 22 formed on the electron supply layer 18, and a gate electrode 24 formed on the gate layer 22.

The substrate 12 may be, for example, a silicon (Si) substrate. The substrate 12 may have a thickness of, for example, 200 μm or greater and 1500 μm or less. The substrate 12 includes an upper surface 12S. A silicon carbide (SiC) substrate, a gallium nitride (GaN) substrate, or a sapphire substrate may be used as the substrate 12 instead of a silicon substrate. In the description hereafter, thickness will mean the dimension in the Z-direction indicated in FIGS. 2 and 3 unless otherwise specified.

The buffer layer 14 may be formed from any material that limits wafer warping or cracking that would be caused by a difference in coefficient of thermal expansion between the substrate 12 and the electron transit layer 16. Further, the buffer layer 14 may include one or more nitride semiconductor layers. The buffer layer 14 may include at least one of an aluminum nitride (AlN) layer, an aluminum gallium nitride (AlGaN) layer, and a graded AlGaN layer of different aluminum (Al) compositions. For example, the buffer layer 14 may be a single film of AlN, a single film of AlGaN, a film having an AlGaN/GaN superlattice structure, a film having an AlN/AlGaN superlattice structure, or a film having an AlN/GaN superlattice structure.

In one example, the buffer layer 14 includes a first buffer layer, which is an AlN layer formed on the substrate 12, and a second buffer layer, which is an AlGaN layer formed on the AlN layer (first buffer layer). The first buffer layer may be an AlN layer having a thickness of 200 nm, and the second buffer layer may be a graded AlGaN layer having a thickness of 300 nm. To reduce leakage current in the buffer layer 14, part of the buffer layer 14 may include an impurity so that regions other than the outermost part of the buffer layer 14 is semi-insulative. In this case, the impurity may be, for example, carbon (C) or iron (Fe). The concentration of the impurity may be, for example, $4\times10^{16}$ $cm^{-3}$ or greater.

The electron transit layer 16 is formed on the buffer layer 14, which is formed on the substrate 12, and thereby formed above the substrate 12 and on the substrate 12. The electron transit layer 16 may be a GaN layer. The electron transit layer 16 may have a thickness of, for example, 0.5 μm or greater and 2 μm or less. The electron transit layer 16 of the first embodiment includes a first semiconductor layer 17A, formed on the buffer layer 14, and a second semiconductor layer 17B, formed on the first semiconductor layer 17A. The first semiconductor layer 17A is formed above the substrate 12 and on the substrate 12. The first semiconductor layer 17A and the second semiconductor layer 17B are GaN layers having different impurity concentrations.

In one example, the first semiconductor layer 17A is a carbon-doped GaN layer containing carbon (C) as an impurity, and the second semiconductor layer 17B is a non-doped GaN layer. The first semiconductor layer 17A may have a thickness of 0.5 μm or greater and 2 μm or less. The first semiconductor layer 17A may have a carbon concentration of $5\times10^{17}$ $cm^{-3}$ or greater and $9\times10^{19}$ $cm^{-3}$ or less. The second semiconductor layer 17B may have a thickness of 0.05 μm or greater and 0.4 μm or less. The second semiconductor layer 17B contacts the electron supply layer 18. One or more nitride semiconductor layers may be included between the buffer layer 14 and the first semiconductor layer 17A. In one example, the electron transit layer 16 includes the first semiconductor layer 17A, having a thickness of 0.4 μm, and the second semiconductor layer 17B, having a thickness of 0.4 μm. The first semiconductor layer 17A may have a carbon concentration of approximately $2\times10^{19}$ $cm^{-3}$.

The electron supply layer 18 is composed of a nitride semiconductor having a larger band gap than the electron transit layer 16. The electron supply layer 18 may be, for example, an AlGaN layer. A nitride semiconductor will have a larger band gap as the Al composition increases. Thus, the electron supply layer 18, which is an AlGaN layer, has a larger band gap than the electron transit layer 16, which is a GaN layer. In one example, the electron supply layer 18 is composed of $Al_xGa_{1-x}N$. Thus, the electron supply layer 18 is an $Al_xGa_{1-x}N$ layer, where x is 0<x<0.4 and, more preferably, 0.1<x<0.3. The electron supply layer 18 may have a thickness of, for example, 5 nm or greater and 20 nm or less.

The electron transit layer 16 and the electron supply layer 18 have bulk regions with different lattice constants. Thus, the electron transit layer 16 and the electron supply layer 18 form a lattice-mismatched heterojunction. The spontaneous polarization of the electron transit layer 16 and the electron supply layer 18 and the piezoelectric polarization from the compression stress received by the heterojunction of the electron transit layer 16 causes the energy level of the conduction band of the electron transit layer 16 to be lower than the Fermi level in the proximity of the heterojunction interface between the electron supply layer 18 and the electron transit layer 16. Thus, two-dimensional electron gas (2DEG) 20 spreads in the electron transit layer 16 at a location proximate to (e.g., distanced by approximately a few nanometers from interface) the heterojunction interface of the electron transit layer 16 and the electron supply layer 18.

The gate layer 22 is formed on the electron supply layer 18. The gate layer 22 extends in the Y-axis direction. Although not shown in the drawings, the nitride semiconductor device 10 includes a plurality of gate layers 22 arranged next to one another in the X-axis direction. The gate layer 22 is formed by a third nitride semiconductor layer 62. The gate layer 22 has a smaller band gap than the electron supply layer 18 and is composed of a nitride semiconductor containing an acceptor impurity. The gate layer 22 may be formed from any material having a smaller band gap than the electron supply layer 18, which is an AlGaN layer. In one example, the gate layer 22 is a GaN layer (p-type GaN layer) doped with an acceptor impurity. The acceptor impurity may contain at least one of magnesium (Mg), zinc (Zn), and carbon (C). The maximum concentration of the acceptor impurity in the gate layer 22 is, for example, $1\times10^{18}$ $cm^{-3}$ or greater and $1\times10^{20}$ $cm^{-3}$ or less.

The gate electrode 24 is arranged on an entire upper surface 22S of the gate layer 22. The gate electrode 24 is formed on the upper surface 22S of the gate layer 22. The gate electrode 24 and the gate layer 22 form a Schottky junction. The gate electrode 24 includes one or more metal layers. In one example, the gate electrode 24 is formed by a titanium nitride (TiN) layer. In another example, the gate electrode 24 includes a first metal layer of Ti and a second metal layer of TiN on the first metal layer. The gate electrode 24 has a thickness of, for example, 50 nm or greater and 200 nm or less.

The nitride semiconductor device 10 further includes a passivation layer 26. The passivation layer 26 covers the electron supply layer 18, the gate layer 22, and the gate electrode 24. The passivation layer 26 may be composed of a material containing one of, for example, silicon dioxide ($SiO_2$), silicon nitride (SiN), silicon oxynitride (SiON), alumina ($Al_2O_3$), AN, and aluminum oxynitride (AlON). In one example, the passivation layer 26 is formed from a material containing $SiO_2$.

The passivation layer 26 includes a flat upper surface 26S. The passivation layer 26 includes a source opening 26A and a drain opening 26B. The source opening 26A extends from the upper surface 26S to the electron supply layer 18 through the passivation layer 26. The source opening 26A exposes the upper surface of the electron supply layer 18 as a source connection region 18A. The drain opening 26B extends from the upper surface 26S to the electron supply layer 18 through the passivation layer 26. The drain opening 26B exposes the upper surface of the electron supply layer 18 as a drain connection region 18B. The gate layer 22 is located between the source opening 26A and the drain opening 26B.

The nitride semiconductor device 10 further includes a source electrode 32 and a drain electrode 34.

The source electrode 32 contacts the source connection region 18A of the electron supply layer 18 through the source opening 26A in the passivation layer 26. The source electrode 32 is in ohmic contact with the 2DEG 20 underneath the electron supply layer 18. The drain electrode 34 contacts the drain connection region 18B of the electron supply layer 18 through the drain opening 26B in the passivation layer 26. The drain electrode 34 is in ohmic contact with the 2DEG 20 underneath the electron supply layer 18.

The source electrode 32 and the drain electrode 34 are formed by, for example, one or more metal layers including at least one of a Ti layer, TiN layer, an Al layer, an AlSiCu layer, and an AlCu layer. For example, the source electrode 32 and the drain electrode 34 are formed from the same material.

The source opening 26A of the passivation layer 26 is filled with part of the source electrode 32. The drain opening 26B of the passivation layer 26 is filled with part of the drain electrode 34.

The source electrode 32 may include a source electrode portion 32A and a source field plate portion 32B continuous with the source electrode portion 32A. The source electrode portion 32A includes a filling region that fills the source opening 26A and an upper region formed integrally with the filling region and located around the source opening 26A in plan view. The source field plate portion 32B is formed integrally with the upper region of the source electrode portion 32A and is arranged on the upper surface 26S of the passivation layer 26 so as to cover the entire gate layer 22 in plan view.

The source field plate portion 32B includes an end 32C in the vicinity of the drain electrode 34. The end 32C is located between the drain electrode 34 and the gate electrode 24 in plan view. The source field plate portion 32B functions to limit electric field concentration near the end of the gate electrode 24 and in the vicinity of the end of the gate layer 22 by expanding the depletion layer toward the 2DEG 20 underneath the source field plate portion 32B when high voltage is applied between the source and drain in a state in which the gate-source voltage is 0 V.

Planar Structure of Nitride Semiconductor Device

The planar structure of the nitride semiconductor device 10 will now be described with reference to FIG. 1. In FIG. 1, the passivation layer 26 is not shown. Further, the source opening 26A, the drain opening 26B, and the source field plate portion 32B of the source electrode 32 are shown in broken lines.

As shown in FIG. 1, the gate layer 22 has a closed-shape in plan view. The gate layer 22 includes two main portions 92, extending in the Y-axis direction at opposite sides of the drain electrode 34 in the X-axis direction, and two connecting portions 94, connecting the two main portions 92 to each other at opposite sides of the drain electrode 34 in the Y-axis direction. The gate layer 22 surrounds the drain electrode 34 in plan view. Thus, the drain electrode 34 is surrounded by the gate layer 22 in plan view.

The gate electrode 24 has a closed shape in plan view. The gate electrode 24 includes two main portions 96, extending in the Y-axis direction at opposite sides of the drain electrode 34 in the X-axis direction, and two connecting portions 98, connecting the two main portions 96 to each other at opposite sides of the drain electrode 34 in the Y-axis direction. The gate electrode 24 surrounds the drain electrode 34 in plan view. Thus, the drain electrode 34 is surrounded by the gate electrode 24 in plan view. The gate electrode 24 is arranged on the gate layer 22. The main portions 96 of the gate electrode 24 are arranged on the main portions 92 of the gate layer 22. The connecting portions 98 of the gate electrode 24 are arranged on the connecting portions 94 of the gate layer 22.

The nitride semiconductor device 10 may include gate wiring 80, source wiring 82, and drain wiring 84. FIG. 1 shows the outlines of the gate wiring 80, the source wiring 82, and the drain wiring 84 in single-dashed lines. The gate wiring 80, the source wiring 82, and the drain wiring 84 extend in the X-axis direction. The gate wiring 80, the source wiring 82, and the drain wiring 84 are arranged next to one another in the Y-axis direction. In one example, the gate wiring 80 is arranged on the connecting portions 94 of the gate electrode 24. In one example, the source wiring 82 and the drain wiring 84 intersect the source electrode 32 and the drain electrode 34. In one example, the gate electrode 24 is electrically connected to the gate wiring 80 by bonding vias 86A. The source electrode 32 is electrically connected to the source wiring 82 by bonding vias 86B. The drain electrode 34 is electrically connected to the drain wiring 84 by bonding vias 86C.

Exemplary Structure of Gate Electrode

As shown in FIG. 3, the gate electrode 24 is larger in the X-direction than the gate layer 22. More specifically, the length L24 of the gate electrode 24 in the X-direction is greater than the length L22 of the gate layer 22.

The gate electrode 24 includes an electrode upper surface 24S, an electrode lower surface 24R, and the electrode side surfaces 24A and 24B. Part of the electrode lower surface 24R contacts the upper surface 22S of the gate layer 22. The electrode side surface 24A faces the source electrode 32, and the electrode side surface 24B faces the drain electrode 34.

The gate electrode 24 includes a connecting portion 42, a source-side extension 44, and a drain-side extension 46. The connecting portion 42 contacts the entire upper surface 22S of the gate layer 22. The connecting portion 42 includes a lower surface 42R and an upper surface 42S. The entire lower surface 42R contacts the entire upper surface 22S of the gate layer 22. The length of the lower surface 42R in the X-direction is equal to the length L22 of the gate layer 22.

The source-side extension 44 extends from the connecting portion 42 toward the source electrode 32. The electrode side surface 24A is located between the gate layer 22 and the source electrode 32. The source-side extension 44 includes a lower surface 44R and an upper surface 44S. The lower surface 44R of the source-side extension 44 is flush with the lower surface 42R of the connecting portion 42. The upper surface 44S of the source-side extension 44 is flush with the upper surface 42S of the connecting portion 42.

The drain-side extension 46 extends from the connecting portion 42 toward the drain electrode 34. The electrode side surface 24B is located between the gate layer 22 and the drain electrode 34. The drain-side extension 46 includes a lower surface 46R and an upper surface 46S. The lower surface 46R of the drain-side extension 46 is flush with the lower surface 42R of the connecting portion 42. The upper surface 46S of the drain-side extension 46 is flush with the upper surface 42S of the connecting portion 42.

The length L44 of the source-side extension 44 in the X-direction is the distance from a side surface 22A of the gate layer 22 to the electrode side surface 24A of the gate electrode 24. The length L44 of the source-side extension 44 may be, for example, 10 nm or greater and 100 nm or less. Preferably, the length L44 of the source-side extension 44 is 60 nm or greater and 90 nm or less. The length L46 of the drain-side extension 46 in the X-direction is the distance from a side surface 22B of the gate layer 22 to the electrode side surface 24B of the gate electrode 24. The length L46 of the drain-side extension 46 may be, for example, 10 nm or greater and 100 nm or less. Preferably, the length L46 of the drain-side extension 46 is 60 nm or greater and 90 nm or less.

The gate electrode 24 includes a first lower end 24EA and a second lower end 24EB that are the two ends of the electrode lower surface 24R in the X-direction. The first lower end 24EA is the lower end of the electrode side surface 24A. The second lower end 24EB is the lower end of the electrode side surface 24B. The gate electrode 24 is longer than the gate layer 22 in the X-direction. Further, the gate electrode 24 includes the source-side extension 44 and the drain-side extension 46 that extend from the gate layer 22 in the X-direction. Thus, the first lower end 24EA of the gate electrode 24 is located between the gate layer 22 and the source electrode 32. The second lower end 24EB of the gate electrode 24 is located between the gate layer 22 and the drain electrode 34.

Passivation Layer

The passivation layer 26 includes a first insulation layer 27A and a second insulation layer 27B.

The first insulation layer 27A is formed on the electron supply layer 18. The first insulation layer 27A includes a lower surface 27AR, which contacts the electron supply layer 18, and an upper surface 27AS, which is opposite the lower surface 27AR. In the nitride semiconductor device 10 of the first embodiment, the upper surface 27AS is a flat surface. The first insulation layer 27A contacts the side surfaces 22A and 22B of the gate layer 22. The first insulation layer 27A has a thickness equal to the thickness T1 of the gate layer 22. The upper surface 27AS of the first insulation layer 27A partially contacts the electrode lower surface 24R of the gate electrode 24. The gate electrode 24 includes the source-side extension 44 and the drain-side extension 46 that extend from the gate layer 22 in the X-direction. The source-side extension 44 and the drain-side extension 46 each contact the upper surface 27AS of the first insulation layer 27A.

The second insulation layer 27B is formed on the first insulation layer 27A. The second insulation layer 27B includes a lower surface 27BR, which contacts the first insulation layer 27A, and an upper surface 27BS, which is opposite the lower surface 27BR. The upper surface 27BS is the upper surface 26S of the passivation layer 26. In the nitride semiconductor device 10 of the first embodiment, the upper surface 27BS is a flat surface. The second insulation layer 27B contacts the electrode upper surface 24S and the electrode side surfaces 24A and 24B of the gate electrode 24.

The first insulation layer 27A and the second insulation layer 27B may be formed from the same material (e.g., material containing $SiO_2$). FIGS. 2 and 3 show the first insulation layer 27A and the second insulation layer 27B separated by broken lines. Nevertheless, when forming the first insulation layer 27A and the second insulation layer 27B from the same material, there will be no interface between the first insulation layer 27A and the second insulation layer 27B, and the boundary therebetween will not be clear.

The gate electrode 24 is formed on the first insulation layer 27A. The source-side extension 44 and the drain-side extension 46 of the gate electrode 24 contact the upper surface 27AS of the first insulation layer 27A. Thus, the location where the upper surface 27AS of the first insulation layer 27A contacts the gate electrode 24 can be considered as where the interface is located between the first insulation layer 27A and the second insulation layer 27B.

Operation of Nitride Semiconductor Device 10

Comparative Example

Figure 4:
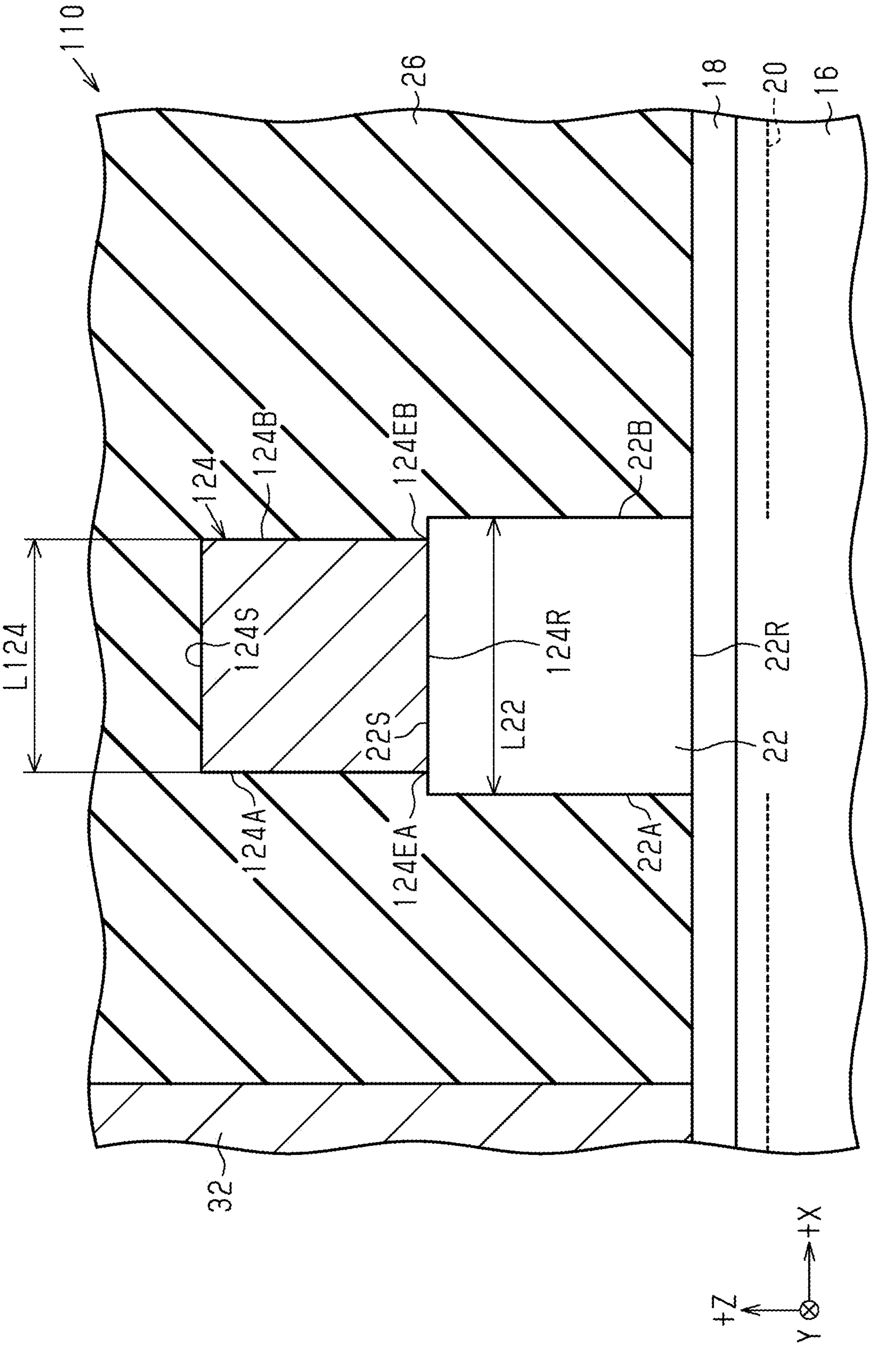
FIG. 4 is a schematic cross-sectional view enlarging a nitride semiconductor device of a comparative example in part.

FIG. 4 is a schematic cross-sectional view showing a nitride semiconductor device 110, in part, of an example, compared with the nitride semiconductor device 10 of the first embodiment. The structure of FIG. 4 is an example compared with the structure of FIG. 3.

The nitride semiconductor device 110 of the comparative example includes a gate electrode 124, the length L124 of which is shorter than the length L22 of the gate layer 22. The gate electrode 124 is arranged on the upper surface 22S of the gate layer 22. The gate electrode 124 includes the electrode side surfaces 124A and 124B and first and second lower ends 124EA and 124EB, which contact the upper surface 22S of the gate layer 22. The entire electrode lower surface 124R of the gate electrode 124 contacts part of the upper surface 22S of the gate layer 22. In the nitride semiconductor device 110 of the comparative example, an electric field may locally concentrate at a region of the gate layer 22 near the first lower end 124EA and the second lower end 124EB of the gate electrode 24. Such local electric field concentration may result in crystal defect or crystal fracture of the gate layer 22 causing the gate withstand voltage to decrease.

In the nitride semiconductor device 10 of the first embodiment illustrated in FIG. 3, the length L24 of the gate electrode 24 is greater than the length L22 of the gate layer 22. Further, the first lower end 24EA of the gate electrode 24 and the second lower end 24EB do not contact the upper surface 22S of the gate layer 22. Electric field concentration that would be caused by the first lower end 24EA and the second lower end 24EB does not occur in the gate layer 22. Thus, electric field concentration is limited in the gate layer 22.

Method for Manufacturing Nitride Semiconductor Device

One example of a method for manufacturing the nitride semiconductor device 10 of FIG. 2 will now be described.

FIGS. 5 to 16 are schematic cross-sectional views showing exemplary manufacturing steps of the nitride semiconductor device 10. To facilitate understanding, in FIGS. 5 to 16, same reference characters are given to those elements that are the same as the corresponding elements shown in FIG. 2.

Figure 5:
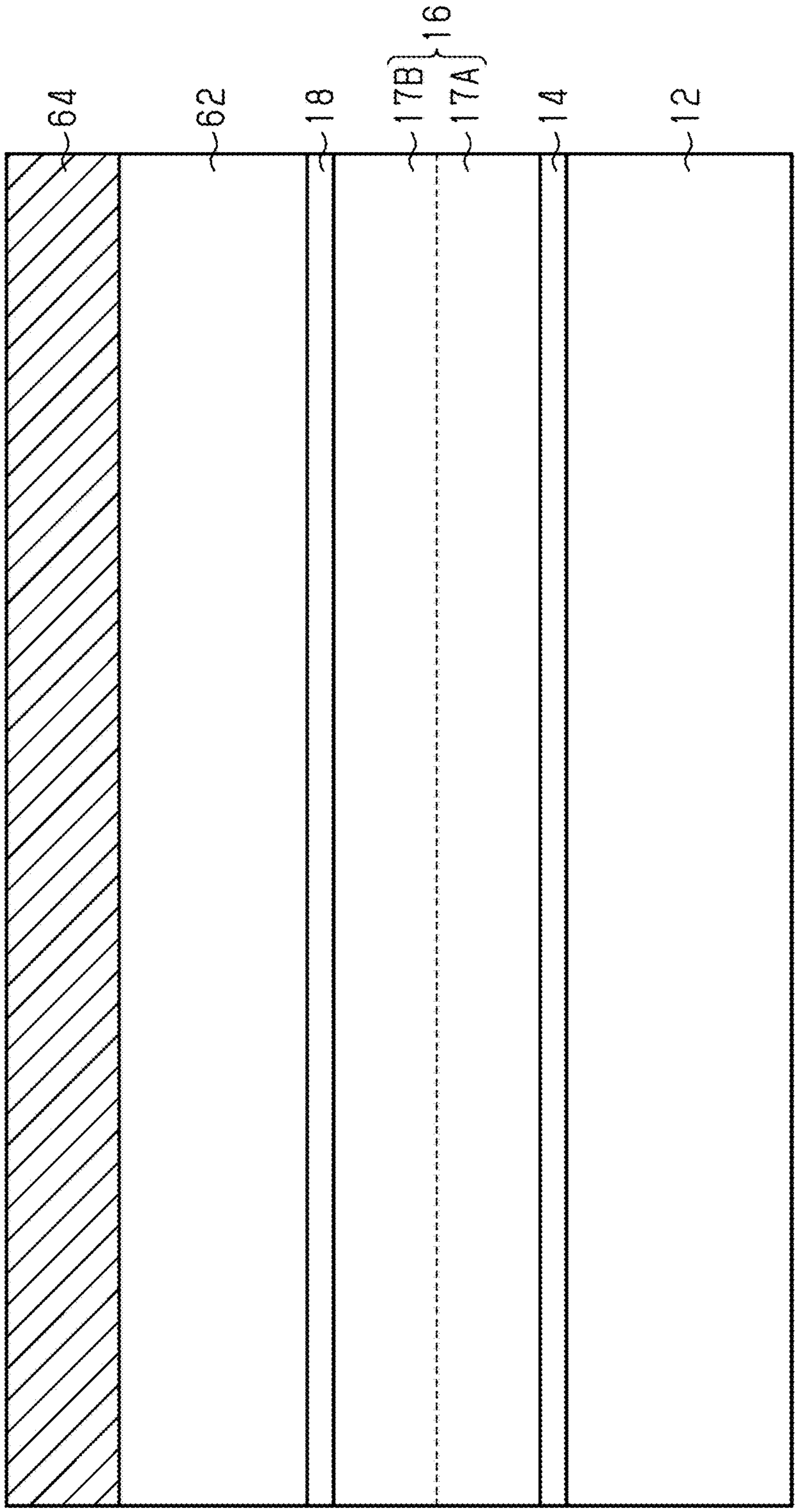
FIG. 5 is a schematic cross-sectional view exemplifying a manufacturing step of the nitride semiconductor device illustrated in FIG. 2.

As shown in FIG. 5, the method for manufacturing the nitride semiconductor device 10 includes, for example, sequentially forming the buffer layer 14, a first nitride semiconductor layer 16, a second nitride semiconductor layer 18, and the third nitride semiconductor layer 62 on the substrate 12, which is a Si substrate. The buffer layer 14, the first nitride semiconductor layer 16, the second nitride semiconductor layer 18, and the third nitride semiconductor layer 62 undergo epitaxial growth through a metal organic chemical vapor deposition (MOCVD) process.

Although not illustrated in detail, in one example, the buffer layer 14 is multilayered and includes an AlN layer (first buffer layer), formed on the substrate 12, and a graded AlGaN layer (second buffer layer) formed on the AlN layer. The graded AlGaN layer may be formed by stacking three AlGaN layers respectively having Al compositions of 75%, 50%, and 25% from the side closer to the AlN layer.

A GaN layer is formed as the first nitride semiconductor layer 16 on the buffer layer 14. Thus, the first nitride semiconductor layer 16 is formed on the substrate 12 with the buffer layer 14 located in between. Then, an AlGaN layer is formed as the second nitride semiconductor layer 18 on the first nitride semiconductor layer 16. Accordingly, the second nitride semiconductor layer 18 has a larger band gap than the first nitride semiconductor layer 16.

A GaN layer containing an acceptor impurity is formed as the third nitride semiconductor layer 62 on the second nitride semiconductor layer 18. The thickness of the third nitride semiconductor layer 62 is greater than the thickness T1 of the gate layer 22 shown in FIGS. 2 and 3.

The buffer layer 14, the first nitride semiconductor layer 16, the second nitride semiconductor layer 18, and the third nitride semiconductor layer 62 are each composed of nitride semiconductors having relatively close lattice constants and thus can undergo continuous epitaxial growth.

The method for manufacturing the nitride semiconductor device 10 further includes forming a mask layer 64. The mask layer 64 is used to form the gate layer 22 shown in FIG. 2. For example, a $SiO_2$ film is formed as the mask layer 64 on the third nitride semiconductor layer 62.

Figure 6:
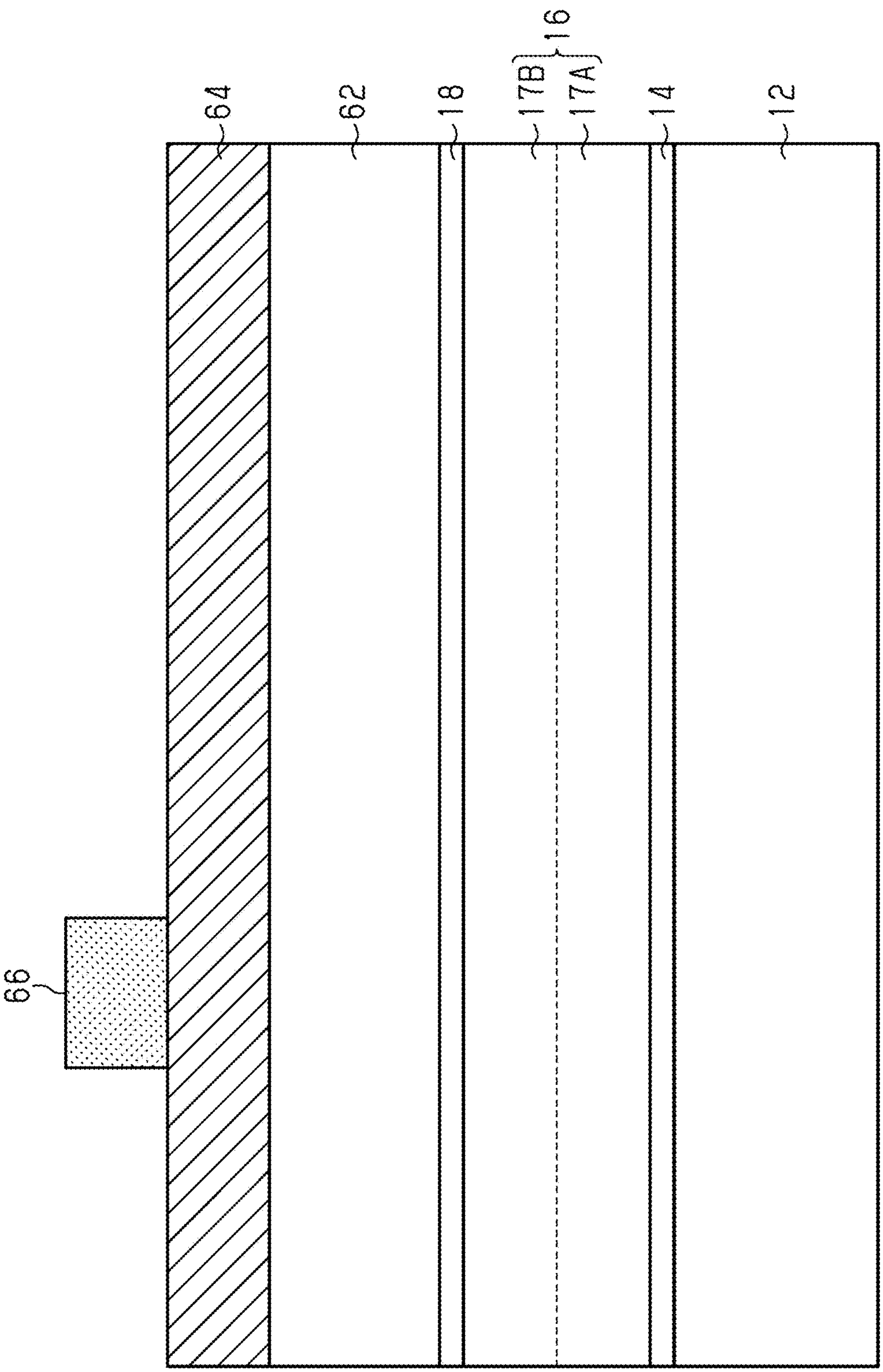
FIG. 6 is a schematic cross-sectional view illustrating a manufacturing step following the step of FIG. 5.
Figure 7:
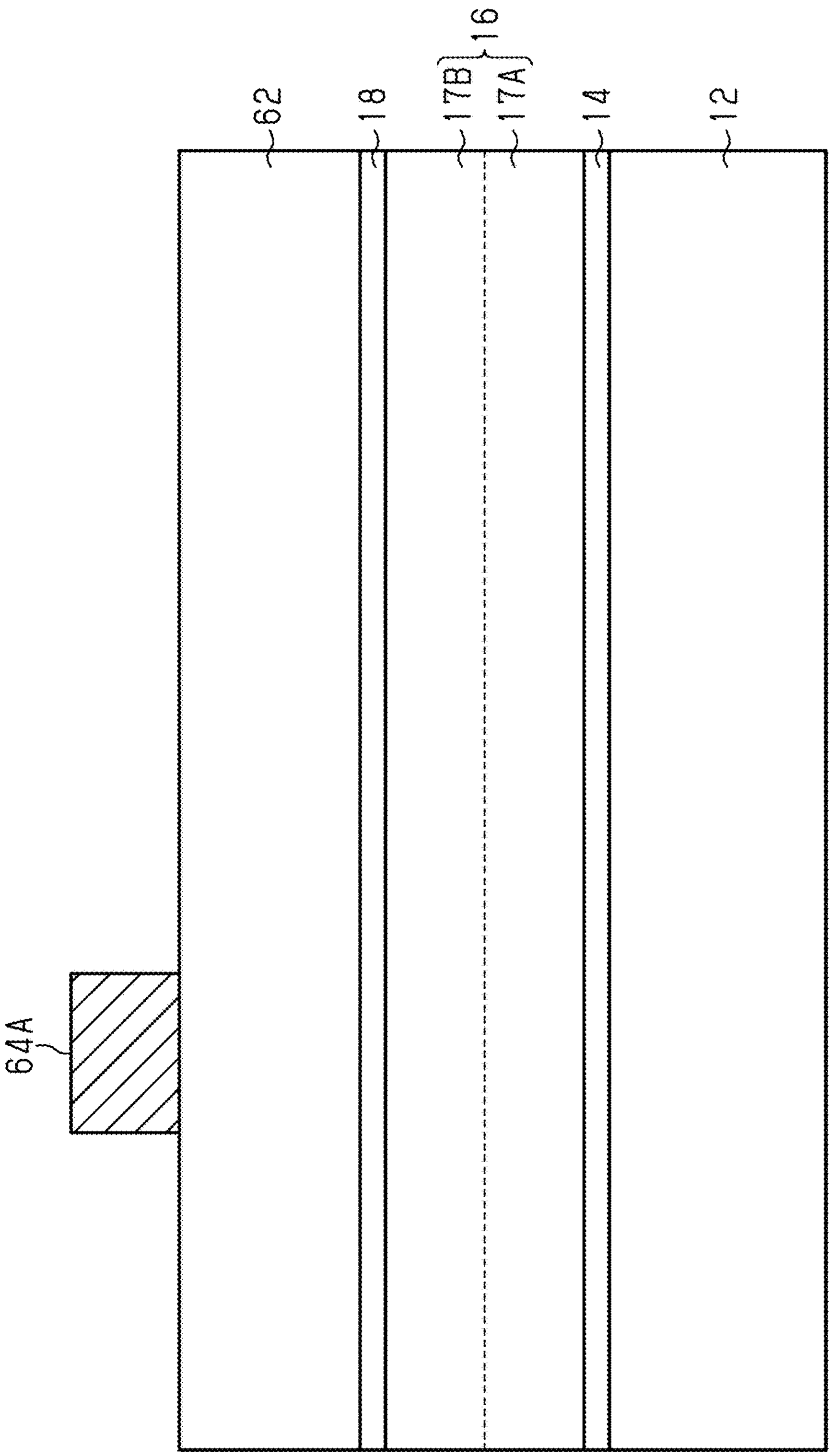
FIG. 7 is a schematic cross-sectional view illustrating a manufacturing step following the step of FIG. 6.
Figure 8:
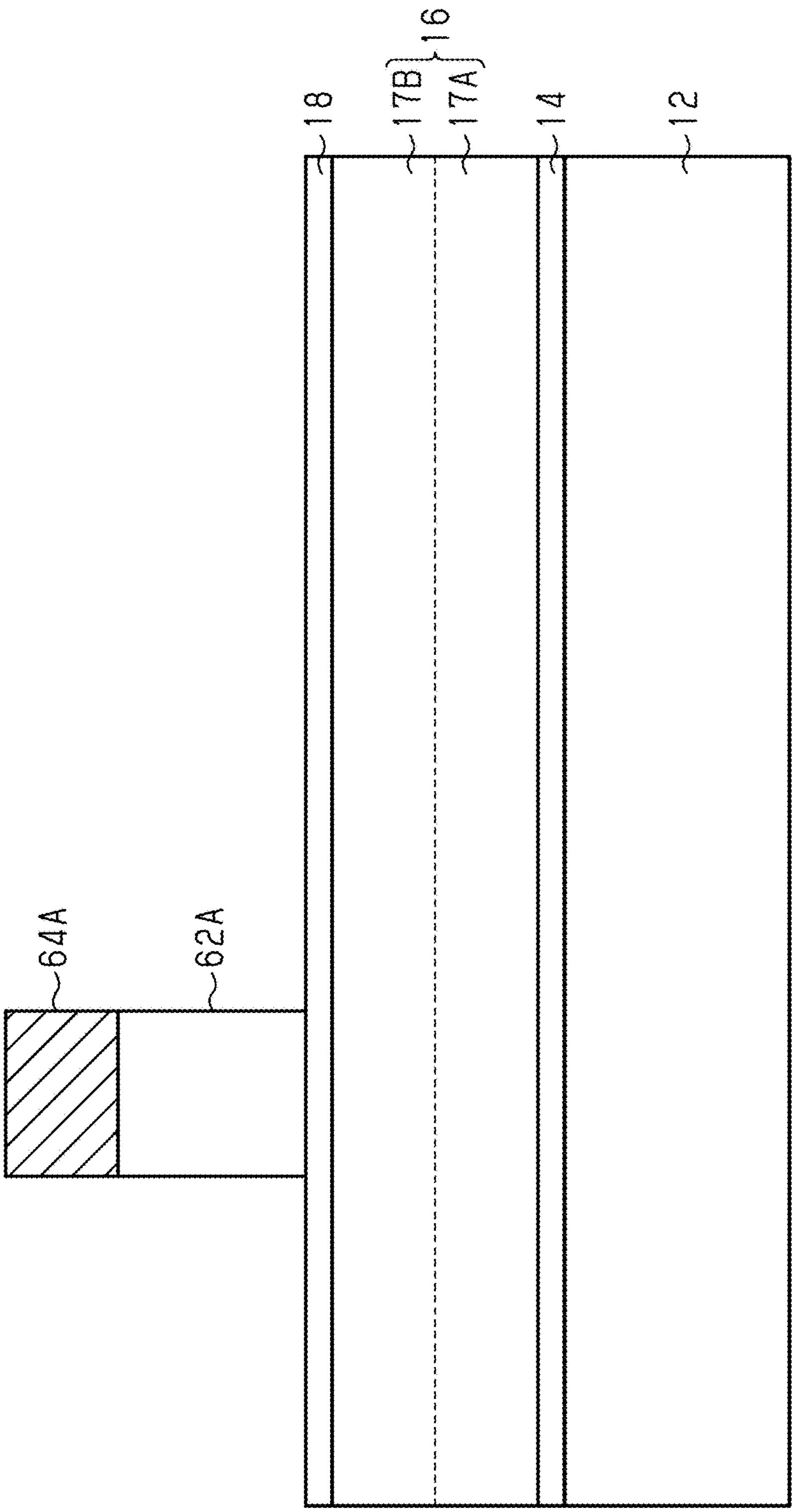
FIG. 8 is a schematic cross-sectional view illustrating a manufacturing step following the step of FIG. 7.

As shown in FIGS. 6 to 8, the manufacturing steps of the nitride semiconductor device 10 include the step of forming the gate layer 22. The formation of the gate layer 22 includes forming a resist film 66, forming a gate mask 64A, and forming the gate layer 22.

First, as shown in FIG. 6, in the step following the step of FIG. 5, the resist film 66 is formed on the mask layer 64. Photolithography is performed to form the resist film 66 on the mask layer 64 so as to cover the part of the third nitride semiconductor layer 62 that will be the gate layer 22.

Then, as shown in FIG. 7, in the step following the step of FIG. 6, the mask layer 64 is etched using the resist film 66 as a mask to form the gate mask 64A. Then, the resist film 66 is removed with, for example, a removing solution.

Then, as shown in FIG. 8, in the step following the step of FIG. 7, the third nitride semiconductor layer 62 undergoes etching (e.g., dry etching using chlorine gas) using the gate mask 64A as a mask to form a gate layer 62A. Subsequently, cleaning is performed if necessary.

Figure 9:
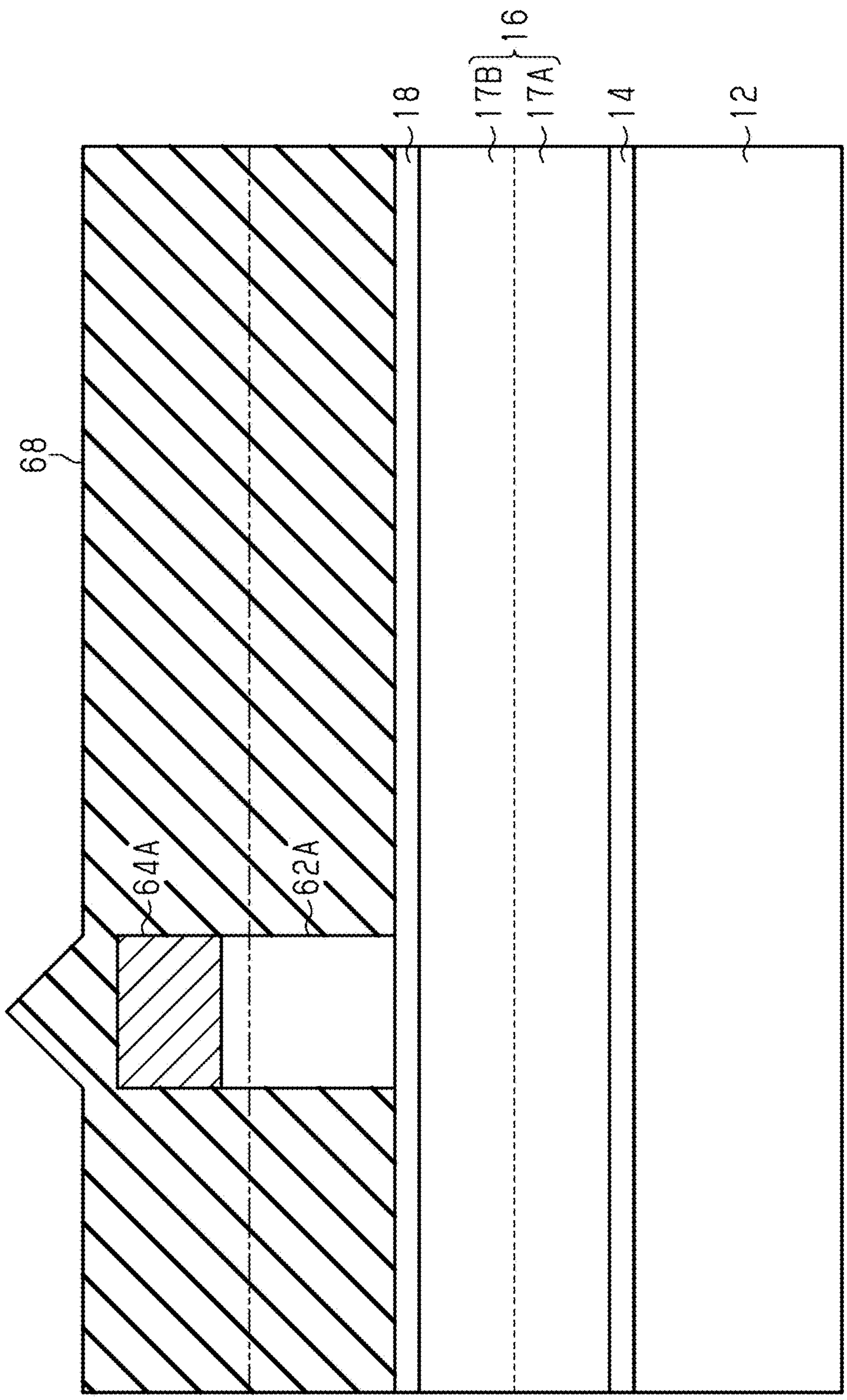
FIG. 9 is a schematic cross-sectional view illustrating a manufacturing step following the step of FIG. 8.
Figure 10:
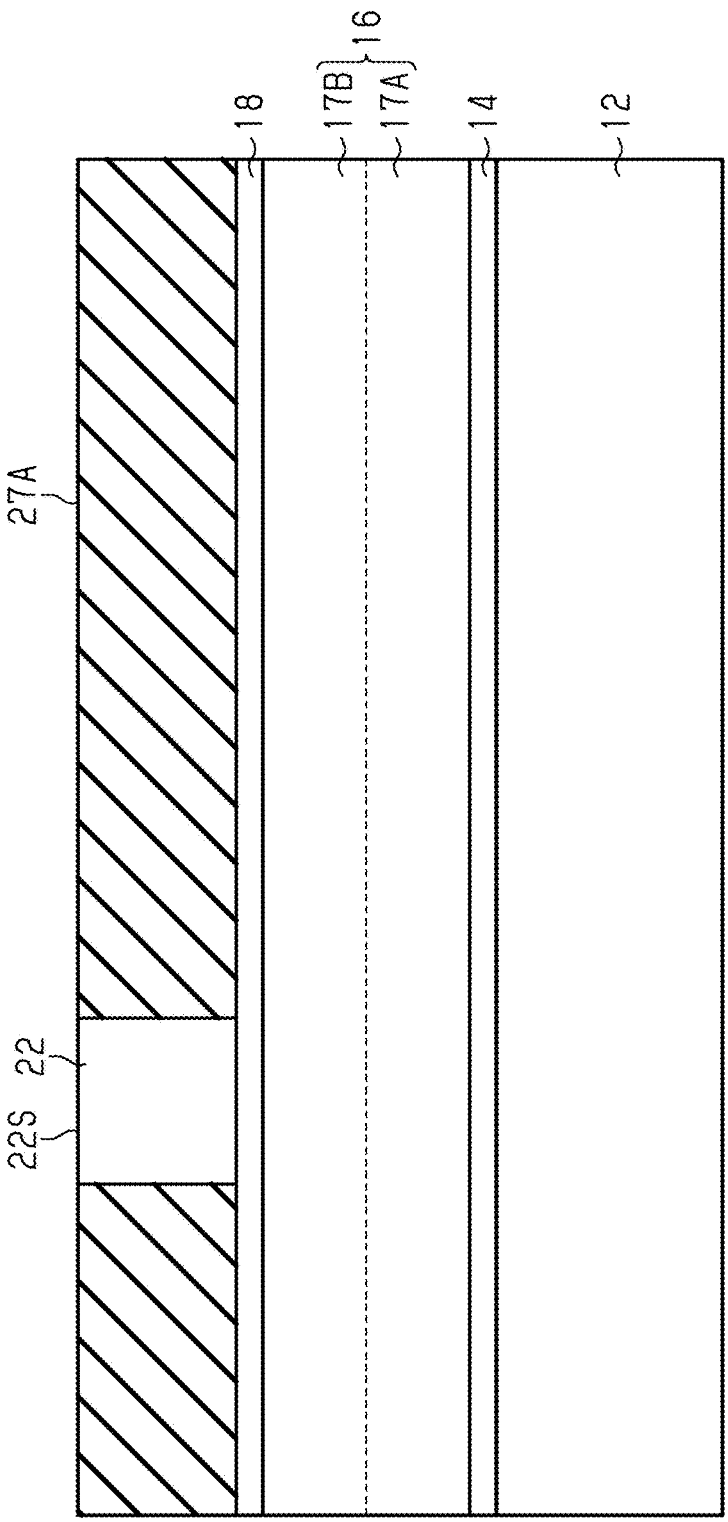
FIG. 10 is a schematic cross-sectional view illustrating a manufacturing step following the step of FIG. 9.

As shown in FIGS. 9 and 10, the manufacturing steps of the nitride semiconductor device 10 include forming the first insulation layer 27A. The formation of the first insulation layer 27A includes forming a first insulation film 68 and forming the first insulation layer 27A and the gate layer 22.

First, as shown in FIG. 9, the first insulation film 68 is formed covering the gate layer 62A and the gate mask 64A. The first insulation film 68 may be a $SiO_2$ film formed with high-density plasma.

Then, as shown in FIG. 10, the first insulation film 68 is flattened to form the first insulation layer 27A. The first insulation film 68 may be flattened through, for example, a chemical mechanical polishing (CMP) process. In the flattening step, the first insulation film 68 is polished until reaching the double-dashed line in FIG. 9. The polishing forms the gate layer 22 with the desired thickness Ti (refer to FIG. 3). Further, the polishing removes the gate mask 64A and removes part of the gate layer 62A to form the gate layer 22. In this manner, the gate layer 22 is formed, and the upper surface 22S of the gate layer 22 is exposed to the outside from the first insulation layer 27A.

Figure 11:
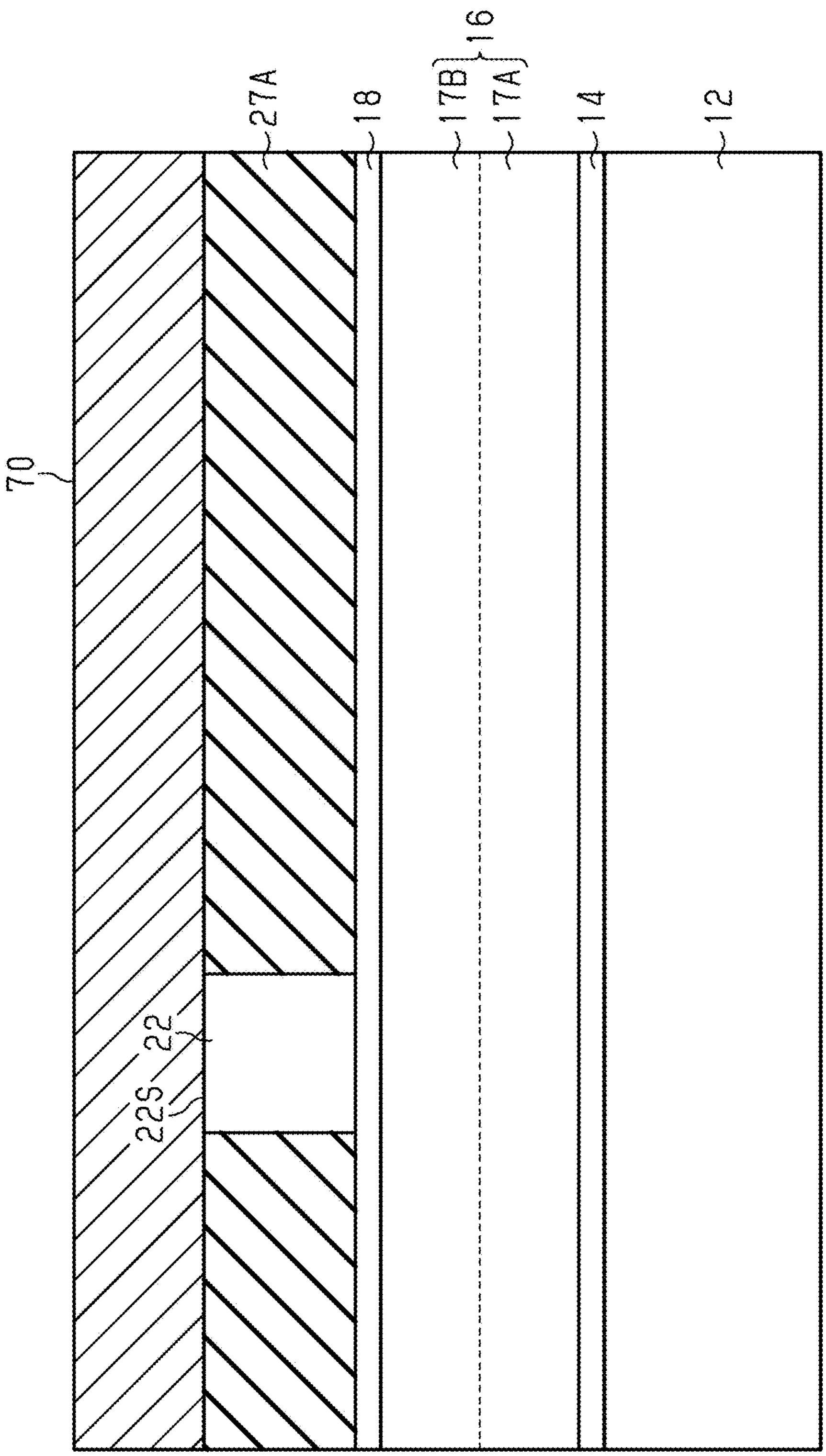
FIG. 11 is a schematic cross-sectional view illustrating a manufacturing step following the step of FIG. 10.
Figure 12:
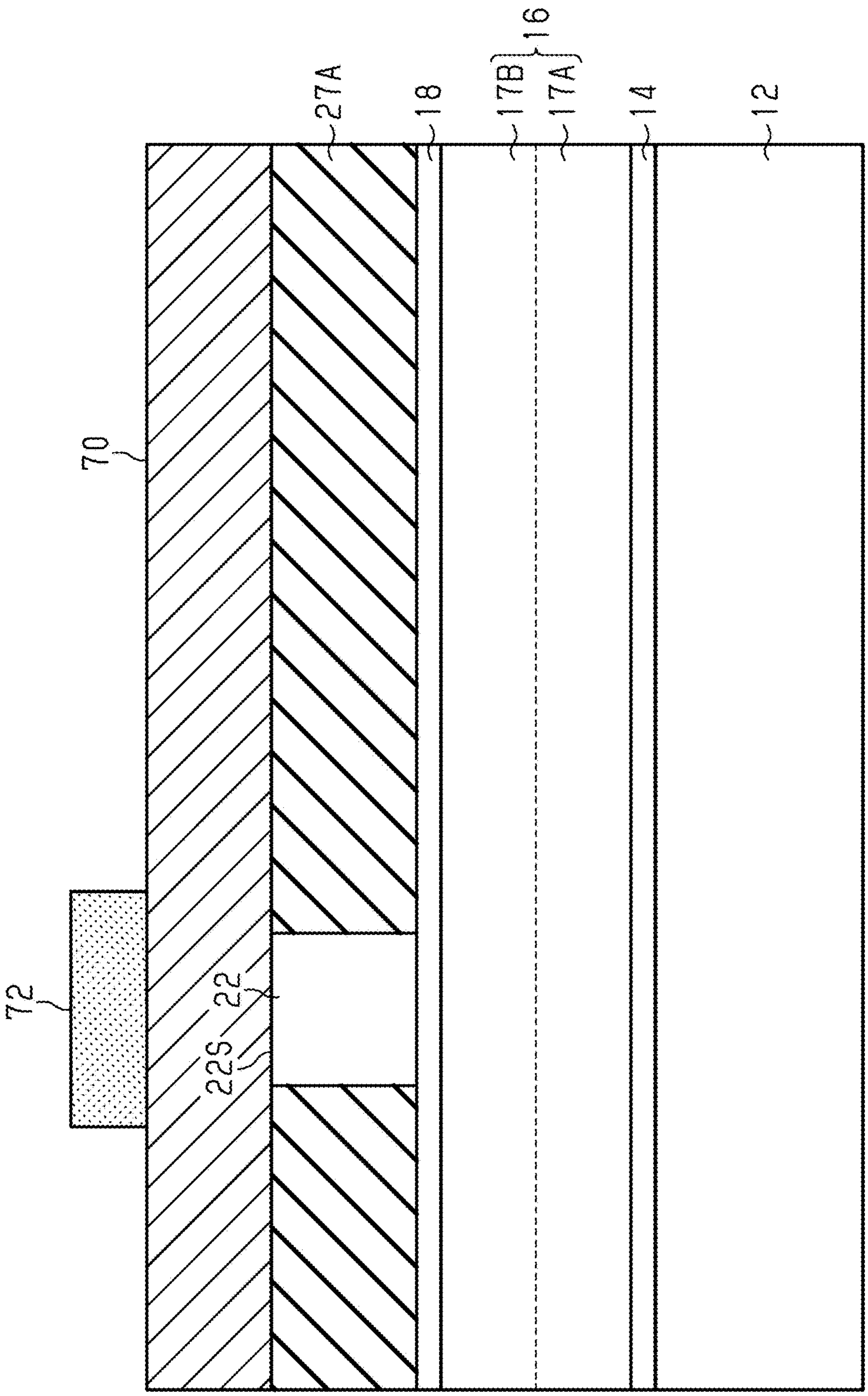
FIG. 12 is a schematic cross-sectional view illustrating a manufacturing step following the step of FIG. 11.
Figure 13:
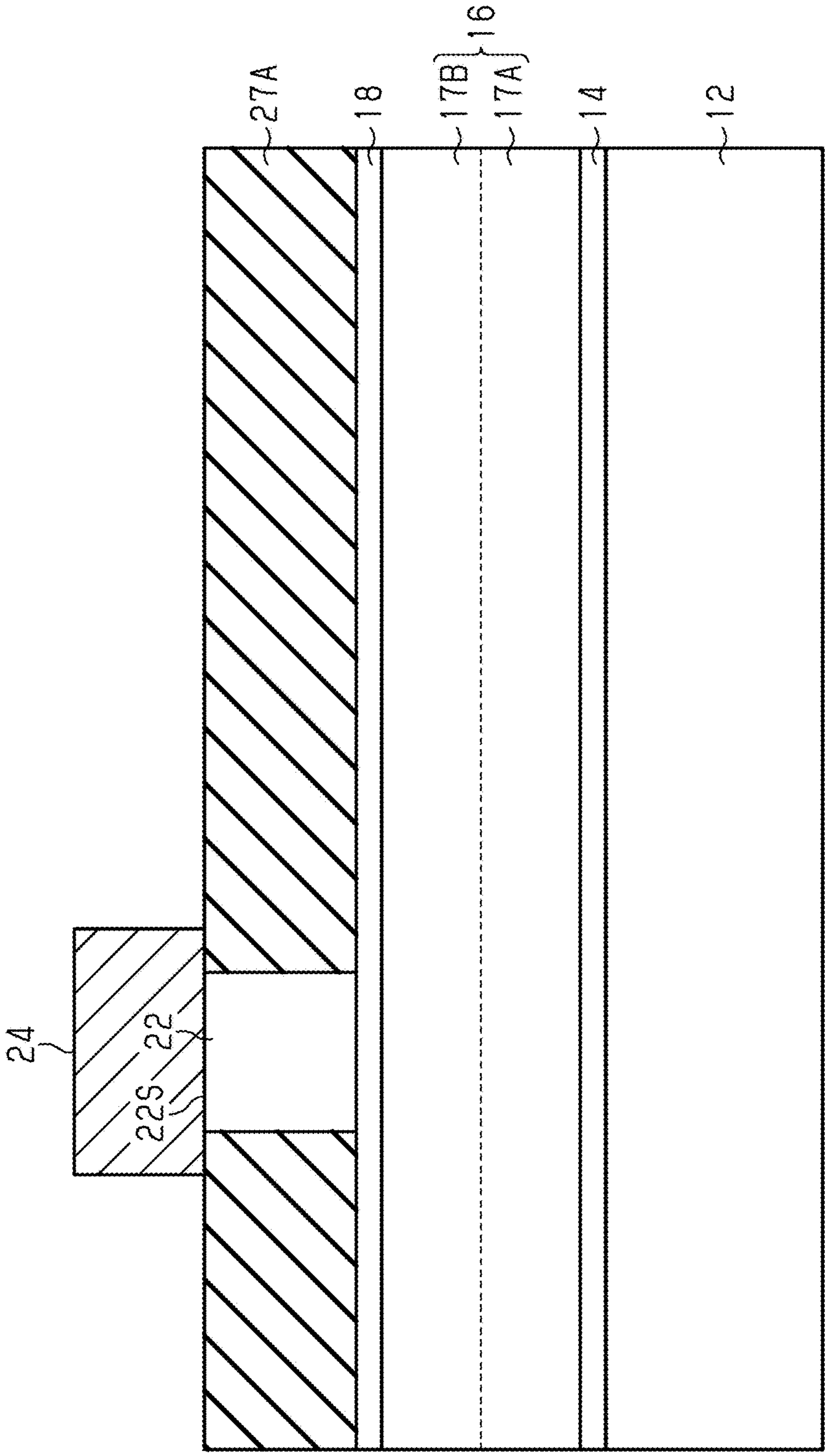
FIG. 13 is a schematic cross-sectional view illustrating a manufacturing step following the step of FIG. 12.

As shown in FIGS. 11 to 13, the manufacturing steps of the nitride semiconductor device 10 include forming the gate electrode 24 on the gate layer 22. The formation of the gate electrode 24 includes forming a metal layer 70, forming a resist film 72, forming the gate electrode 24, and removing the resist film 72.

First, as shown in FIG. 11, in the step following the step shown in FIG. 10, the metal layer 70 is formed on the gate layer 22 and the first insulation layer 27A. In the first embodiment, for example, a sputtering process is performed to form a TiN layer as the metal layer 70.

As shown in FIG. 12, in the step following the step shown in FIG. 11, the resist film 72 is formed on the metal layer 70. Lithography is performed to form the resist film 72 on the metal layer 70. The resist film 72 is formed in accordance with the size of the gate electrode 24 shown in FIG. 2.

As shown in FIG. 13, in the step following the step shown in FIG. 12, etching (e.g., dry etching) is performed using the resist film 72 as a mask to pattern the metal layer 70 and form the gate electrode 24. Then, the resist film 72 is removed with, for example, a removing solution.

Figure 14:
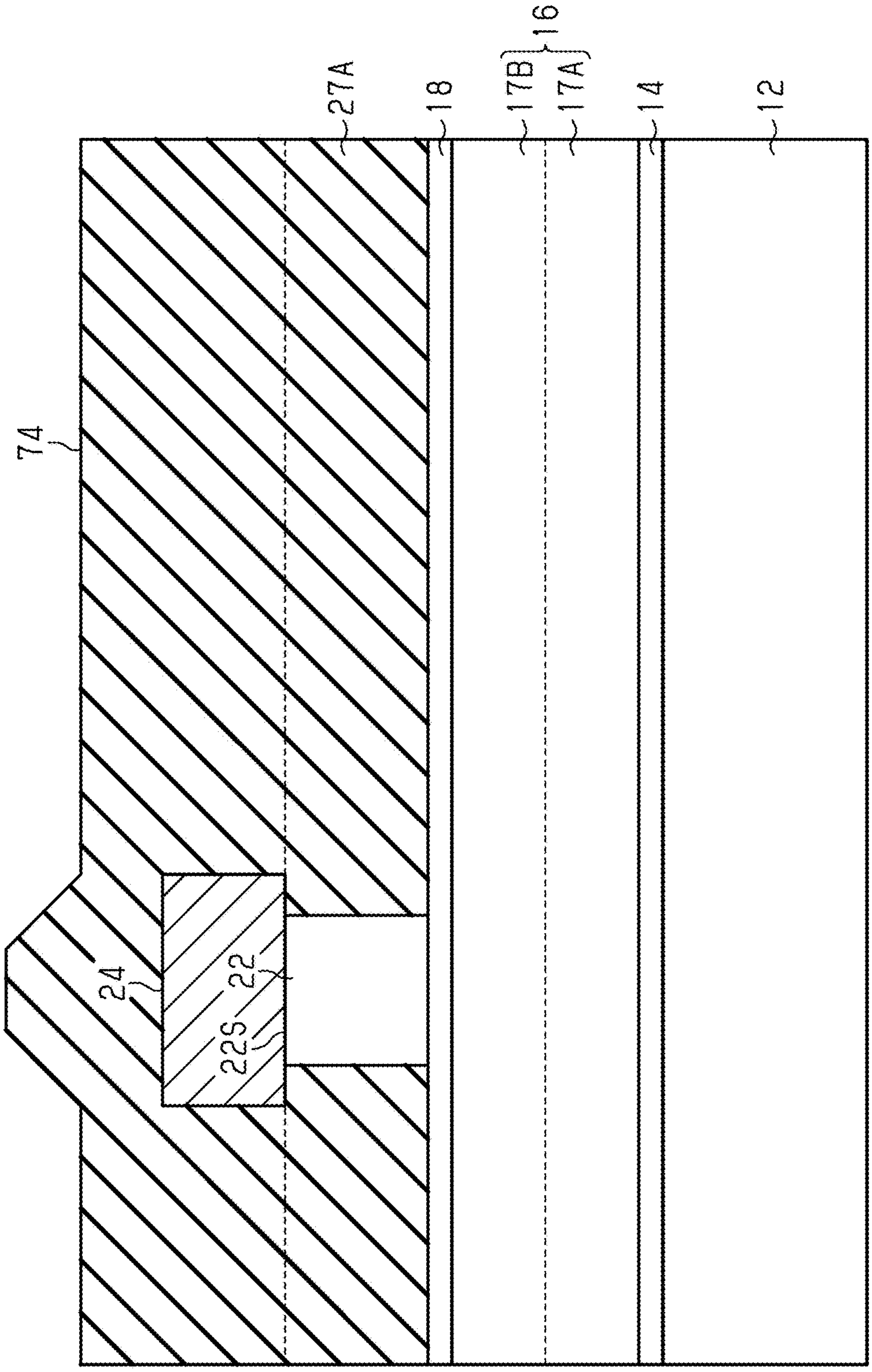
FIG. 14 is a schematic cross-sectional view illustrating a manufacturing step following the step of FIG. 13.
Figure 15:
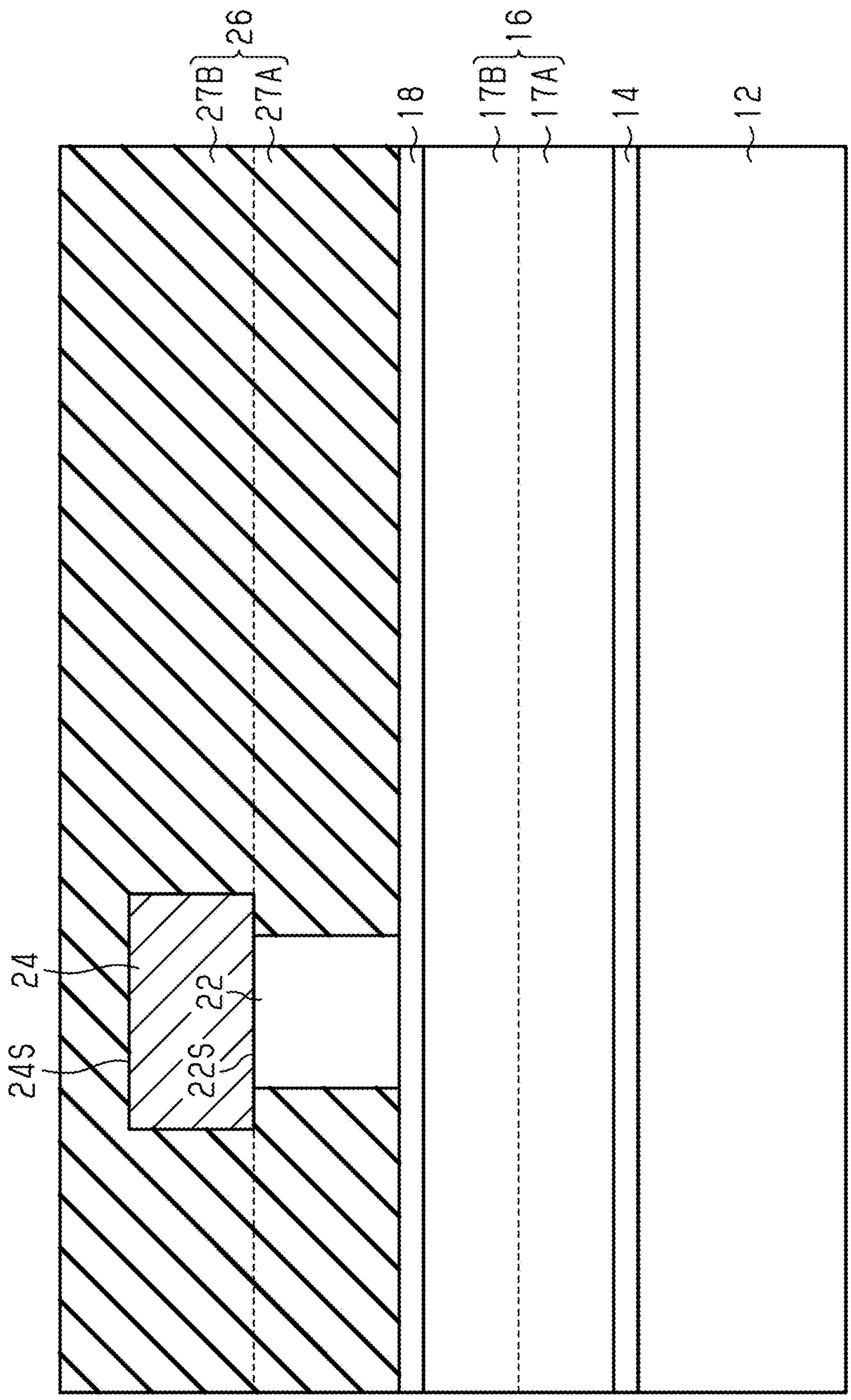
FIG. 15 is a schematic cross-sectional view illustrating a manufacturing step following the step of FIG. 14.

As shown in FIGS. 14 and 15, the manufacturing steps of the nitride semiconductor device 10 include forming the second insulation layer 27B that covers the gate electrode 24. The formation of the second insulation layer 27B includes forming a second insulation film 74, polishing the second insulation film 74, and forming the second insulation layer 27B.

As shown in FIG. 14, in the step following the step shown in FIG. 13, the second insulation film 74 is formed covering the gate electrode 24 and the first insulation layer 27A. Preferably, the second insulation film 74 is, for example, a $SiO_2$ film formed with high-density plasma. A $SiO_2$ film will facilitate flattening in a CMP process.

As shown in FIG. 15, in the step following the step shown in FIG. 14, the second insulation film 74 is flattened to form the second insulation layer 27B. The second insulation film 74 is flattened in, for example, a CMP process. The flattening forms the second insulation layer 27B that covers the electrode upper surface 24S of the gate electrode 24. The second insulation layer 27B and the first insulation layer 27A form the passivation layer 26.

Figure 16:
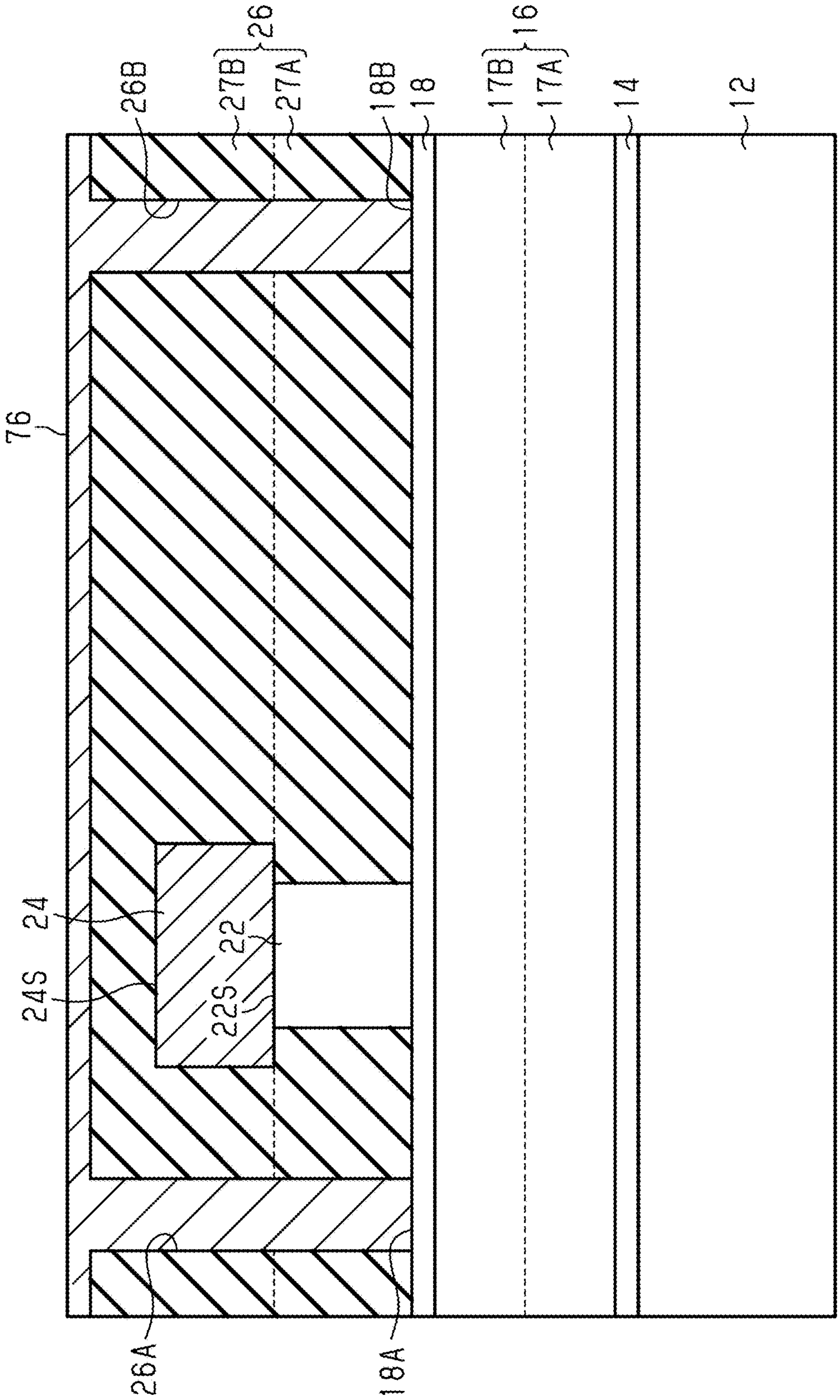
FIG. 16 is a schematic cross-sectional view illustrating a manufacturing step following the step of FIG. 15.

The manufacturing steps of the nitride semiconductor device 10 include forming the source electrode 32 and the drain electrode 34, which are shown in FIG. 2, through the step of FIG. 16.

As shown in FIG. 16, in the step following the step shown in FIG. 15, the source opening 26A and the drain opening 26B extending through the passivation layer 26 are formed to expose parts of the electron supply layer 18 as the source connection region 18A and the drain connection region 18B. Then, the source opening 26A and the drain opening 26B are filled with the metal layer 76 (one or more layers) covering the passivation layer 26. Photolithography and etching are performed to pattern the metal layer 76 and form the source electrode 32 and the drain electrode 34, which are shown in FIG. 2. This obtains the nitride semiconductor device 10 of FIG. 2.

Advantages

The nitride semiconductor device 10 of the first embodiment has the advantages described below.

(1-1) The nitride semiconductor device 10 includes the substrate 12, the electron transit layer 16, the electron supply layer 18, the gate layer 22, the gate electrode 24, the source electrode 32, and the drain electrode 34. The electron transit layer 16 is formed above the substrate 12. The electron supply layer 18 is formed on the electron transit layer 16 and has a larger band gap than the electron transit layer 16. The gate layer 22 is formed on the electron supply layer 18 and contains an acceptor impurity. The gate electrode 24 is formed on the gate layer 22. The source electrode 32 and the drain electrode 34 are located at opposite sides of the gate layer 22 and contact the electron supply layer 18.

The length L24 of the gate electrode 24 is greater than the length L22 of the gate layer 22 in the X-direction in which the source electrode 32, the gate layer 22, and the drain electrode 34 are arranged. The gate electrode 24 contacts the entire upper surface 22S of the gate layer 22 and extends from the gate layer 22 toward the source electrode 32 and the drain electrode 34.

The gate electrode 24 includes the first lower end 24EA and the second lower end 24EB that are the two ends of the electrode lower surface 24R in the X-direction. The first lower end 24EA of the gate electrode 24 is located between the gate layer 22 and the source electrode 32. The second lower end 24EB of the gate electrode 24 is located between the gate layer 22 and the drain electrode 34. The first lower end 24EA of the gate electrode 24 and the second lower end 24EB do not contact the upper surface 22S of the gate layer 22. Electric field concentration that would be caused by the first lower end 24EA and the second lower end 24EB does not occur in the gate layer 22. Thus, electric field concentration is limited in the gate layer 22. This avoids crystal defect or crystal fracture of the gate layer 22 that would be caused by such local electric field concentration and minimizes adverse effects on the gate withstand voltage.

(1-2) The length L24 of the gate electrode 24 in the X-direction is greater than the length L22 of the gate layer 22. In the nitride semiconductor device 110 of the comparative example illustrated in FIG. 4, when the length L22 of the gate layer 22 is decreased, the length L124 of the gate electrode 124 will also be decreased. This will increase the resistance of the gate electrode 124. In this respect, the nitride semiconductor device 10 of the first embodiment allows the length L24 of the gate electrode 24 to be sufficient. Thus, the resistance of the gate electrode will not increase. The nitride semiconductor device 10 of the first embodiment avoids increases in the resistance of the gate electrode 24 and allows the gate layer 22 to be further miniaturized.

Second Embodiment

Figure 17:
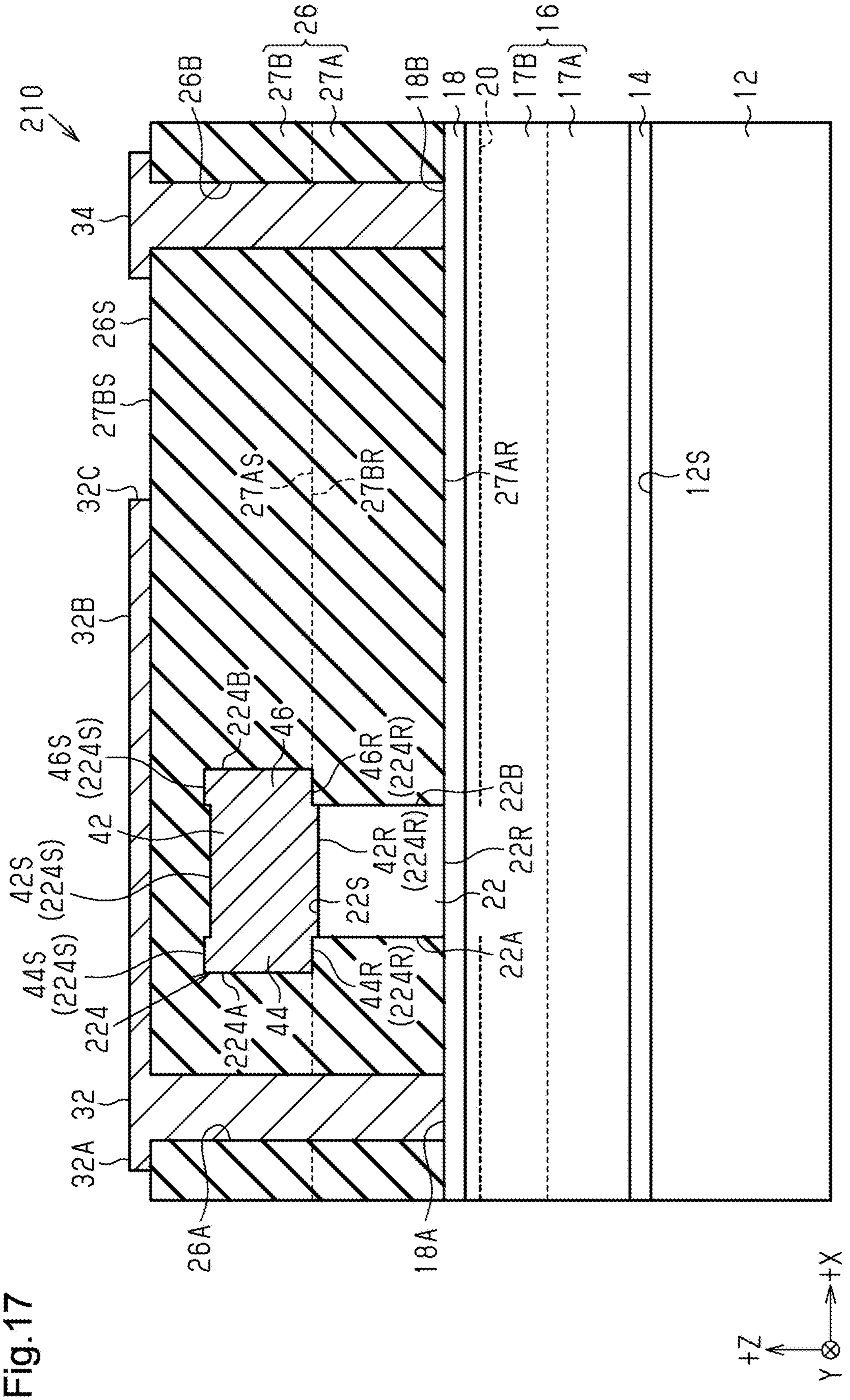
FIG. 17 is a schematic cross-sectional view exemplifying a nitride semiconductor device in accordance with a second embodiment.
Figure 18:
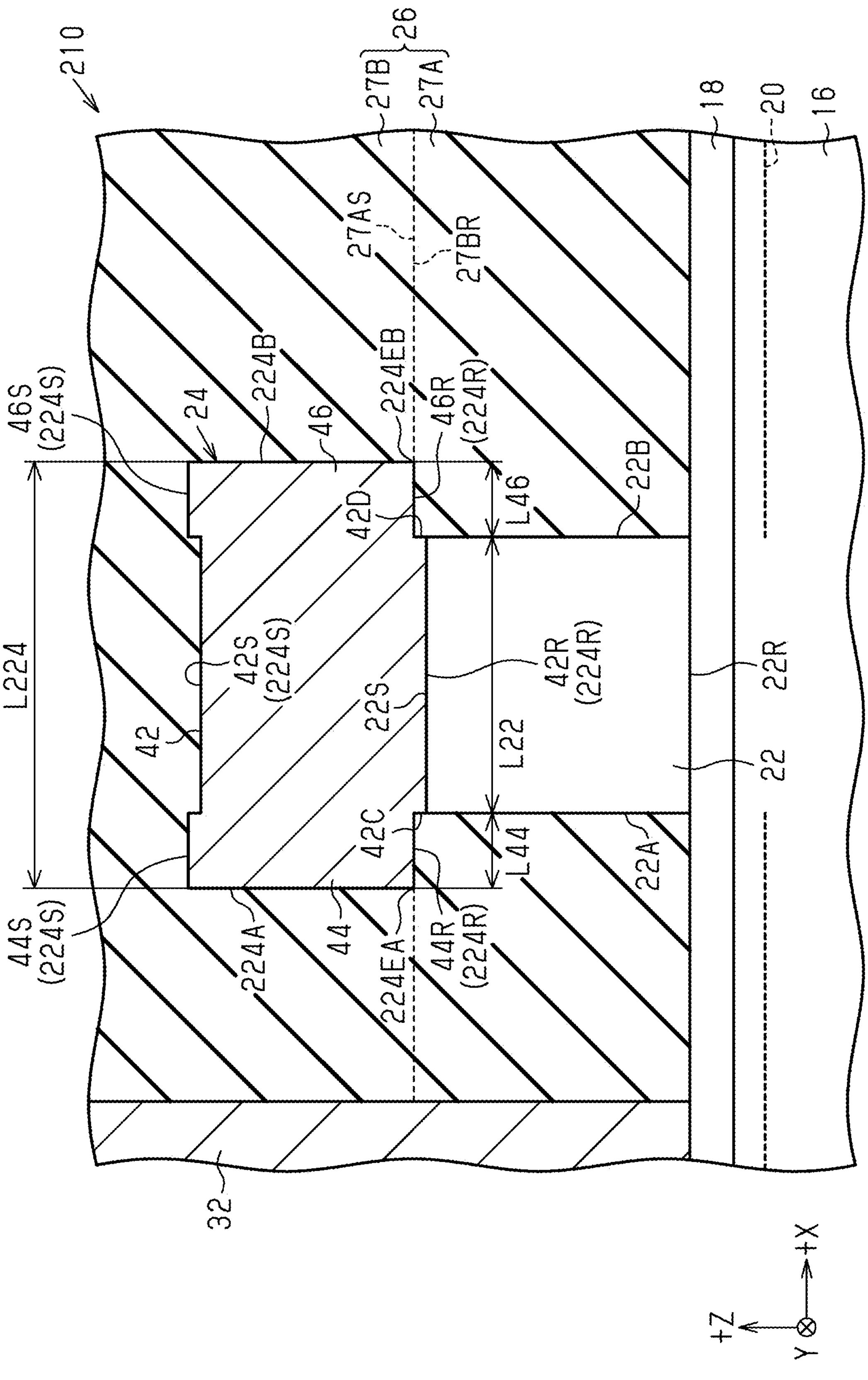
FIG. 18 is a schematic cross-sectional view enlarging part of FIG. 17.

FIG. 17 is a schematic cross-sectional view exemplifying a nitride semiconductor device 210 in accordance with a second embodiment. FIG. 18 is a schematic cross-sectional view enlarging part of FIG. 17. In FIGS. 17 and 18, same reference characters are given to those elements that are the same as the corresponding elements in the nitride semiconductor device 10 of the first embodiment. Components that are the same as the corresponding components of the nitride semiconductor device 10 in the first embodiment will not be described in detail.

The nitride semiconductor device 210 of the first embodiment differs from the nitride semiconductor device 10 of the first embodiment mainly in the shape of a gate electrode 224.

Exemplary Structure of Gate Electrode

As shown in FIGS. 17 and 18, the gate electrode 224 is larger in the X-direction than the gate layer 22. As shown in FIG. 18, the length L224 of the gate electrode 224 in the X-direction is greater than the length L22 of the gate layer 22.

As shown in FIG. 18, the gate electrode 224 includes an electrode upper surface 224S, an electrode lower surface 224R, and the electrode side surfaces 224A and 224B. Part of the electrode lower surface 224R contacts the upper surface 22S of the gate layer 22. The electrode side surface

224A faces the source electrode 32, and the electrode side surface 224B faces the drain electrode 34.

The gate electrode 224 includes the connecting portion 42, the source-side extension 44, and the drain-side extension 46. The connecting portion 42 contacts the entire upper surface 22S of the gate layer 22. The connecting portion 42 includes the lower surface 42R and the upper surface 42S. The entire lower surface 42R contacts the entire upper surface 22S of the gate layer 22. The length of the lower surface 42R in the X-direction is equal to the length L22 of the gate layer 22.

The source-side extension 44 extends from the connecting portion 42 toward the source electrode 32. The source-side extension 44 includes the lower surface 44R and the upper surface 44S. The lower surface 44R of the source-side extension 44 is located upward from the lower surface 42R of the connecting portion 42 and away from the substrate 12. Thus, the lower surface 44R of the source-side extension 44 is located upward from the upper surface 22S of the gate layer 22. In the same manner, the upper surface 44S of the source-side extension 44 is located upward from the upper surface 42S of the connecting portion 42. Preferably, the difference in height between the lower surface 44R of the source-side extension 44 and the lower surface 42R of the connecting portion 42 is close to zero. Preferably, the difference in height between the upper surface 44S of the source-side extension 44 and the upper surface 42S of the connecting portion 42 is also close to zero.

The drain-side extension 46 extends from the connecting portion 42 toward the drain electrode 34. The drain-side extension 46 includes the lower surface 46R and the upper surface 46S. The lower surface 46R of the drain-side extension 46 is located upward from the lower surface 42R of the connecting portion 42 and away from the substrate 12. Thus, the lower surface 46R of the drain-side extension 46 is located upward from the upper surface 22S of the gate layer 22. In the same manner, the upper surface 46S of the drain-side extension 46 is located upward from the upper surface 42S of the connecting portion 42. Preferably, the difference in height between the lower surface 46R of the drain-side extension 46 and the lower surface 42R of the connecting portion 42 is close to zero. Preferably, the difference in height between the upper surface 44S of the source-side extension 44 and the upper surface 42S of the connecting portion 42 is also close to zero.

The lower surface 42R of the connecting portion 42, the lower surface 44R of the source-side extension 44, and the lower surface 46R of the drain-side extension 46 form the electrode lower surface 224R of the gate electrode 224. The upper surface 42S of the connecting portion 42, the upper surface 44S of the source-side extension 44, and the upper surface 46S of the drain-side extension 46 form the electrode upper surface 224S of the gate electrode 224. In the nitride semiconductor device 210 of the second embodiment, the lower surface 44R of the source-side extension 44 and the lower surface 46R of the drain-side extension 46 are located at the same height in the Z-direction. Further, the upper surface 44S of the source-side extension 44 and the upper surface 46S of the drain-side extension 46 are located at the same height in the Z-direction.

The first insulation layer 27A of the passivation layer 26 contacts the side surfaces 22A and 22B of the gate layer 22. Further, the upper surface 27AS of the first insulation layer 27A contacts the electrode lower surface 224R of the gate electrode 224, namely, the lower surface 44R of the source-side extension 44 and the lower surface 46R of the drain-side extension 46. Thus, the first insulation layer 27A contacts the connecting portion 42 of the gate electrode 224 at a part 42C located downward from the lower surface 44R of the source-side extension 44 and the part 42D located downward from the lower surface 46R of the drain-side extension 46.

Method for Manufacturing Nitride Semiconductor Device 210

One example of a method for manufacturing the nitride semiconductor device 210 of FIG. 17 will now be described.

The method for manufacturing the nitride semiconductor device 210 of the second embodiment differs from the method for manufacturing the nitride semiconductor device of the first embodiment in the step of forming the gate layer 22 and the step of forming the gate electrode 224. These steps will now be described in detail.

FIGS. 19 to 24 are schematic cross-sectional views showing exemplary manufacturing steps of forming the gate layer 22 and the gate electrode 224 of the nitride semiconductor device 210. To facilitate understanding, in FIGS. 19 to 24, same reference characters are given to those elements that are the same as the corresponding elements shown in FIG. 17.

Figure 19:
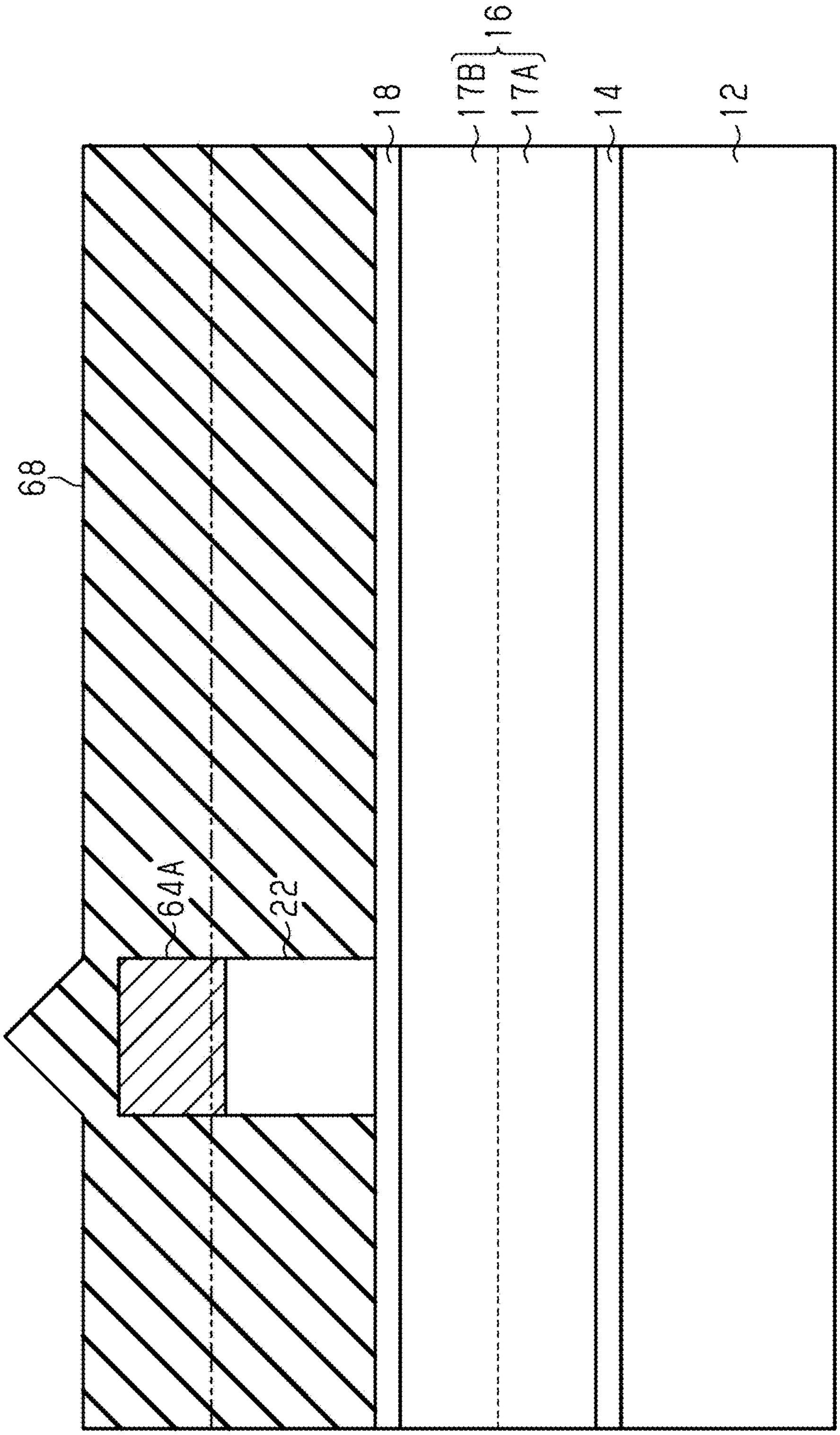
FIG. 19 is a schematic cross-sectional view exemplifying a manufacturing step of the nitride semiconductor device illustrated in FIG. 17.
Figure 20:
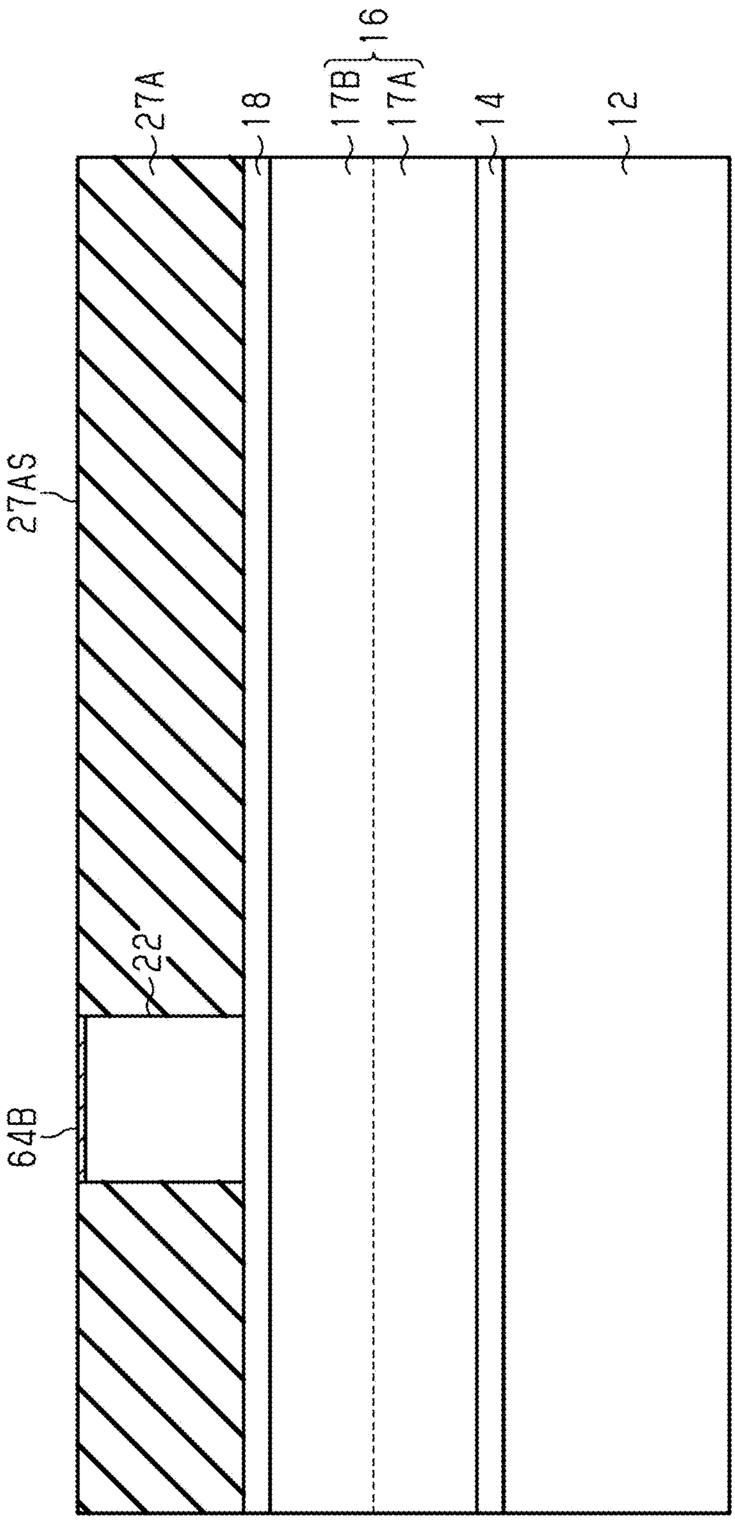
FIG. 20 is a schematic cross-sectional view illustrating a manufacturing step following the step of FIG. 19.
Figure 21:
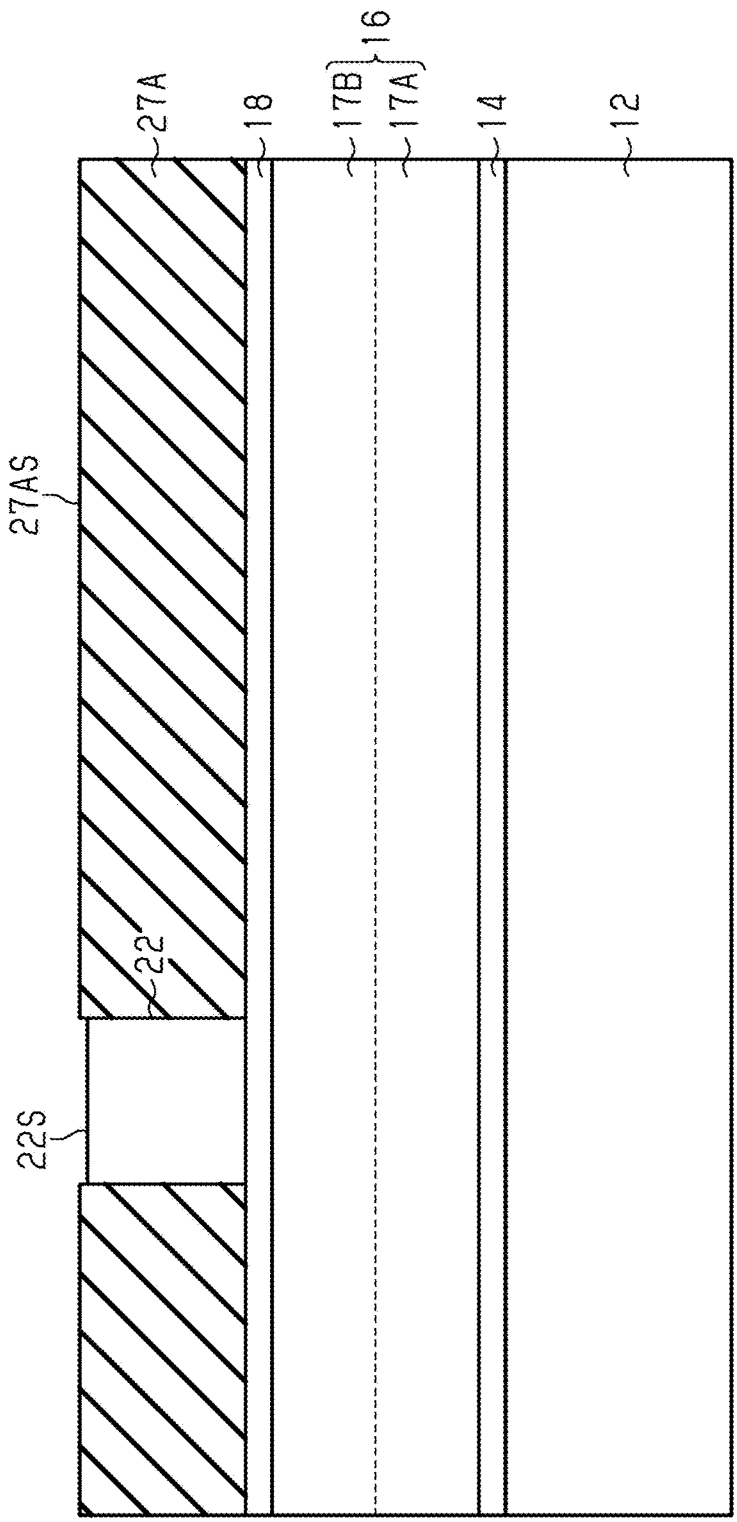
FIG. 21 is a schematic cross-sectional view illustrating a manufacturing step following the step of FIG. 20.

As shown in FIGS. 19 to 21, the method for manufacturing the nitride semiconductor device 210 includes forming the first insulation layer 27A. The formation of the first insulation layer 27A includes forming the first insulation film 68, forming the first insulation layer 27A, and exposing the gate layer 22.

As shown in FIG. 19, the first insulation film 68 is formed covering the gate layer 22 and the gate mask 64A. Preferably, the first insulation film 68 is, for example, a $SiO_2$ film formed with high-density plasma. A $SiO_2$ film will facilitate flattening in a CMP process.

As shown in FIGS. 5 to 7 illustrating the first embodiment, the gate mask 64A is formed by etching the mask layer 64, which is formed on the third nitride semiconductor layer, with the resist film 66. As shown in FIG. 8 illustrating the first embodiment, the gate layer 22 is formed by etching the third nitride semiconductor layer 62 with the gate mask 64A. In the second embodiment, the third nitride semiconductor layer 62 is formed in accordance with the thickness T1 of the gate layer 22, for example, so that its thickness is equal to the thickness T1 of the gate layer 22 shown in FIG. 18. In this manner, the third nitride semiconductor layer 62 is etched to obtain the gate layer 22 of the second embodiment.

As shown in FIG. 20, the first insulation film 68 is flattened to form the first insulation layer 27A. The first insulation film 68 may be flattened in, for example, a CMP process. In the flattening step, part of the gate mask 64A is left as a gate mask 64B. For example, the first insulation film 68 is polished until reaching the position indicated by the double-dashed line shown in FIG. 19. This step forms the first insulation layer 27A.

Then, as shown in FIG. 21, the gate mask 64B shown in FIG. 20 is removed to expose the upper surface 22S of the gate layer 22. The gate mask 64B may be removed by performing reactive ion etching (RIE) and wet etching. The difference in etching rate between the gate mask 64B and the first insulation layer 27A results in the amount of the gate mask 64B etched being greater than that of the first insulation layer 27A. As a result, the upper surface 27AS of the first insulation layer 27A is located upward from the gate layer 22. In this manner, the first insulation film 68 is flattened to form the first insulation layer 27A with part of the gate mask 64A (gate mask 64B) remaining to avoid damaging of the gate layer 22 when undergoing the CMP process.

Figure 22:
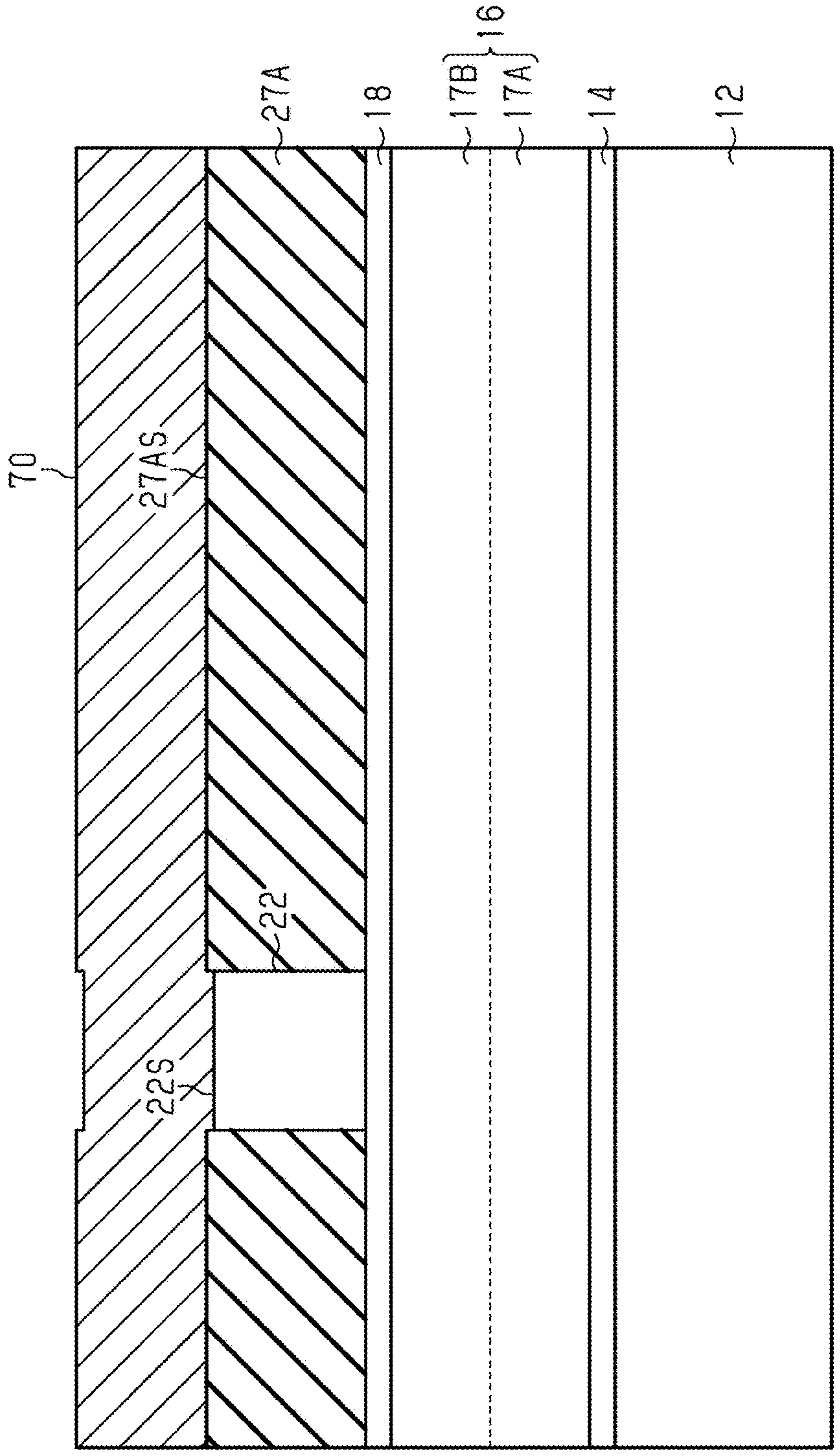
FIG. 22 is a schematic cross-sectional view illustrating a manufacturing step following the step of FIG. 21.
Figure 23:
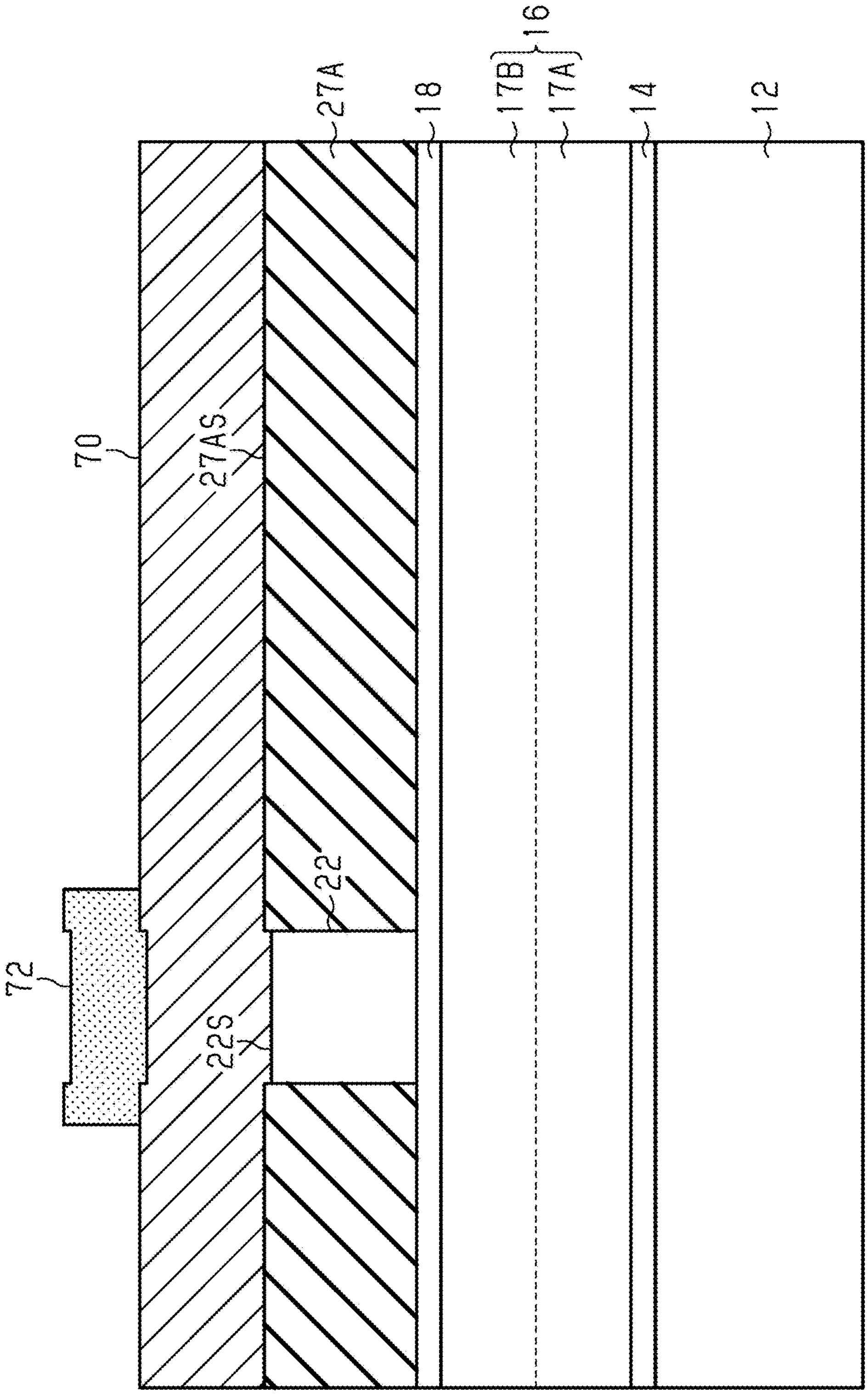
FIG. 23 is a schematic cross-sectional view illustrating a manufacturing step following the step of FIG. 22.
Figure 24:
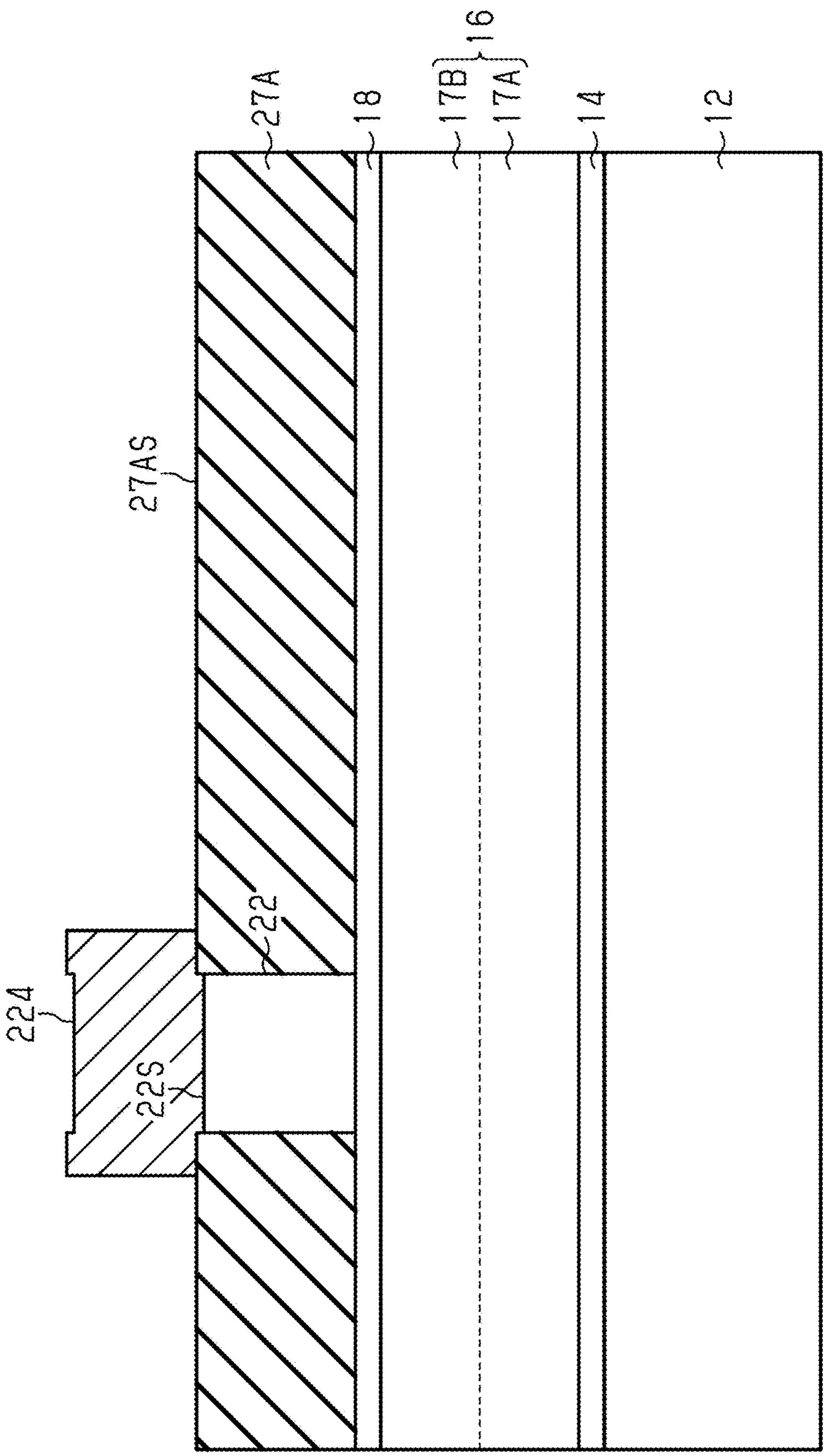
FIG. 24 is a schematic cross-sectional view illustrating a manufacturing step following the step of FIG. 23.

As shown in FIGS. 22 to 24, the method for manufacturing the nitride semiconductor device 210 includes forming the gate electrode 224 on the gate layer 22. The formation of the gate electrode 224 includes forming the metal layer 70, forming the resist film 72, forming the gate electrode 224, and removing the resist film 72.

First, as shown in FIG. 22, in the step following the step shown in FIG. 21, the metal layer 70 is formed on the gate layer 22 and the first insulation layer 27A. In the second embodiment, for example, a sputtering process is performed to form a TiN layer as the metal layer 70.

As shown in FIG. 23, in the step following the step shown in FIG. 22, the resist film 72 is formed on the metal layer 70. Lithography is performed to form the resist film 72 on the metal layer 70. The resist film 72 is formed in accordance with the size of the gate electrode 224 shown in FIG. 17.

As shown in FIG. 24, in the step following the step shown in FIG. 23, etching (e.g., dry etching) is performed using the resist film 72 as a mask to pattern the metal layer 70 and form the gate electrode 224. Then, the resist film 72 is removed with, for example, a removing solution.

Afterward, the second insulation layer 27B, the source electrode 32, and the drain electrode 34 are formed in the same manner as the first embodiment. This obtains the nitride semiconductor device 210 of FIG. 17.

Advantages

In addition to the advantages of the nitride semiconductor device 10, the nitride semiconductor device 210 of the first embodiment has the advantages described below.

(2-1) The gate electrode 224 of the nitride semiconductor device 210 includes the connecting portion 42, the source-side extension 44, and the drain-side extension 46. The lower surface 44R of the source-side extension 44 is located upward from the lower surface 42R of the connecting portion 42 and away from the substrate 12. The upper surface 44S of the source-side extension 44 is located upward from the upper surface 42S of the connecting portion 42. The lower surface 46R of the drain-side extension 46 is located upward from the lower surface 42R of the connecting portion 42 and away from the substrate 12. The upper surface 46S of the drain-side extension 46 is located upward from the upper surface 42S of the connecting portion 42.

During formation of the gate electrode 224, when forming the first insulation layer 27A of the passivation layer 26, the gate mask 64B is left on the gate layer 22. The gate mask 64B is then etched and removed to expose the upper surface 22S of the gate layer 22. Then, the gate electrode 224 is formed on the gate layer 22. The formation of the gate layer 22 and the gate electrode 224 in this manner avoids damage to the gate layer 22 during processing.

Third Embodiment

Figure 25:
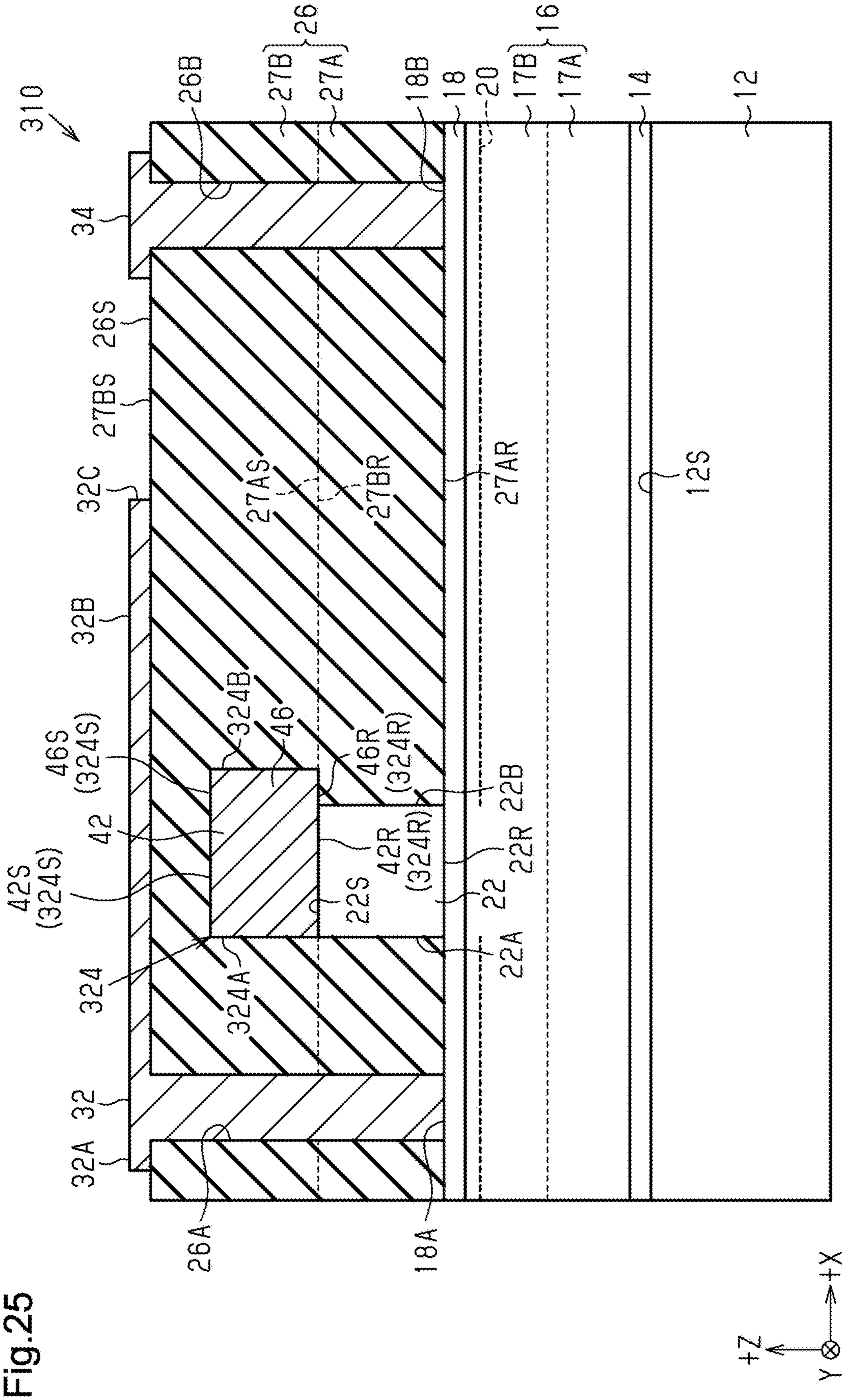
FIG. 25 is a schematic cross-sectional view exemplifying a nitride semiconductor device in accordance with a third embodiment.

FIG. 25 is a schematic cross-sectional view exemplifying a nitride semiconductor device 310 in accordance with a third embodiment. In FIG. 25, same reference characters are given to those elements that are the same as the corresponding elements in the nitride semiconductor device 10 of the first embodiment. Components that are the same as the corresponding components of the nitride semiconductor device 10 in the first embodiment will not be described in detail.

The nitride semiconductor device 310 of the third embodiment differs from the nitride semiconductor device 10 of the first embodiment mainly in the shape of a gate electrode 324.

In the nitride semiconductor device 310 of the third embodiment illustrated in FIG. 25, the gate electrode 324 includes the connecting portion 42 and the drain-side extension 46 but does not include the source-side extension 44 shown in FIG. 2. The gate electrode 324 includes an electrode upper surface 324S defined by the upper surface 42S of the connecting portion 42 and the electrode upper surface 24S of the drain-side extension 46. The gate electrode 324 includes an electrode lower surface 324R defined by the lower surface 42R of the connecting portion 42 and the lower surface 46R of the drain-side extension 46. The gate electrode 324 includes a source-side surface 324A, located at the same position as the side surface 22A of the gate layer 22 in the X-direction, and a drain-side surface 324B located between the side surface 22B of the gate layer 22 and the drain electrode 34. In this manner, the gate electrode 324 includes the drain-side extension 46 that limits electric field concentration at the gate layer 22.

The source-side surface 324A may be arranged on the upper surface 22S of the gate layer 22. In this case, the drain-side extension 46 allows electric field concentration at the gate layer 22 to be more limited than the nitride semiconductor device 110 of the comparative example shown in FIG. 4.

A gate electrode include may include the connecting portion 42 and the source-side extension 44 and not include the drain-side extension 46. Further, with the gate electrode that includes the source-side extension 44, the drain-side surface may be arranged on the upper surface 22S of the gate layer 22.

Fourth Embodiment

Figure 26:
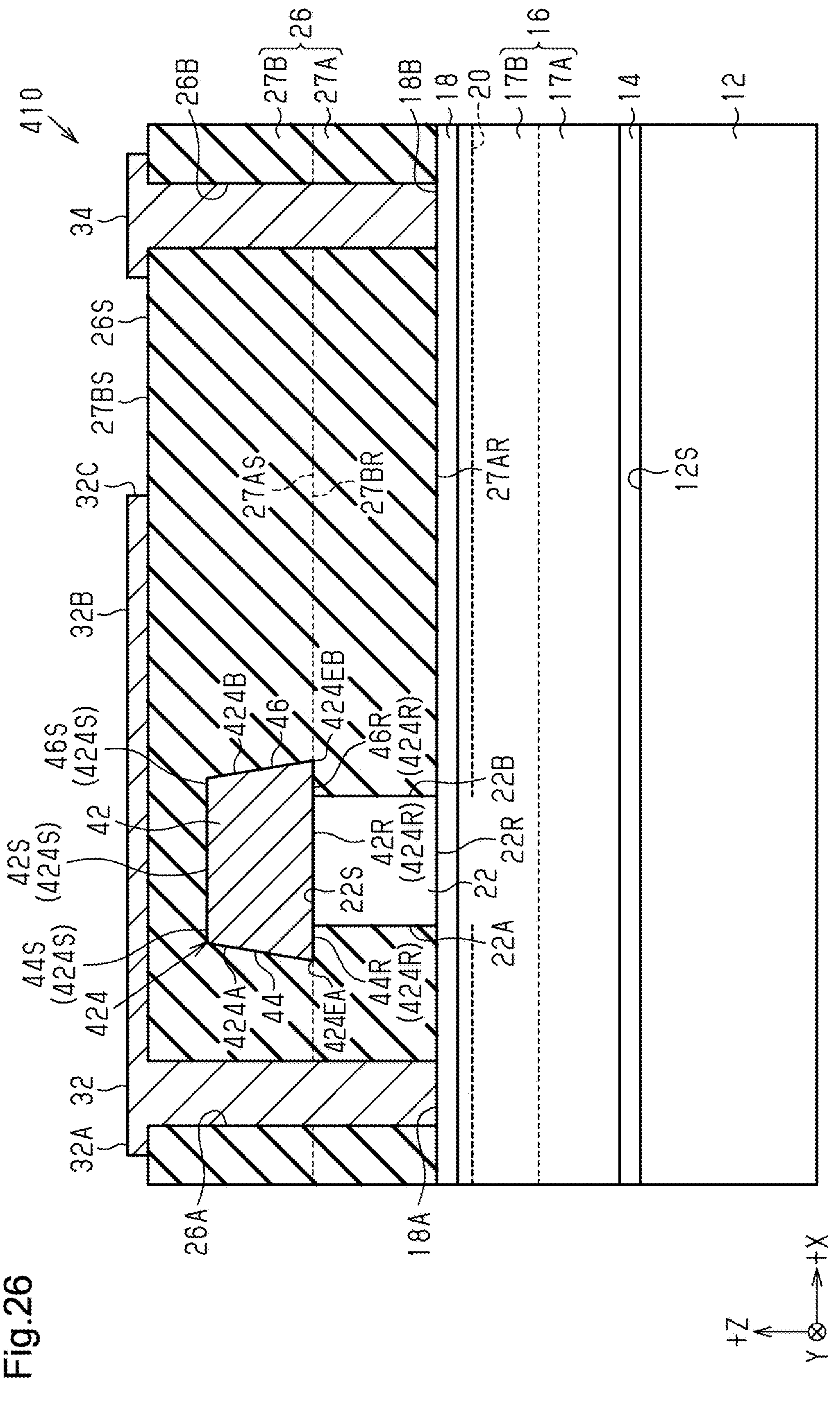
FIG. 26 is a schematic cross-sectional view exemplifying a nitride semiconductor device in accordance with a fourth embodiment.

FIG. 26 is a schematic cross-sectional view exemplifying a nitride semiconductor device 410 in accordance with a fourth embodiment. In FIG. 26, same reference characters are given to those elements that are the same as the corresponding elements in the nitride semiconductor device 10 of the first embodiment. Components that are the same as the corresponding components of the nitride semiconductor device 10 in the first embodiment will not be described in detail.

The nitride semiconductor device 410 of the third embodiment differs from the nitride semiconductor device 10 of the first embodiment mainly in the shape of a gate electrode 424.

In the nitride semiconductor device 410 of the fourth embodiment illustrated in FIG. 26, the gate electrode 424 has a trapezoidal cross section, and the gate electrode 424 is formed so that the length in the X-direction increases from an electrode upper surface 424S to an electrode lower surface 424R. A source-side surface 424A and a drain-side surface 424B are inclined to become closer to each other as the substrate 12 becomes farther in the Z-direction. Alternatively, only one of the source-side surface 424A and the drain-side surface 424B may be inclined. In the gate electrode 424, at least one of a first lower end 424EA and a second lower end 424EB is separated from the gate layer 22 in the X-direction. This limits electric field concentration at the gate layer 22.

Fifth Embodiment

Figure 27:
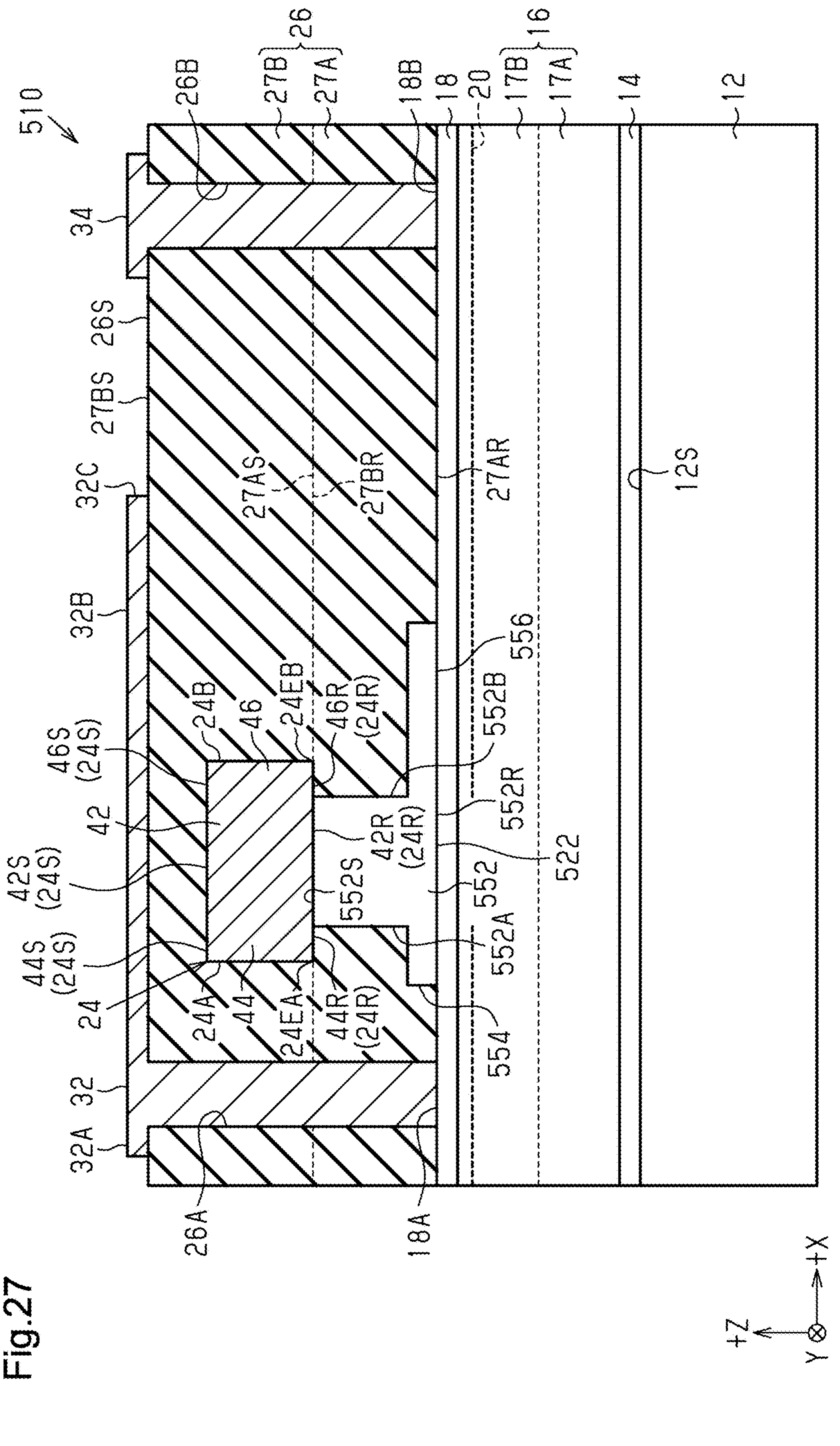
FIG. 27 is a schematic cross-sectional view exemplifying a nitride semiconductor device in accordance with a fifth embodiment.

FIG. 27 is a schematic cross-sectional view exemplifying a nitride semiconductor device 510 in accordance with a fifth embodiment. In FIG. 27, same reference characters are given to those elements that are the same as the corresponding elements in the nitride semiconductor device 10 of the first embodiment. Components that are the same as the corresponding components of the nitride semiconductor device 10 in the first embodiment will not be described in detail.

The nitride semiconductor device 510 of the fifth embodiment differs from the nitride semiconductor device 10 of the first embodiment mainly in the shape of a gate layer 522.

In the nitride semiconductor device 510 of the fifth embodiment illustrated in FIG. 27, the gate layer 522 may include a stepped structure. In one example, the gate layer 522 includes a ridge 552, a source-side step 554, and a drain-side step 556. The source-side step 554 and the drain-side step 556 extend in opposite directions from the two sides of the ridge 552. The ridge 552, the source-side step 554, and the drain-side step 556 form the stepped structure of the gate layer 522.

The ridge 552 is a relatively thick part of the gate layer 522. The gate electrode 24 contacts the entire upper surface 552S of the ridge 552. The ridge 552 may have a rectangular or trapezoidal cross section extending along an XZ plane in FIG. 27. The ridge 552 may have a thickness of, for example, 100 nm or greater and 200 nm or less. The thickness T1 of the ridge 552 is the distance from the upper surface of the ridge 552 to the lower surface of the ridge 552 (lower surface of gate layer 522 contacting electron supply layer 18). The thickness of the ridge 552 (gate layer 522) is determined considering various parameters such as the gate withstand voltage.

The source-side step 554 extends from a source-side surface 552A of the ridge 552 toward the source opening 26A of the passivation layer 26 (minus X-direction in FIG. 27). The drain-side step 556 extends from a drain-side surface 552B of the ridge 552 toward the drain opening 26B of the passivation layer 26 (positive X-direction in FIG. 27). In the example of FIG. 27, the drain-side step 556 extends over a longer distance from the ridge 552 than the source-side step 554. Instead, the source-side step 554 may be equal in length to the drain-side step 556. The source-side step 554 may have a thickness of, for example, 10 nm or greater and 30 nm or less. The source-side step 554 may have a width of 0.2 μm or greater and 0.3 μm or less in the direction extending from the ridge 552 toward the source opening 26A. The drain-side step 556 may have a thickness of, for example, 10 nm or greater and 30 nm or less. The drain-side step 556 may have a width of, for example, 0.2 μm or greater and 0.6 μm or less in the direction extending from the ridge 552 toward the drain opening 26B. The source-side step 554 may be equal in thickness to the drain-side step 556. As long as the difference between the thickness of the source-side step 554 and the thickness of the drain-side step 556 is within 10% of the thickness of the source-side step 554, the thickness of the source-side step 554 will be considered as being equal to the thickness of the drain-side step 556.

In the nitride semiconductor device 510, the first lower end 24EA of the gate electrode 24 is located closer to the source electrode 32 than the source-side surface 552A of the ridge 552. The second lower end 24EB of the gate electrode 24 is located closer to the drain electrode 34 than the drain-side surface 552B of the ridge 552. In this manner, the arrangement of the first lower end 24EA and the second lower end 24EB limits electric field concentration at the gate layer 522 in the same manner as the nitride semiconductor device 10 of the first embodiment. Further, the gate withstand voltage will not decrease.

The source field plate portion 32B is formed integrally with the upper region of the source electrode portion 32A and is arranged on the passivation layer 26 so as to cover the entire gate layer 22 (ridge 552, source-side extension 44, and drain-side extension 46 in example of FIG. 2) in plan view.

In the nitride semiconductor device 510 of the fifth embodiment, the source-side step 554 and the drain-side step 556 reduces the density of the holes accumulated in the interface between the gate layer 22 and the electron supply layer 18. This avoids band bending of the electron supply layer 18 that would be caused by hole accumulation and limits increases in the gate leakage current.

Sixth Embodiment

Schematic Structure of Nitride Semiconductor Device

Figure 29:
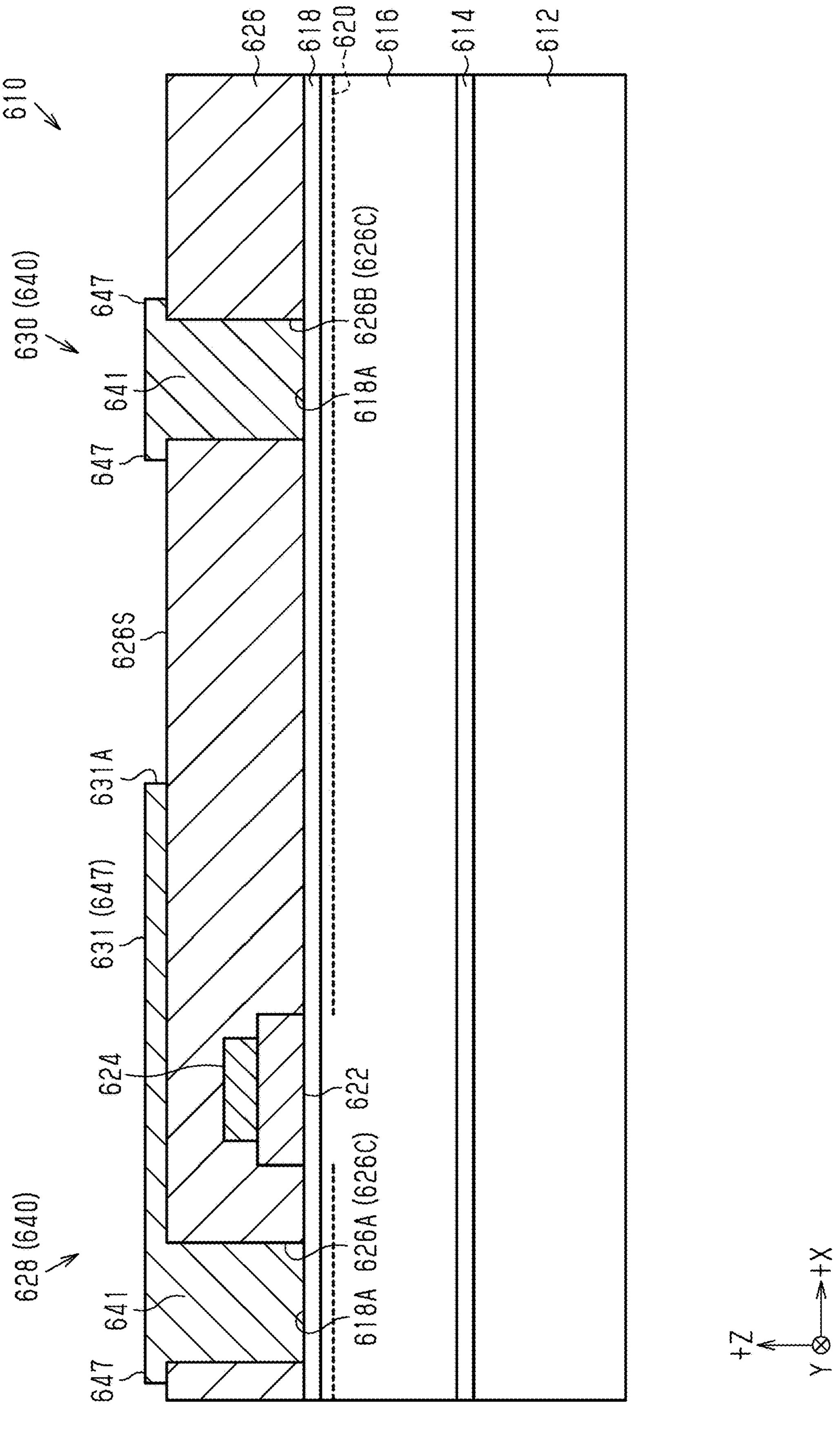
FIG. 29 is a schematic cross-sectional view of the nitride semiconductor device taken along line F29-F29 in FIG. 28.

With reference to FIG. 29, the structure of a nitride semiconductor device 610 will now be described.

FIG. 29 schematically shows the planar structure of the nitride semiconductor device 610 in accordance with a sixth embodiment. In this specification, the X-axis, Y-axis, and Z-axis are orthogonal to one another as shown in FIG. 29. The term "plan view" as used in this specification is a view of the nitride semiconductor device 610 taken in the Z-axis direction. Further, in FIG. 29, which shows the nitride semiconductor device 610, the +Z direction corresponds to the upward direction, the −Z direction corresponds to the downward direction, the +X direction corresponds to the rightward direction, and the −X direction corresponds to the leftward direction. Unless otherwise indicated, the term "plan view" will refer to a view taken from above along the Z-axis of the nitride semiconductor device 610.

The nitride semiconductor device 610 is a high-electron-mobility transistor (HEMT) that uses a nitride semiconductor. The nitride semiconductor device 610 includes a semiconductor substrate 612, a buffer layer 614 formed on the semiconductor substrate 612, an electron transit layer 616 formed on the buffer layer 614, and an electron supply layer 618 formed on the electron transit layer 616.

The semiconductor substrate 612 may be, for example, a silicon (Si) substrate. A silicon carbide (SiC) substrate, a gallium nitride (GaN) substrate, or a sapphire substrate may be used instead of a Si substrate. The semiconductor substrate 612 may have a thickness of, for example, 200 μm or greater and 1500 μm or less. In the description hereafter, thickness will mean the dimension in the Z-direction indicated in FIG. 29 unless otherwise specified.

The buffer layer 614 may be formed from any material that limits wafer warping or cracking that would be caused by a difference in coefficient of thermal expansion between the semiconductor substrate 612 and the electron transit layer 616. The buffer layer 614 may include one or more nitride semiconductor layers. The buffer layer 614 may include at least one of an aluminum nitride (AlN) layer, an aluminum gallium nitride (AlGaN) layer, and a graded AlGaN layer of different aluminum (Al) compositions. For example, the buffer layer 614 may be a single film of AlN, a single film of AlGaN, a film having an AlGaN/GaN superlattice structure, a film having an AlN/AlGaN superlattice structure, or a film having an AlN/GaN superlattice structure.

In one example, the buffer layer 614 includes a first buffer layer, which is an AlN layer formed on the semiconductor substrate 612, and a second buffer layer, which is an AlGaN layer formed on the AlN layer (first buffer layer). The first buffer layer may be an AlN layer having a thickness of 200 nm, and the second buffer layer may be a graded AlGaN layer having a thickness of 300 nm. To reduce leakage current in the buffer layer 614, part of the buffer layer 614 may include an impurity so that regions other than the outermost part of the buffer layer 614 is semi-insulative. In this case, the impurity may be, for example, carbon (C) or iron (Fe). The concentration of the impurity may be, for example, $4\times10^{16}$ $cm^{-3}$ or greater.

The electron transit layer 616 is composed of a semiconductor nitride. The electron transit layer 616 may be, for example, a GaN layer. The electron transit layer 616 may have a thickness of, for example, 0.5 μm or greater and 2 μm or less. To reduce leakage current in the electron transit layer 616, part of the electron transit layer 616 may include an impurity so that regions other than the outermost layer the electron transit layer 616 is semi-insulative. In this case, the impurity may be, for example, carbon (C). The concentration of the impurity may be, for example, $4\times10^{16}$ $cm^{-3}$ or greater. The electron transit layer 616 may include GaN layers of different impurity concentrations, for example, a carbon-doped GaN layer and a non-doped GaN layer. In this case, the carbon-doped GaN layer is formed on the buffer layer 614. The carbon-doped GaN layer may have a thickness of 0.5 μm or greater and 2 μm or less. The carbon-doped GaN layer may have a carbon concentration of $5\times10^{17}$ $cm^{-3}$ or greater and $9\times10^{19}$ $cm^{-3}$ or less. The non-doped GaN layer is formed on the carbon-doped GaN layer. The non-doped GaN layer may have a thickness of 0.05 μm or greater and 0.4 μm or less. The non-doped GaN layer contacts the electron supply layer 618. In one example, the electron transit layer 616 includes a carbon-doped GaN layer having a thickness of 0.4 μm and a non-doped GaN layer having a thickness of 0.4 μm. The carbon-doped GaN layer has a carbon concentration of approximately $2\times10^{19}$ $cm^{-3}$.

The electron supply layer 618 has a larger band gap than the electron transit layer 616. The electron supply layer 618 may be, for example, an AlGaN layer. A nitride semiconductor will have a larger band gap as the Al composition increases. Thus, the electron supply layer 618, which is an AlGaN layer, has a larger band gap than the electron transit layer 616, which is a GaN layer. In one example, the electron supply layer 618 is composed of $Al_xGa_{1-x}N$. Thus, the electron supply layer 618 is an $Al_xGa_{1-x}N$ layer, where x is $0<x<0.4$ and, more preferably, $0.1<x<0.3$. The electron supply layer 618 may have a thickness of, for example, 5 nm or greater and 20 nm or less.

The electron transit layer 616 and the electron supply layer 618 have bulk regions with different lattice constants. The electron transit layer 616 and the electron supply layer 618 are lattice-mismatched junctions. The spontaneous polarization of the electron transit layer 616 and the electron supply layer 618 and the piezoelectric polarization from the compression stress received by the heterojunction of the electron transit layer 616 causes the energy level of the conduction band of the electron transit layer 616 to be lower than the Fermi level in the proximity of the heterojunction interface between the electron supply layer 618 and the electron transit layer 616. Thus, two-dimensional electron gas (2DEG) 620 spreads in the electron transit layer 616 at a location proximate to (e.g., distanced by approximately a few nanometers from interface) the heterojunction interface of the electron transit layer 616 and the electron supply layer 618.

The electron supply layer 618 has a larger band gap than the electron transit layer 616. The electron supply layer 618 may be, for example, an AlGaN layer. A nitride semiconductor will have a larger band gap as the Al composition increases. Thus, the electron supply layer 618, which is an AlGaN layer, has a larger band gap than the electron transit layer 616, which is a GaN layer. In one example, the electron supply layer 618 is composed of $Al_xGa_{1-x}N$. Thus, the electron supply layer 618 is an $Al_xGa_{1-x}N$ layer, where x is $0<x<0.4$ and, more preferably, $0.1<x<0.3$. The electron supply layer 618 may have a thickness of, for example, 5 nm or greater and 20 nm or less.

Figure 30:
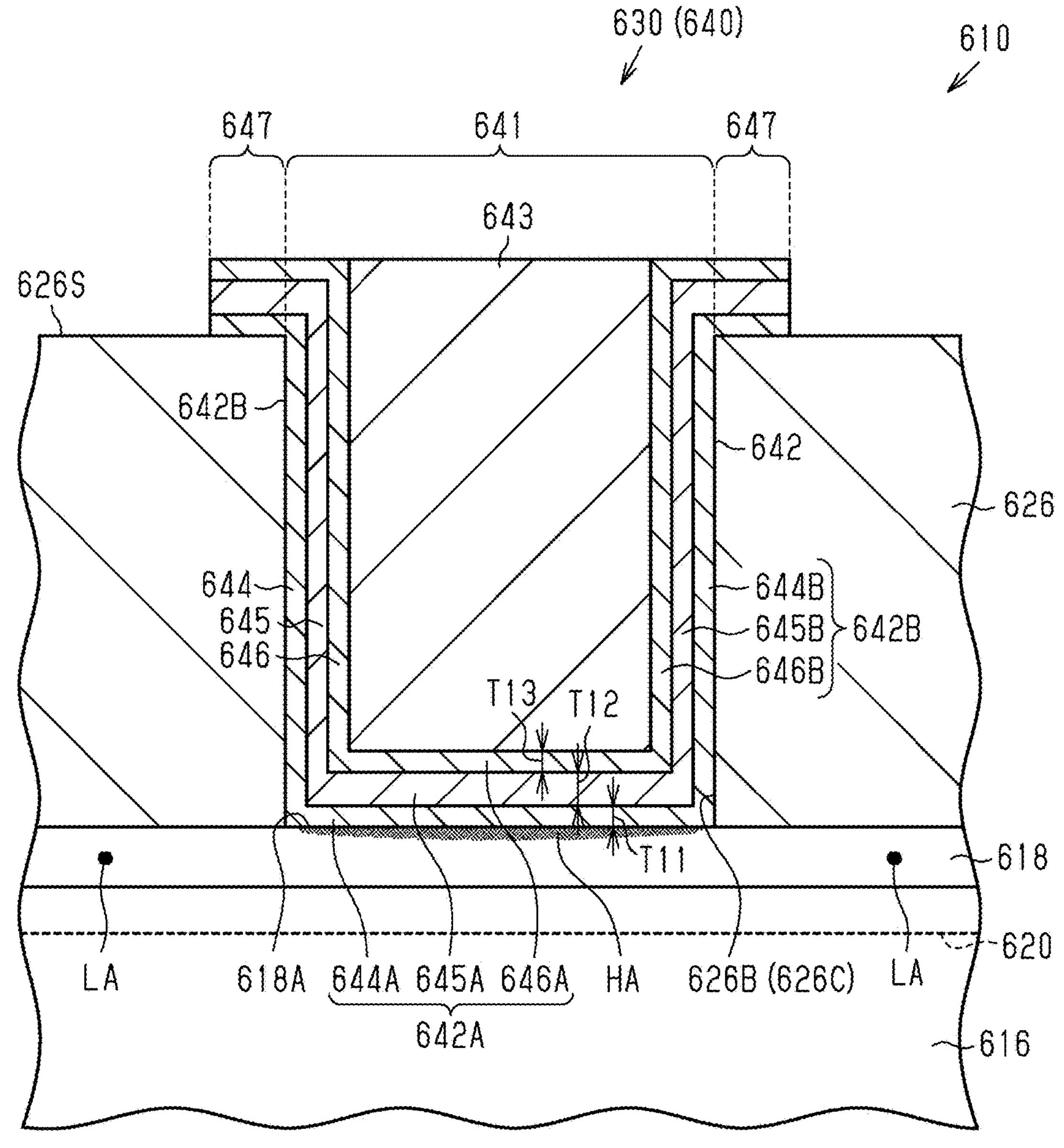
FIG. 30 is an enlarged cross-sectional view of FIG. 29 showing a drain electrode.

The electron supply layer 618 contains diffused metal. The diffused metal is, for example, at least one metal selected from aluminum and titanium. As shown in FIG. 30, the electron supply layer 618 includes a high-concentration region HA, where the concentration of the diffused metal is relatively high in the electron supply layer 618, and a low-concentration region LA, where the concentration of the diffused metal is relatively low. The high-concentration region HA overlaps a source opening 626A (refer to FIG. 29) and a drain opening 626B in plan view. The low-concentration region LA is where the electron supply layer 618 does not face the source opening 626A and the drain opening 626B. The low-concentration region LA is, for example, where the electron supply layer 618 is covered by an insulation layer 626 in plan view.

Accordingly, parts of the electron supply layer 618 overlapping the source opening 626A and the drain opening 626B have a higher diffused metal concentration than parts that do not overlap the openings. The high-concentration region HA is formed in the surface of the electron supply layer 618 exposed to the source opening 626A and the drain opening 626B and is spread from the surface into the electron supply layer 618 in the thickness direction (Z-direction). FIG. 30 shows the high-concentration region HA and the low-concentration region LA in the vicinity of the drain opening 626B. The high-concentration region HA and the low-concentration region LA are also formed in the vicinity of the source opening 626A in the same manner as the vicinity of the drain opening 626B.

As shown in FIG. 29, the nitride semiconductor device 610 further includes a gate layer 622 formed on the electron supply layer 618, a gate electrode 624 formed on the gate layer 622, the electron supply layer 618, the gate layer 622, and the insulation layer 626 covering the gate electrode 624. The insulation layer 626 includes the source opening 626A and the drain opening 626B at opposite sides of the gate layer 622 in the X-direction in plan view. The X-direction is the direction in which the source opening 626A is separated from the drain opening 626B. In the sixth embodiment, the source opening 626A and the drain opening 626B correspond to openings extending through the insulation layer 626.

The gate layer 622 has a smaller band gap than the electron supply layer 618 and is composed of a nitride semiconductor containing an acceptor impurity. The gate layer 622 may be formed from any material having a smaller band gap than the electron supply layer 618, which is an AlGaN layer. In one example, the gate layer 622 is a GaN layer (p-type GaN layer) doped with an acceptor impurity. The acceptor impurity may contain at least one of zinc (Zn), magnesium (Mg), and carbon (C). The maximum concentration of the acceptor impurity in the gate layer 622 is, for example, $1\times10^{18}$ $cm^{-3}$ or greater and $1\times10^{20}$ $cm^{-3}$ or less.

The acceptor impurity included in the gate layer 622 raises the energy level of the electron transit layer 616 and the electron supply layer 618. Thus, the energy level of the conduction band of the electron transit layer 616 is substantially the same as or greater than the Fermi level in the proximity of the heterojunction interface between the electron transit layer 616 and the electron supply layer 618 in the region underneath the gate layer 622. Accordingly, at zero-bias when voltage is not applied to the gate electrode 624, the 2DEG 620 is not formed in the electron transit layer 616 in the region underneath the gate layer 622. The 2DEG 620 is formed in the electron transit layer 616 in the region underneath the gate layer 622.

In this manner, the gate layer 622, which is doped with the acceptor impurity, depletes the 2DEG 620 in the region underneath the gate layer 622. This results in a normally-off action of the nitride semiconductor device 610. The application of a suitable on-voltage to the gate electrode 624 will form a channel with the 2DEG 620 in the electron transit layer 616 in the region underneath the gate electrode 624 and electrically connect the source and drain.

The cross-sectional shape of the gate layer 622 is not particularly limited. For example, the gate layer 622 may have a rectangular, trapezoidal, or ridged cross section extending along an XZ plane in FIG. 29.

The gate electrode 624 may be formed by one or more metal layers. In one example, the gate electrode 624 is a titanium nitride (TiN) layer. Alternatively, the gate electrode 624 may be formed by a first metal layer of a material containing Ti and a second metal layer formed from a material containing TiN. The gate electrode 624 and the gate layer 622 may form a Schottky junction. The gate electrode 624 may be formed in a smaller region than the gate layer 622. The gate electrode 624 may have a thickness of, for example, 50 nm or greater and 200 nm or less.

The passivation layer 626 may be composed of a material containing one of, for example, silicon nitride (SiN), silicon dioxide ($SiO_2$), silicon oxynitride (SiON), alumina ($Al_2O_3$), AlN, and aluminum oxynitride (AlON). In one example, the insulation layer 626 is formed from a material containing SiN.

The insulation layer 626 is formed on the electron supply layer 618. The insulation layer 626 covers the electron supply layer 618. The passivation layer 626 may be composed of a material containing one of, for example, silicon nitride (SiN), silicon dioxide ($SiO_2$), silicon oxynitride (SiON), alumina ($Al_2O_3$), AlN, and aluminum oxynitride (AlON). In one example, the insulation layer 626 is formed from a material containing SiN. The insulation layer 626 is a passivation layer. The insulation layer 626 is thicker than the electron supply layer 618. The thickness of the insulation layer 626 is, for example, 300 nm or greater and 1000 nm or less. The insulation layer 626 may have any thickness. The insulation layer 626 has a flat surface 626S. Thus, the insulation layer 626 is thinner at the part contacting the gate layer 622 and the gate electrode 624 than the part contacting the electron supply layer 618.

The source opening 626A and the drain opening 626B are each separated from the gate layer 622. The gate layer 622 is located between the source opening 626A and the drain opening 626B. The gate layer 622 is located closer to the source opening 626A than the drain opening 626B in the X-direction. Thus, the distance between the gate layer 622 and the drain opening 626B in the X-direction is longer than the distance between the gate layer 622 and the source opening 626A in the X-direction.

The nitride semiconductor device 610 further includes a source electrode 628, contacting the electron supply layer 618 through the source opening 626A, and a drain electrode 630, contacting the electron supply layer 618 through the drain opening 626B.

The source electrode 628 and the drain electrode 630 are formed by metal layers. The source electrode 628 and the drain electrode 630 will be described in detail later. The source electrode 628 and the drain electrode 630 are in ohmic contact with the 2DEG 620 through the source opening 626A and the drain opening 626B.

The nitride semiconductor device 610 further includes a field plate electrode 631 formed on the insulation layer 626. The field plate electrode 631 extends in at least part of the region between the gate layer 622 and the drain electrode 630 in plan view. The field plate electrode 631 is separated from the drain electrode 630. Thus, the field plate electrode 631 includes, for example, an end 631A located between the drain electrode 630 (drain opening 626B) and the gate layer 622.

The field plate electrode 631 is electrically connected to the source electrode 628. In one example, as shown in FIG. 29, the field plate electrode 631 is continuous with the source electrode 628. In this case, the field plate electrode 631 is formed integrally with the source electrode 628. In the integrated electrode, the source electrode 628 may include at least the part in the source opening 626A of the insulation layer 626, and the field plate electrode 631 may include the remaining part. The field plate electrode 631 functions to limit electric field concentration near the end of the gate electrode 624 at zero-bias when voltage is not applied to the gate electrode 624.

Planar Structure of Nitride Semiconductor Device

Figure 28:
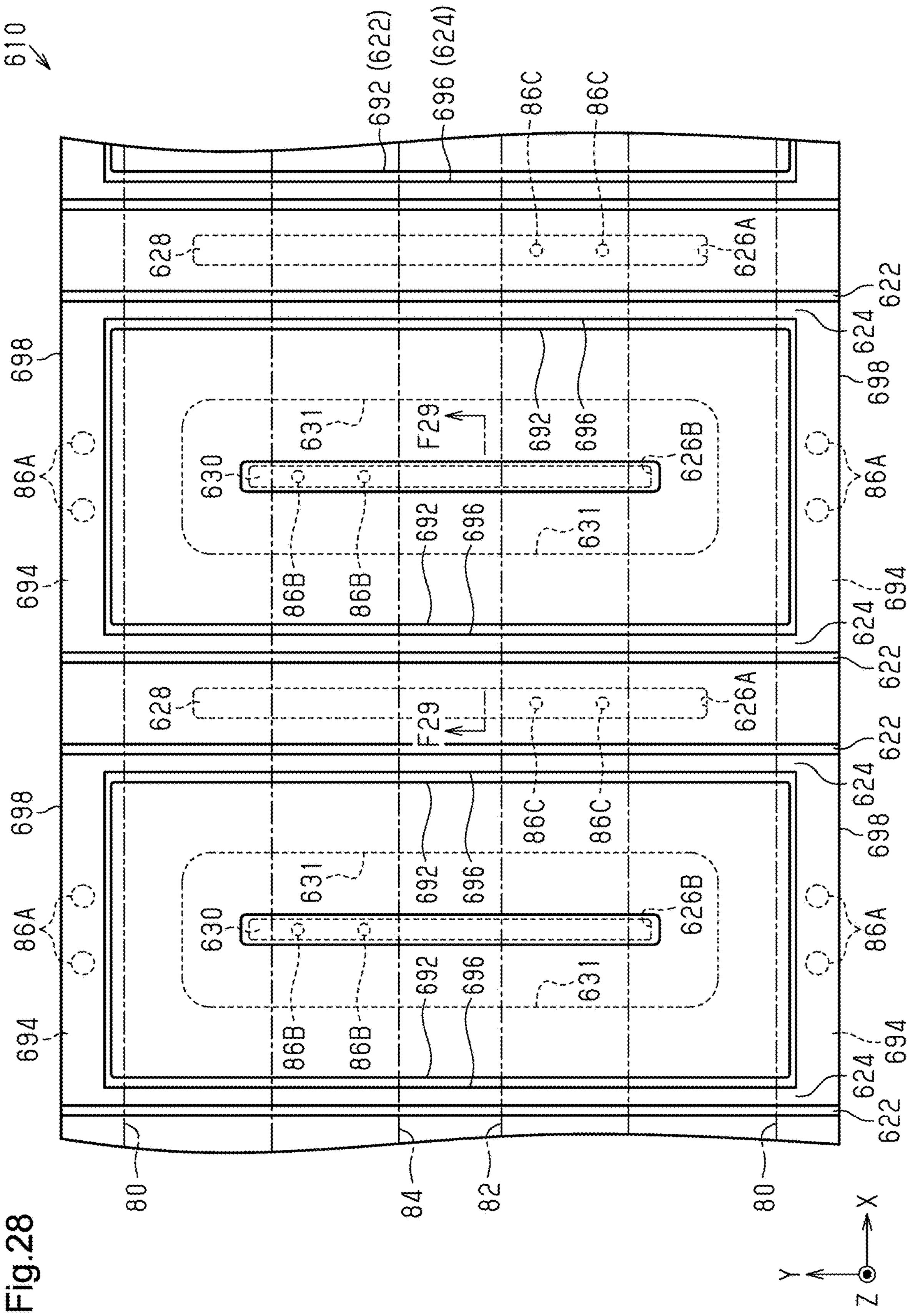
FIG. 28 is a schematic plan view exemplifying a nitride semiconductor device in accordance with a sixth embodiment.

With reference to FIG. 28, the planar structure of the nitride semiconductor device 610 in accordance with the sixth embodiment will now be described. In FIG. 28, the insulation layer 626 is not shown. Further, the source opening 626A, the drain opening 626B, and the field plate electrode 631 of the source electrode 628 are shown in broken lines.

As shown in FIG. 28, the gate layer 622 has a closed-shape in plan view. The gate layer 622 includes two main portions 692, extending in the Y-axis direction at opposite sides of the drain electrode 630 in the X-axis direction, and two connecting portions 694, connecting the two main portions 692 to each other at opposite sides of the drain electrode 630 in the Y-axis direction. The gate layer 622 surrounds the drain electrode 630 in plan view. Thus, the drain electrode 630 is surrounded by the gate layer 622 in plan view.

The gate electrode 624 has a closed shape in plan view. The gate electrode 624 includes two main portions 696, extending in the Y-axis direction at opposite sides of the drain electrode 630 in the X-axis direction, and two connecting portions 698, connecting the two main portions 696 to each other at opposite sides of the drain electrode 630 in the Y-axis direction. The gate electrode 624 surrounds the drain electrode 630 in plan view. Thus, the drain electrode 630 is surrounded by the gate electrode 624 in plan view. The gate electrode 624 is arranged on the gate layer 622. The main portions 696 of the gate electrode 624 are arranged on the main portions 692 of the gate layer 622. The connecting portions 698 of the gate electrode 624 are arranged on the connecting portions 694 of the gate layer 622.

The nitride semiconductor device 610 of the sixth embodiment may include the gate wiring 80, the source wiring 82, and the drain wiring 84. FIG. 28 shows the outlines of the gate wiring 80, the source wiring 82, and the drain wiring 84 in single-dashed lines. The gate wiring 80, the source wiring 82, and the drain wiring 84 extend in the X-axis direction. The gate wiring 80, the source wiring 82, and the drain wiring 84 are arranged next to one another in the Y-axis direction. In one example, the gate wiring 80 is arranged on the connecting portions 694 of the gate electrode 624. In one example, the source wiring 82 and the drain wiring 84 intersect the source electrode 628 and the drain electrode 630. In one example, the gate electrode 624 is electrically connected to the gate wiring 80 by bonding vias 86A. The source electrode 628 is electrically connected to the source wiring 82 by bonding vias 86B. The drain electrode 630 is electrically connected to the drain wiring 84 by bonding vias 86C.

Detail of Source Electrode and Drain Electrode

The source electrode 628 and the drain electrode 630 will now be described in detail.

In the sixth embodiment, each of the source electrode 628 and the drain electrode 630 is a specified electrode 640 having a specified layer structure. The specified electrode 640 will now be described with reference to the enlarged view of FIG. 30 illustrating the drain electrode 630. The source opening 626A and the drain opening 626B may be collectively referred to as the openings 626C.

As shown in FIG. 30, the specified electrode 640 includes a contact 641 that contacts the electron supply layer 618 through the opening 626C extending through the insulation layer 626. The contact 641 includes a conductive layer 642, contacting the electron supply layer 618, and a metal layer 643, formed on the conductive layer 642.

The conductive layer 642 covers the bottom wall and the side wall of the opening 626C. The bottom wall of the opening 626C is formed by the electron supply layer 618. The side wall of the opening 626C is formed by the insulation layer 626. The conductive layer 642 includes a bottom portion 642A contacting the electron supply layer 618 in the opening 626C and a side portion 642B rising from the bottom portion 642A and contacting the side wall of the opening 626C.

The metal layer 643 fills a region in the opening 626C defined by the bottom portion 642A and the side portion 642B of the conductive layer 642. As shown in the cross-sectional view of FIG. 30, the metal layer 643 is, for example, post-shaped and extends in the thickness direction (Z-direction). The metal layer 643 is a buried plug that is buried in the opening 626C of the insulation layer 626. Part of the metal layer 643 is located in the opening 626C. Thus, in the sixth embodiment, part of the metal layer 643 is located toward the electron supply layer 618 (downward) from the surface 626S of the insulation layer 626.

The metal layer 643 is formed from a material containing tungsten (W). The metal layer 643 may contain a component other than tungsten. One example of the metal layer 643 is a chemical vapor deposition layer containing tungsten.

The conductive layer 642 is a multilayer structure including a contact layer 644, a diffusion layer 645, and a protective layer 646 arranged in order from the bottom wall and side wall of the opening 626C.

The contact layer 644 contacts and covers an exposed portion 618A that is exposed from the electron supply layer 618 to the opening 626C at the bottom portion 642A of the conductive layer 642. Further, the contact layer 644 contacts and covers a side wall of the opening 626C at the side portion 642B of the conductive layer 642. Thus, the contact layer 644 includes a contact bottom portion 644A, in the bottom portion 642A of the conductive layer 642, and a contact side portion 644B, in the side portion 642B of the conductive layer 642. The contact layer 644 entirely covers the side wall of the opening 626C.

The contact layer 644 is formed from a material containing a metal that produces a reducing reaction. The metal that produces a reducing reaction is at least one metal selected from titanium (Ti) and tantalum (Ta). In one example, the contact layer 644 is a titanium layer containing titanium. The contact layer 644 may contain a component other than titanium and tantalum.

When forming the opening 626C, surface oxidation may produce oxidized material on the exposed portion 618A of the electron supply layer 618 that is exposed to the opening 626C and contacts the contact layer 644. The oxidized material will become a resistance source between the electrode formed in the opening 626C and the electron supply layer 618. In the sixth embodiment, the contact layer 644, which contacts the exposed portion 618A of the electron supply layer 618, contains titanium or tantalum. The reduction reaction of such a metal will reduce the oxidized material in the exposed portion 618A. This will eliminate or reduce the oxidized material, which will be a resistance source, between the specified electrode 640, formed in the opening 626C, and the electron supply layer 618.

The thickness T11 of the contact bottom portion 644A of the contact layer 644 is, for example, 10 nm or greater and 100 nm or less. The thickness T11 of the contact bottom portion 644A is, for example, the dimension in the Z-direction. The thickness of the contact side portion 644B of the contact layer 644 may be the same as the thickness T11 of the contact bottom portion 644A, greater than the thickness T11 of the contact bottom portion 644A, or less than the thickness T11 of the contact bottom portion 644A. As will be described in detail later, it is preferred that the contact layer 644 between the diffusion layer 645 and the electron supply layer 618 be thin to efficiently diffuse the diffused metal in the diffusion layer 645 to the electron supply layer 618.

The diffusion layer 645, which is formed on the contact layer 644 at the bottom portion 642A and the side portion 642B of the conductive layer 642, covers the upper surface of the contact layer 644. The upper surface of the contact layer 644 includes the surface of the contact bottom portion 644A that is opposite the electron supply layer 618 and the surface of the contact side portion 644B that is opposite the surface contacting the side wall of the opening 626C. Thus, the diffusion layer 645 includes a diffusion bottom portion 645A, in the bottom portion 642A of the conductive layer 642, and a diffusion side portion 645B, in the side portion 642B of the conductive layer 642.

The diffusion layer 645 is formed from a material containing a diffused metal. The diffused metal is a metal contained in the electron supply layer 618, more specifically, a metal having a locally high concentration in the high-concentration region HA. The high-concentration region HA of the electron supply layer 618 is formed by diffusing some of the diffused metal in the diffusion layer 645 through the contact layer 644 to the electron supply layer 618. At least some of the diffused metal in the high-concentration region HA of the electron supply layer 618 is derived from the diffusion layer 645. Thus, the diffusion layer 645 forms the high-concentration region HA in the electron supply layer 618 at the part contacting and surrounding the contact 641 of the specified electrode 640.

The diffusion layer 645 may contain a single diffused metal or an alloy of a diffused metal and another metal. The diffused metal is, for example, aluminum. When aluminum is the diffused metal, an alloy of the diffused metal and another metal in the diffusion layer 645 will be, for example, AlCu, AlTi, AlTiCu, AlTa, and AlTaCu.

In addition to a single diffused metal or an alloy of a diffused metal and another metal, the diffusion layer 645 may contain a further component. For example, the diffusion layer 645 may contain titanium or tantalum. The diffusion layer 645 may contain titanium or tantalum diffused from the contact layer 644 to the diffusion layer 645. When the material composing the diffusion layer 645 is an alloy of titanium and a diffused metal such as AlTi or AlTiCu, the diffusion of titanium from the contact layer 644 to the diffusion layer 645 is limited. In the same manner, when the material composing the diffusion layer 645 is an alloy of tantalum and a diffused metal such as AlTa or AlTaCu, the diffusion of tantalum from the contact layer 644 to the diffusion layer 645 is limited. Titanium or tantalum, which is the metal in the contact layer 644, may be referred to as the specified metal.

The thickness T12 of the diffusion bottom portion 645A of the diffusion layer 645 is, for example, 100 nm or less. Further, the thickness T12 of the diffusion bottom portion 645A is, for example, 10 nm or greater. The thickness T12 of the diffusion bottom portion 645A is, for example, the dimension in the Z-direction. The thickness of the diffusion side portion 645B of the diffusion layer 645 may be the same as the thickness T12 of the diffusion bottom portion 645A, greater than the thickness T12 of the diffusion bottom portion 645A, or less than the thickness T12 of the diffusion bottom portion 645A.

The protective layer 646 is located between the diffusion layer 645 and the metal layer 643. The protective layer 646, which is formed on the diffusion layer 645 at the bottom portion 642A and the side portion 642B of the conductive layer 642, covers the upper surface of the diffusion layer 645. The upper surface of the diffusion layer 645 includes the surface of the diffusion bottom portion 645A that is opposite the surface contacting the contact bottom portion 644A and the surface of the diffusion side portion 645B that is opposite the surface contacting the contact side portion 644B. Thus, the protective layer 646 includes a protective bottom portion 646A, in the bottom portion 642A of the conductive layer 642, and a protective side portion 646B, in the side portion 642B of the conductive layer 642. The protective bottom portion 646A is located between the diffusion layer 645 (diffusion bottom portion 645A) and the metal layer 643 at the bottom portion 642A of the conductive layer 642. The protective side portion 646B is located between the diffusion layer 645 (diffusion side portion 645B) and the metal layer 643 at the side portion 642B of the conductive layer 642. The protective layer 646 limits alteration of the part of the metal layer 643, which contains tungsten, contacting the diffusion layer 645.

In one example, the metal layer 643, which contains tungsten, contacts the diffusion layer 645 that includes aluminum. In this case, when chemical vapor deposition (CVD) is performed using tungsten fluoride ($WF_6$) gas to form the metal layer 643, the aluminum of the diffusion layer 645 reacts with the tungsten fluoride gas. This produces tungsten-aluminum alloy, which is an unintended product, at the part where the formed metal layer 643 contacts the diffusion layer 645. Tungsten-aluminum alloy, which is a resistance source (alteration of metal layer 643), produced at the part of the metal layer 643 contacting the diffusion layer 645 will increase the resistance of the contact 641. In the sixth embodiment, the protective layer 646 is arranged between the diffusion layer 645 and the metal layer 643 to avoid contact between the diffusion layer 645 and the metal layer 643. This limits alteration of the metal layer 643 so that the resistance of the contact 641 will not increase.

The protective layer 646 is formed from a material containing, for example, titanium or tantalum. A material containing titanium is, for example, titanium nitride (TiN). A material containing tantalum is, for example, tantalum nitride (TaN). Instead of a material containing titanium or a material containing tantalum, the protective layer 646 may be formed from a material containing another component. For example, the protective layer 646 may contain aluminum. When the diffusion layer 645 is formed from a material containing aluminum, the protective layer 646 may contain aluminum diffused from the diffusion layer 645 to the protective layer 646. If the diffusion layer 645 is formed from a material containing aluminum, the protective layer 646 will have a lower content ratio than the diffusion layer 645.

The thickness T13 of the protective bottom portion 646A of the protective layer 646 is, for example, 30 nm or greater and 100 nm or less. The thickness T13 of the protective bottom portion 646A is, for example, the dimension in the Z-direction. The thickness of the protective side portion 646B of the protective layer 646 may be the same as the thickness T13 of the protective bottom portion 646A, greater than the thickness T13 of the protective bottom portion 646A, or less than the thickness T13 of the protective bottom portion 646A.

The specified electrode 640 includes an extension 647 on the insulation layer 626. The extension 647 is the part of the conductive layer 642 extending from the upper end of the side portion 642B of the conductive layer 642 along the surface 626S of the insulation layer 626 in a direction parallel to an XY plane. Thus, in the same manner as the conductive layer 642, the extension 647 has a multilayer structure of the contact layer 644, the diffusion layer 645, and the protective layer 646. Further, the upper surface of the metal layer 643 of the specified electrode 640 is located along the same plane (XY plane) as the upper surface of the extension 647.

Although the detailed surface structure is not illustrated, as shown in FIG. 29, in the source electrode 628, which defines the specified electrode 640, the field plate electrode 631 is formed as part of the extension 647. Thus, the extension 647 of the specified electrode 640, which forms the source electrode 628, includes the field plate electrode 631 extending from the source opening 626A to a location closer to the drain opening 626B than the gate electrode 624 in plan view.

Manufacturing Steps of Specific Electrode

The method for manufacturing the nitride semiconductor device 610 of FIG. 29 includes manufacturing steps of the specified electrode 640. One example of the manufacturing steps of the specified electrode 640 will now be described. FIGS. 31 to 39 are schematic cross-sectional views illustrating exemplary manufacturing steps of the specified electrode 640. To facilitate understanding, in FIGS. 31 to 39, same reference characters are given to those elements that are the same as the corresponding elements shown in FIGS. 29 and 30.

Figure 31:
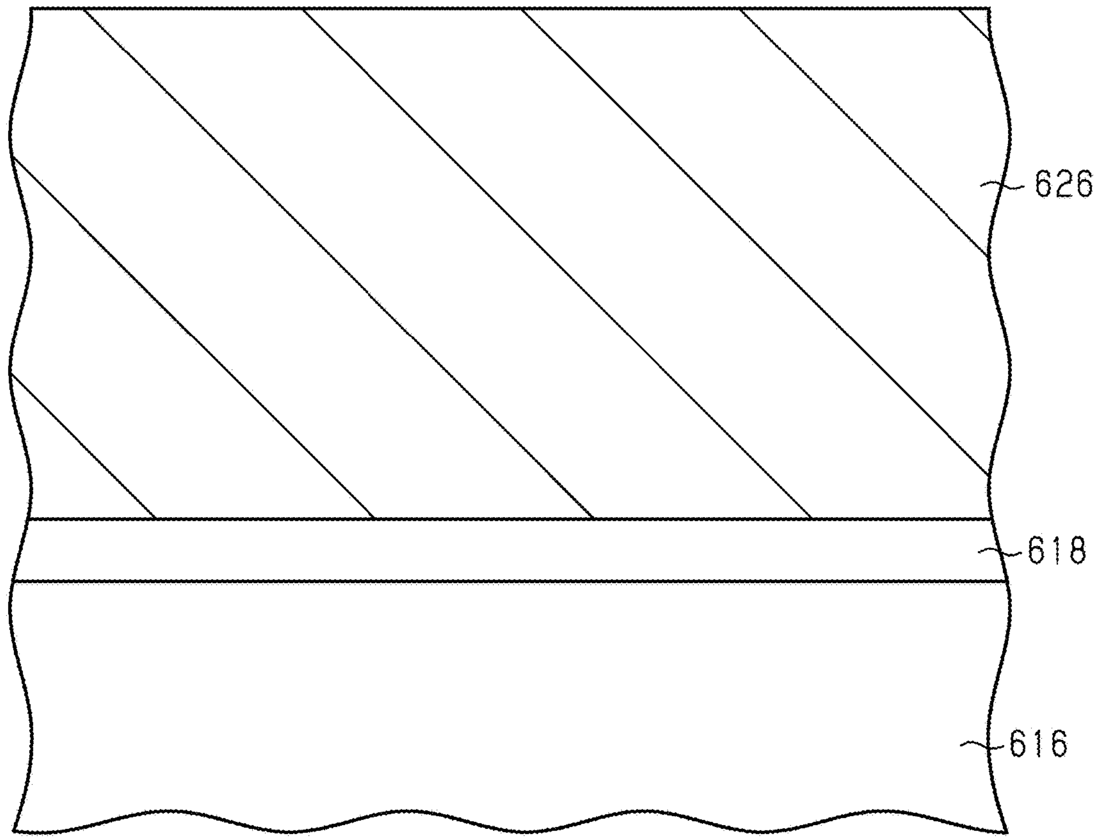
FIG. 31 is a schematic cross-sectional view exemplifying a manufacturing step of the nitride semiconductor device illustrated in FIG. 29.

As shown in FIG. 31, the manufacturing steps of the specified electrode 640 include sequentially forming the buffer layer 614, the electron transit layer 616, the electron supply layer 618, and the insulation layer 626 on the semiconductor substrate 612, which is, for example, a Si substrate. FIG. 31 does not show the semiconductor substrate 612 and the buffer layer 614. The buffer layer 614, the electron transit layer 616, and the electron supply layer 618 undergo epitaxial growth through a metal organic chemical vapor deposition (MOCVD) process.

Although not illustrated in detail, in one example, the buffer layer 614 is multilayered and includes an AlN layer (first buffer layer), formed on the semiconductor substrate 612, and a graded AlGaN layer (second buffer layer) formed on the AlN layer. The graded AlGaN layer may be formed by stacking three AlGaN layers respectively having Al compositions of 75%, 50%, and 25% from the side closer to the AlN layer.

The electron transit layer 616 is formed on the buffer layer 614. In one example, the electron transit layer 616 is a GaN layer. Thus, the electron transit layer 616 is formed on the semiconductor substrate 612 with the buffer layer 614 located in between. Then, the electron supply layer 618 is formed on the electron transit layer 616. In one example, the electron supply layer 618 is an AlGaN layer.

The electron supply layer 618 is formed on the insulation layer 626. In one example, the insulation layer 626 is a SiN layer formed through low-pressure chemical vapor deposition (LPCVD).

Figure 32:
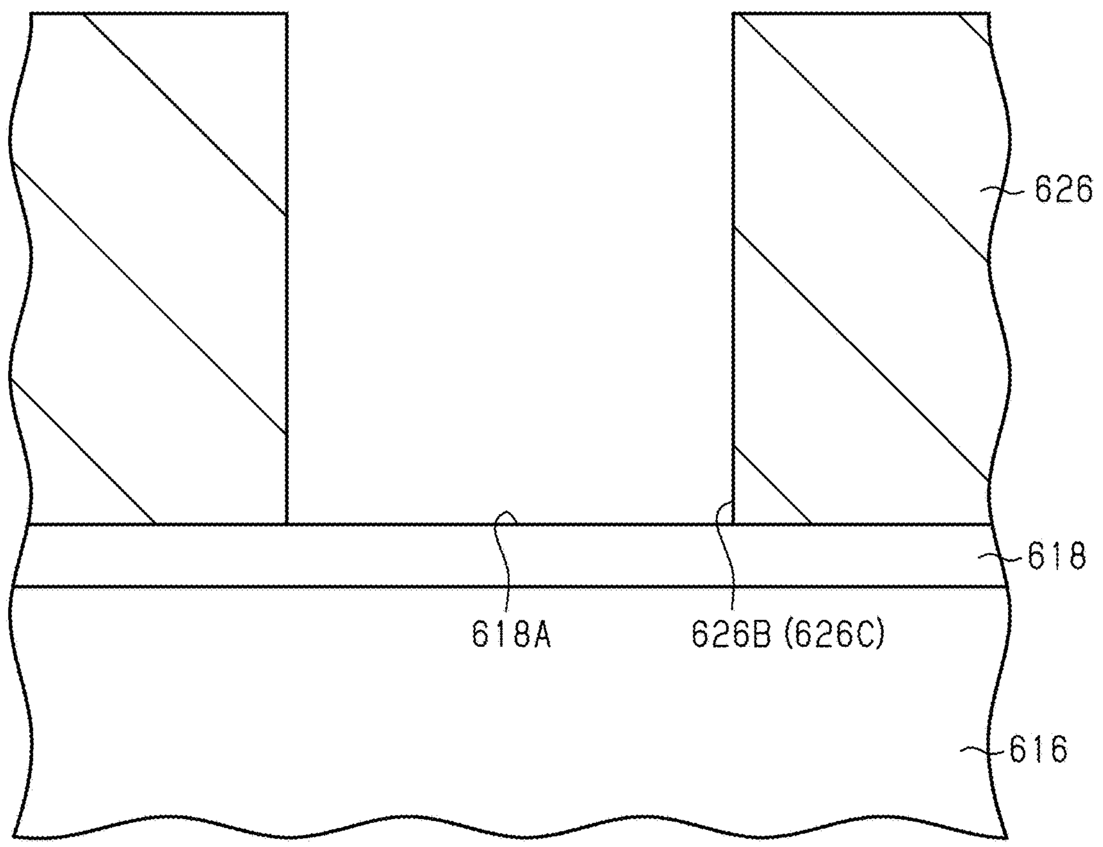
FIG. 32 is a schematic cross-sectional view illustrating a manufacturing step following the step of FIG. 31.

FIG. 32 is a schematic cross-sectional view illustrating a manufacturing step following the step of FIG. 31. As shown in FIG. 32, the insulation layer 626 is selectively removed through lithography and etching. This forms the openings 626C (source opening 626A and drain opening 626B) in the insulation layer 626. The openings 626C expose parts of the upper surface of the electron supply layer 618 (exposed portions 618A).

Figure 33:
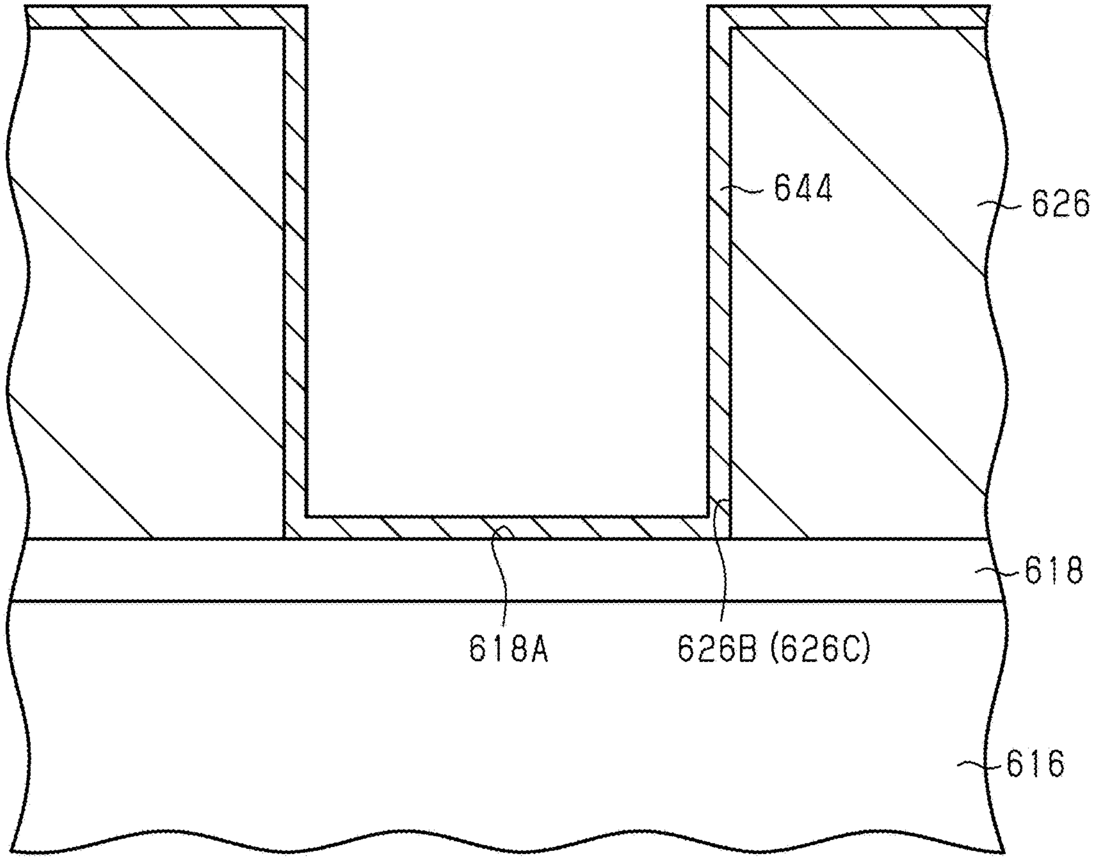
FIG. 33 is a schematic cross-sectional view illustrating a manufacturing step following the step of FIG. 32.
Figure 34:
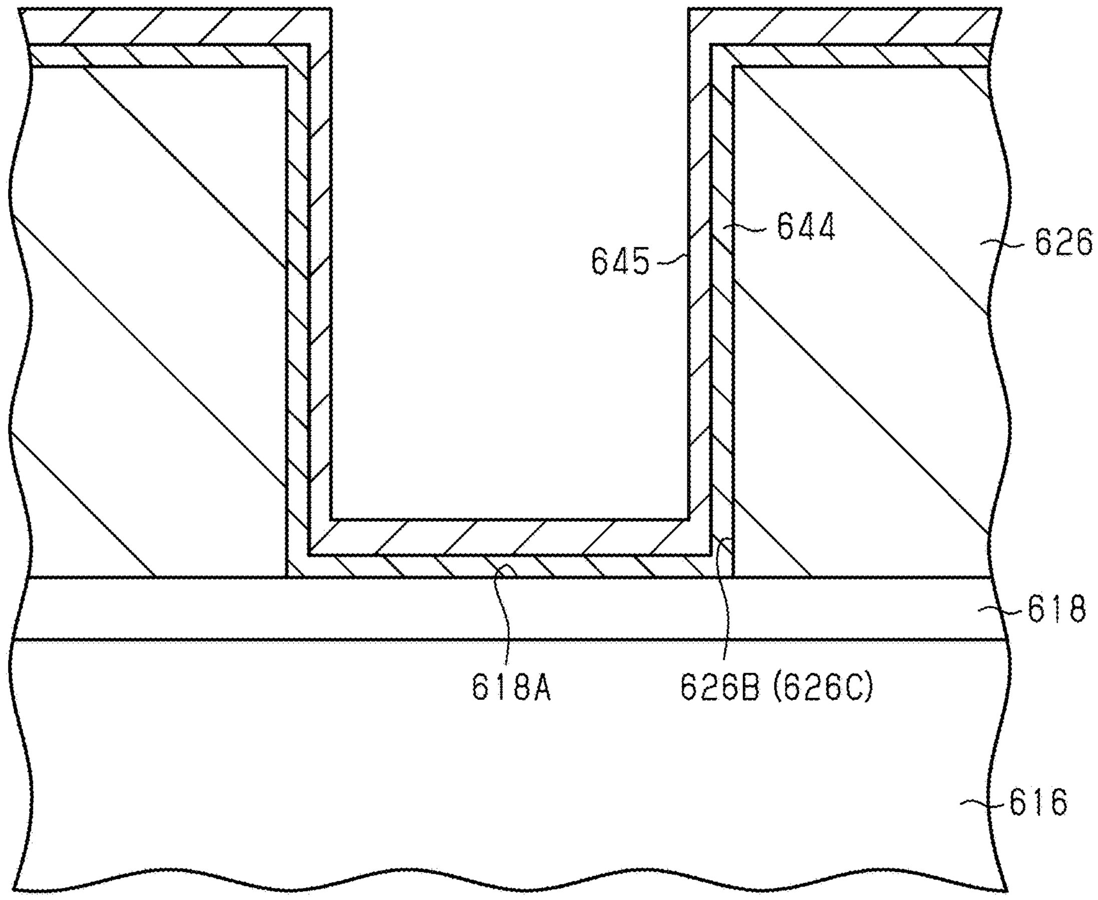
FIG. 34 is a schematic cross-sectional view illustrating a manufacturing step following the step of FIG. 33.
Figure 35:
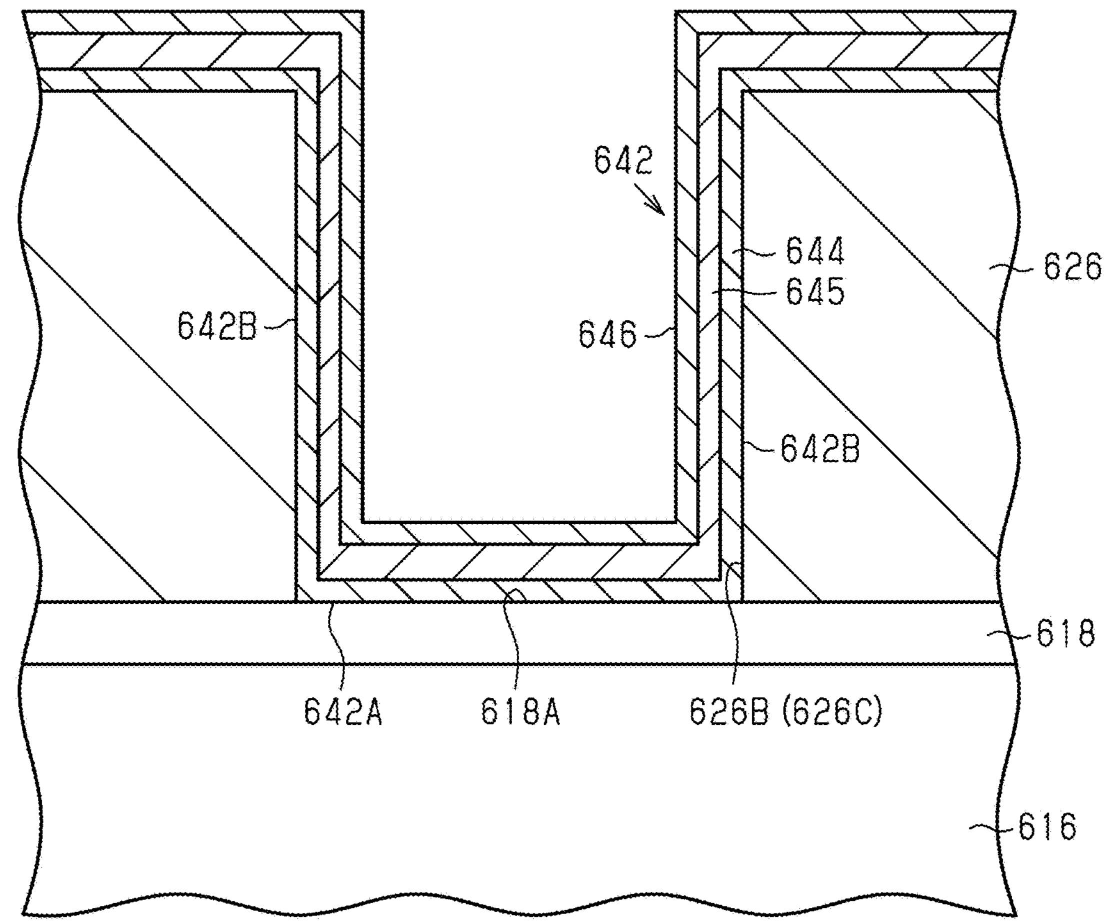
FIG. 35 is a schematic cross-sectional view illustrating a manufacturing step following the step of FIG. 34.

FIGS. 33 to 35 are schematic cross-sectional views illustrating manufacturing steps following the step of FIG. 32. As shown in FIG. 33, the contact layer 644 is formed covering the upper surface of the insulation layer 626, the exposed portion 618A of the electron supply layer 618 exposed by the opening 626C, and the entire side wall of the opening 626C. In one example, the contact layer 644 is a titanium layer formed through a sputtering process. As shown in FIG. 34, the diffusion layer 645 is then formed covering the entire surface of the contact layer 644. In one example, the diffusion layer 645 is an AlCu layer formed through a sputtering process. As shown in FIG. 35, the protective layer 646 is then formed covering the entire surface of the diffusion layer 645. In one example, the protective layer 646 is a TiN layer formed through a sputtering process. The conductive layer 642 is formed on the surfaces defining the openings 626C and the upper surface of the insulation layer 626 through the steps described above.

Figure 36:
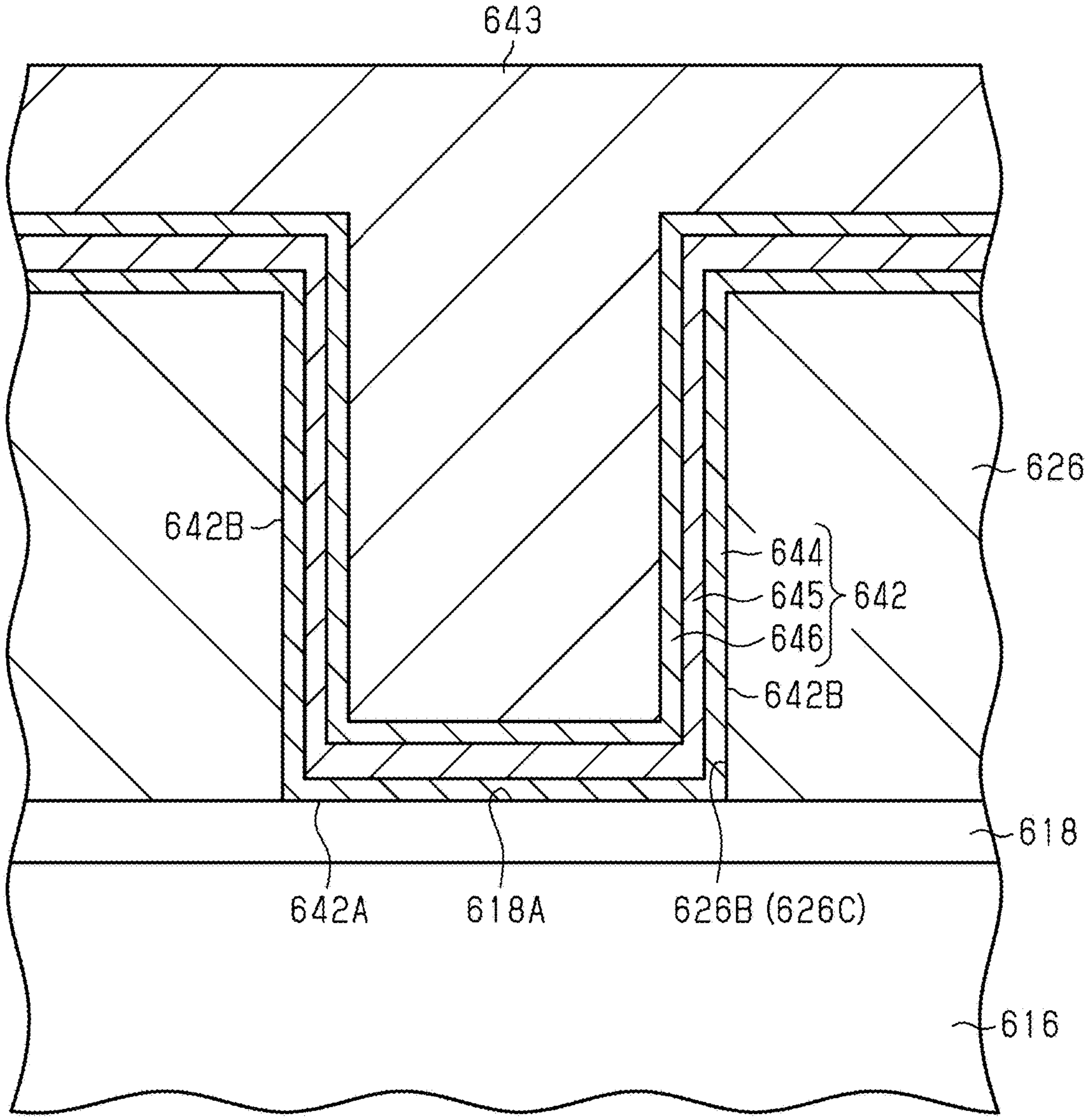
FIG. 36 is a schematic cross-sectional view illustrating a manufacturing step following the step of FIG. 35.
Figure 37:
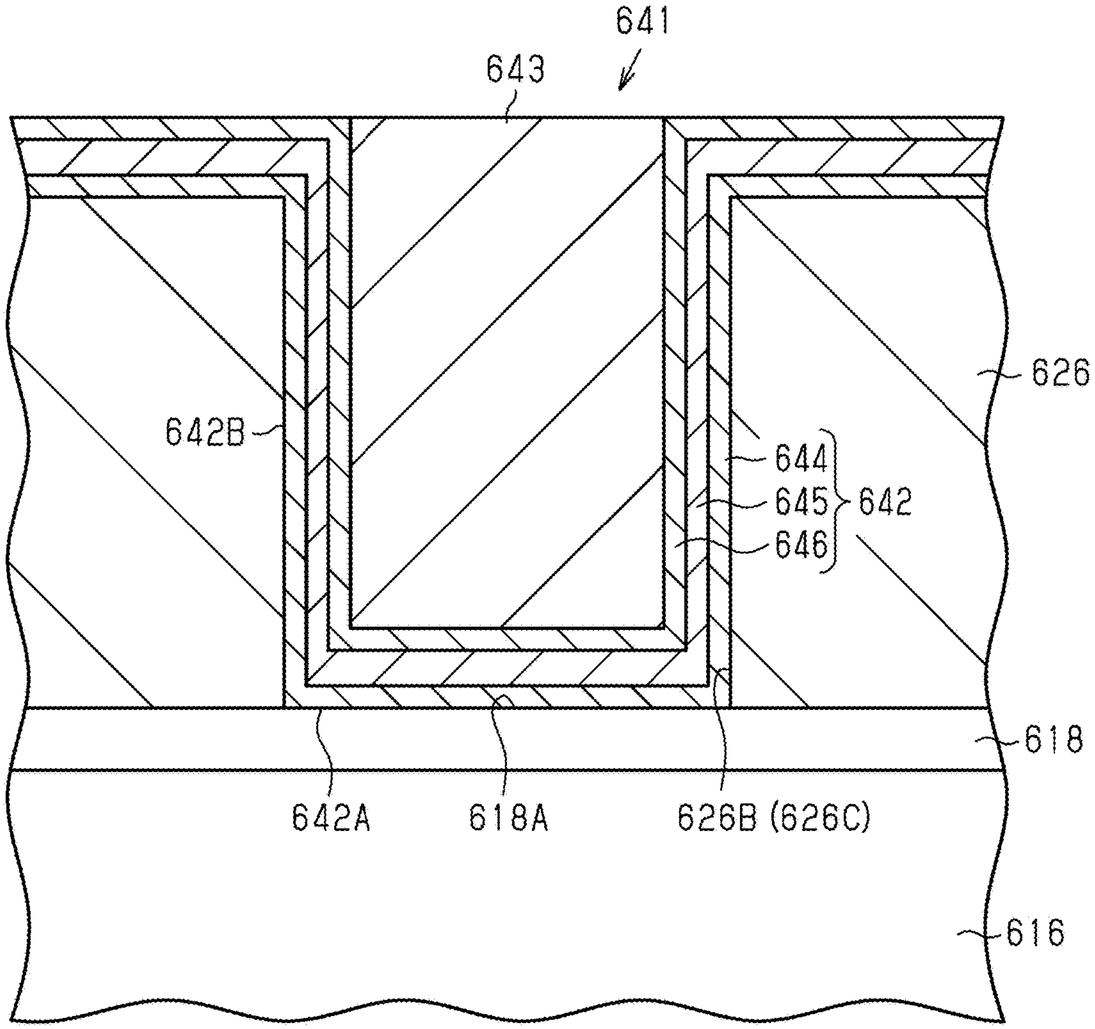
FIG. 37 is a schematic cross-sectional view illustrating a manufacturing step following the step of FIG. 36.

FIGS. 36 and 37 are schematic cross-sectional views illustrating manufacturing steps following the step of FIG. 35. As shown in FIG. 36, the region of the opening 626C defined by the bottom portion 642A and the side portion 642B of the conductive layer 642 is filled with the metal layer 643 that covers the entire upper surface of the conductive layer 642, which is formed on the upper surface of the insulation layer 626. In one example, the metal layer 643 is a tungsten layer formed through CVD using tungsten fluoride ($WF_6$) gas. Then, as shown in FIG. 37, for example, chemical mechanical polishing (CMP) is performed to polish and flatten the metal layer 643 in order to expose the conductive layer 642, which is formed on the upper surface of the insulation layer 626 The contact 641 of the metal layer 643 of the specified electrode 640 is formed through the steps described above.

Figure 38:
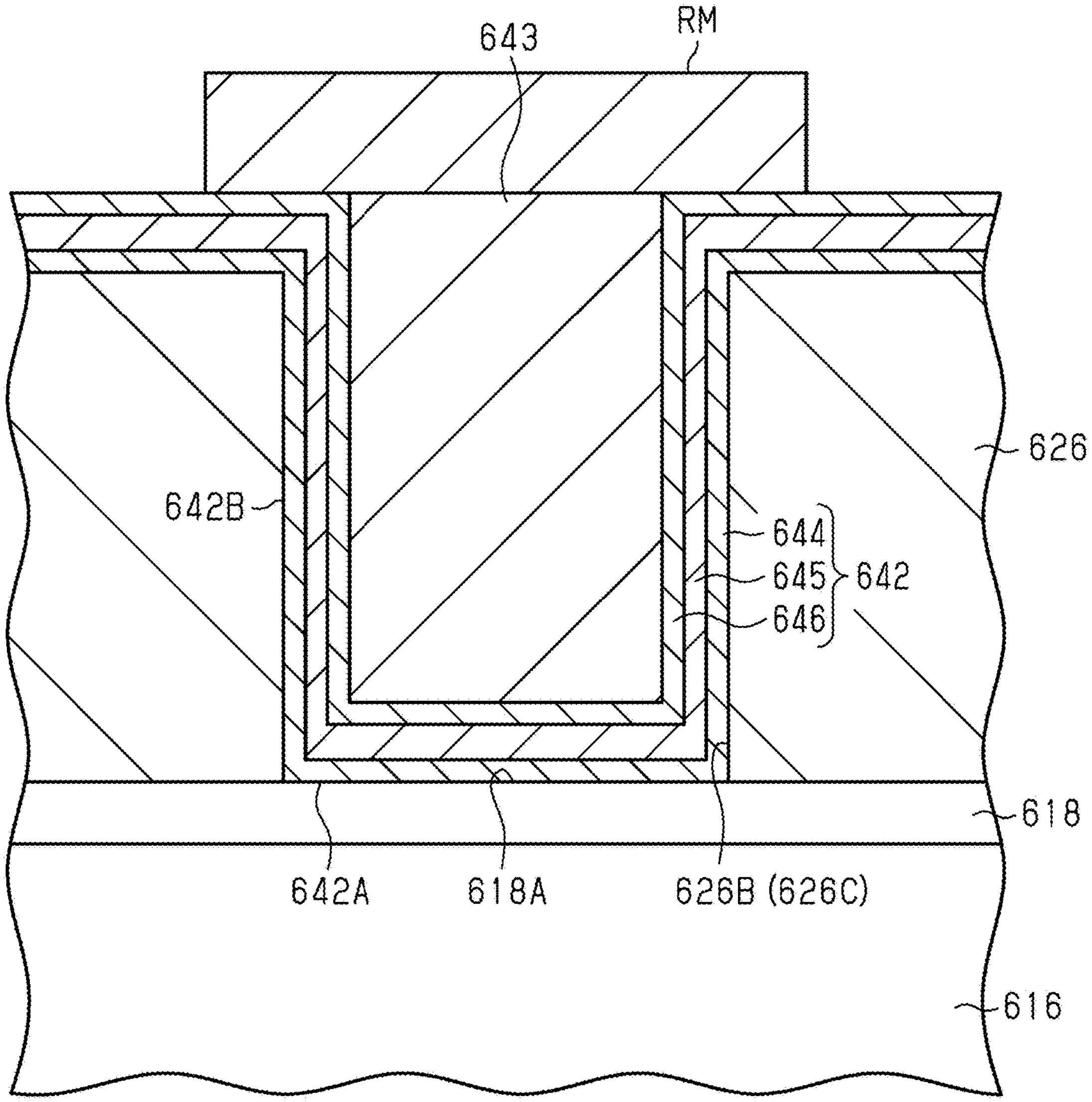
FIG. 38 is a schematic cross-sectional view illustrating a manufacturing step following the step of FIG. 37.
Figure 39:
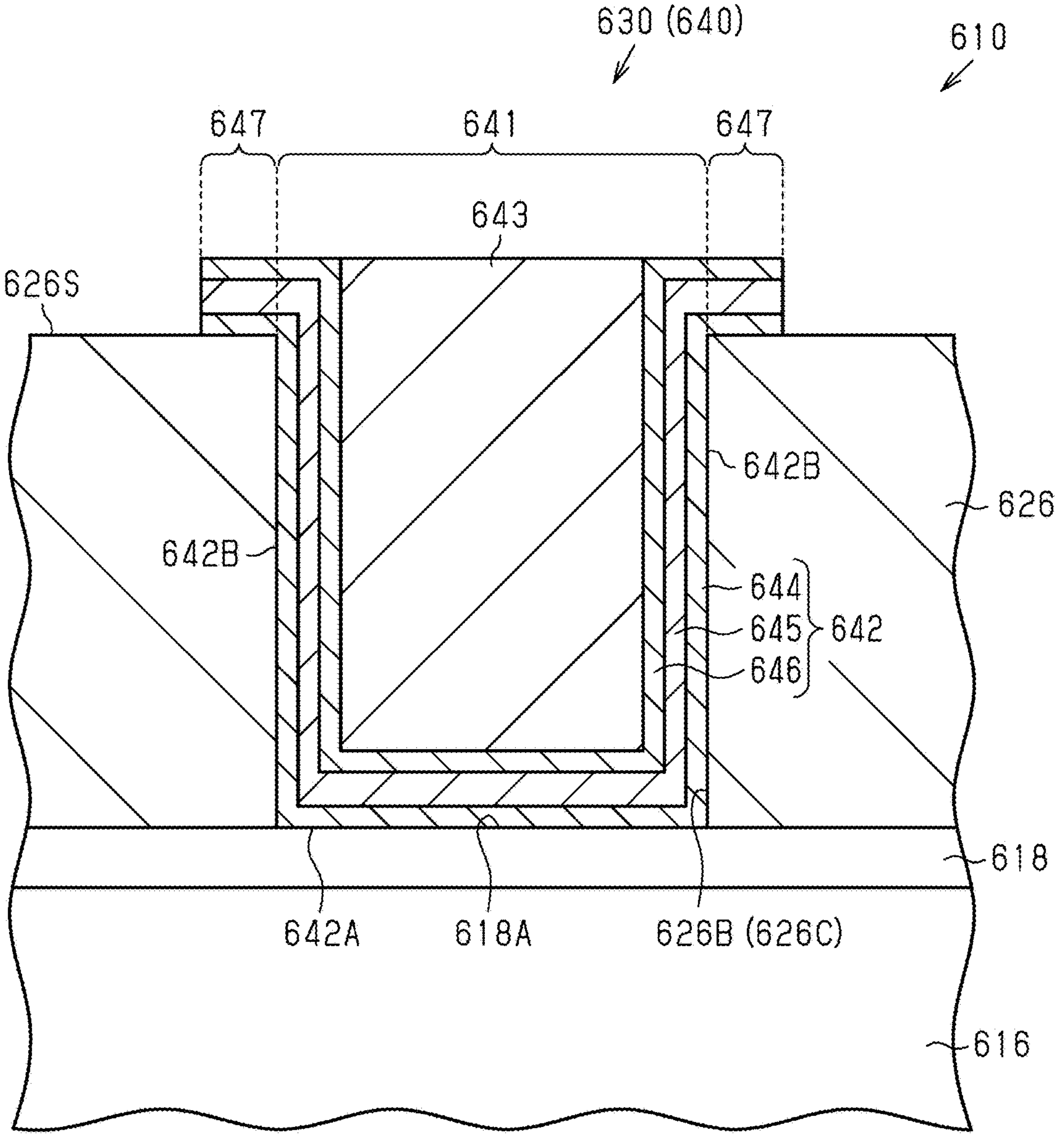
FIG. 39 is a schematic cross-sectional view illustrating a manufacturing step following the step of FIG. 38.

FIGS. 38 and 39 are schematic cross-sectional views illustrating manufacturing steps following the step of FIG. 37. As shown in FIGS. 38 and 39, the conductive layer 642, formed on the insulation layer 626, is selectively removed through lithography and etching. In further detail, as shown in FIG. 38, a resist mask RM is formed around the opening 626C (part that will become extension 647) on the metal layer 643 and the insulation layer 626. As shown in FIG. 39, the part of the conductive layer 642 outside the resist mask RM is removed. Then, the resist mask RM is removed. This forms the specified electrode 640 that includes the contact 641 and the extension 647.

Operation

The operation of the nitride semiconductor device 610 in accordance with the sixth embodiment will now be described.

The nitride semiconductor device 610 includes the electron transit layer 616, the electron supply layer 618 formed on the electron transit layer 616, the insulation layer 626 formed on the electron supply layer 618, and the specified electrode 640. The specified electrode 640 includes the contact 641 extending contacting the electron supply layer 618 through the opening 626C, which extends through the insulation layer 626. The contact 641 includes the conductive layer 642, which contacts the electron supply layer 618, and the metal layer 643, which is formed on the conductive layer 642.

The conductive layer 642 includes the contact layer 644, which contacts and covers the exposed portion 618A exposed by the opening 626C in the electron supply layer 618, and the diffusion layer 645, which includes a diffused metal and is formed on the contact layer 644.

The contact layer 644 contains at least one selected from titanium and tantalum that are metals producing a reducing reaction. In this case, the reducing reaction of the metal contained in the contact layer 644 eliminates or reduces oxidized material, which will be a resistance source, on the exposed portion 618A of the electron supply layer 618 exposed by the opening 626C. This will decrease resistance at the part where the electron supply layer 618 contacts the specified electrode 640.

The diffusion layer 645 contains diffused metal. In this case, some of the diffused metal in the diffusion layer 645 is passed through the contact layer 644 and diffused to the electron supply layer 618. This forms the high-concentration region HA, where the concentration of the diffused metal is locally high, in the electron supply layer 618 within a range overlapping the opening 626C in plan view. The part of the electron supply layer 618 other than the high-concentration region HA is the low-concentration region LA where the concentration of the diffused metal is relatively low. The formation of the high-concentration region HA within the above-described range of the electron supply layer 618 improves conductivity in the part of the electron supply layer 618 contacting the specified electrode 640, that is, the exposed portion 618A exposed by the opening 626C and the surrounding part.

Accordingly, the above structure decreases the resistance where the electron supply layer 618 contacts the specified electrode 640 and improves conductivity at the part where the electron supply layer 618 contacts the specified electrode 640. This allows the specified electrode 640 to be in ohmic contact with the 2DEG 620 of the electron transit layer 616 in a preferred manner through the surface of the electron supply layer 618 that contacts the specified electrode 640 and the part of the electron supply layer 618 where the concentration of the diffused metal is high (high-concentration region HA). As a result, the contact resistance is reduced between the specified electrode 640 and the 2DEG 620.

Advantages

The nitride semiconductor device 610 of the sixth embodiment has the advantages described below.

(6-1) The nitride semiconductor device 610 includes the electron transit layer 616, the electron supply layer 618 formed on the electron transit layer 616, the insulation layer 626 formed on the electron supply layer 618, and the specified electrode 640 including the contact 641 that contacts the electron supply layer 618 through the opening 626C, which extends through the insulation layer 626. The contact 641 includes the conductive layer 642 that contacts the electron supply layer 618. The conductive layer 642, which contains at least one selected from titanium and tantalum, includes the contact layer 644, which contacts and covers the exposed portion 618A of the electron supply layer 618 exposed through the opening 626C, and the diffusion layer 645, which contains diffused metal and is formed on the contact layer 644. The diffused metal is the metal contained in the electron supply layer 618.

In this structure, the diffused metal of the diffusion layer 645 is diffused through the contact layer 644 to the part of the electron supply layer 618 overlapping the opening 626C. This increases the concentration of the diffused metal at this part. Thus, the contact resistance is decreased between the contact 641 and the electron supply layer 618, and the specified electrode 640 is in ohmic contact with the 2DEG 620 of the electron transit layer 616 in a preferred manner. As a result, contact resistance is reduced between the specified electrode 640 and the 2DEG 620.

(6-2) The contact 641 includes the metal layer 643 formed on the conductive layer 642 and containing tungsten. The conductive layer 642 includes the protective layer 646 located between the diffusion layer 645 and the metal layer 643 and containing at least one selected from titanium and tantalum. This structure avoids increases in the resistance of the specified electrode 640 caused by the alloy, produced in the metal layer 643, of tungsten and the component contained in the diffusion layer 645.

(6-3) The diffusion layer 645 contains aluminum. The protective layer 646 has a lower content ratio of aluminum than the diffusion layer 645. With this structure, when forming the metal layer 643 that contains tungsten, CVD is performed using tungsten fluoride ($WF_6$) gas thereby limiting the formation of a tungsten-aluminum alloy. This avoids an increase in the resistance of the specified electrode 640 caused by the tungsten-aluminum alloy produced in the metal layer 643.

(6-4) The conductive layer 642 includes the bottom portion 642A, which contacts the electron supply layer 618, and the side portion 642B, which rises from the bottom portion 642A and contacts the side wall of the opening 626C. The metal layer 643 fills a region in the opening 626C defined by the bottom portion 642A and the side portion 642B of the conductive layer 642. This structure reduces the contact resistance between the embedded-type specified electrode 640 and the 2DEG 620 of the electron transit layer 616.

(6-5) The thickness of the diffusion layer 645 is 100 nm or less.

The titanium or tantalum contained in the contact layer 644 can be diffused through the diffusion layer 645 that contacts the contact layer 644. When the specified metal (titanium, tantalum) contained in the contact layer 644 is over-diffused out of the contact layer 644, voids will form in the contact layer 644. The voids formed in the contact layer 644 will decrease the density of the contact layer 644. This will increase the resistance of the contact layer 644. In this structure, the diffusion layer 645 is thin to narrow the diffusing range of the specified metal contained in the contact layer 644. This avoids an increase in the resistance of the contact layer 644 that would be caused by over-diffusion of the specified metal contained in the contact layer 644 out of the contact layer 644.

(6-6) The diffusion layer 645 contains titanium or tantalum that is the specified metal contained in the contact layer 644. With this structure, the specified metal is also contained in the diffusion layer 645 thereby limiting the specified metal in the contact layer 644 that is diffused to the diffusion layer 645. This avoids an increase in the resistance of the contact layer 644 that would be caused by over-diffusion of the specified metal contained in the contact layer 644 out of the contact layer 644.

(6-7) The specified electrode 640 includes the extension 647 on the insulation layer 626. The extension 647 includes the conductive layer 642 formed continuously from the contact 641. This structure allows the extension 647, which has the same potential as the specified electrode 640, to be formed in a simple manner.

(6-8) The openings 626C include the source opening 626A and the drain opening 626B that are separated from each other. The nitride semiconductor device 610 includes the gate electrode 624, which is located between the source opening 626A and the drain opening 626B and covered by the insulation layer 626, the source electrode 628, which contacts the electron supply layer 618 through the source opening 626A, and the drain electrode 630, which contacts the electron supply layer 618 through the drain opening 626B. Each of the source electrode 628 and the drain electrode 630 is the specified electrode 640. This structure reduces contact resistance of the drain electrode 630 and the source electrode 628 with the 2DEG 620.

(6-9) The extension 647 of the source electrode 628, which is the specified electrode 640, includes the field plate electrode 631 extending from the source opening 626A to a location closer to the drain opening 626B than the gate electrode 624 in plan view. With this structure, the source electrode 628 is formed integrally with the field plate electrode 631 in a simple manner.

Seventh Embodiment

A nitride semiconductor device 710 in accordance with the seventh embodiment differs from the sixth embodiment in the structure of the insulation layer 626 and the specified electrode 640 (source electrode 628 and drain electrode 630). Otherwise, the structure is the same as the sixth embodiment. Elements that are the same as the corresponding elements in the sixth embodiment will not be described in detail. The description will focus on differences from the sixth embodiment.

Figure 40:
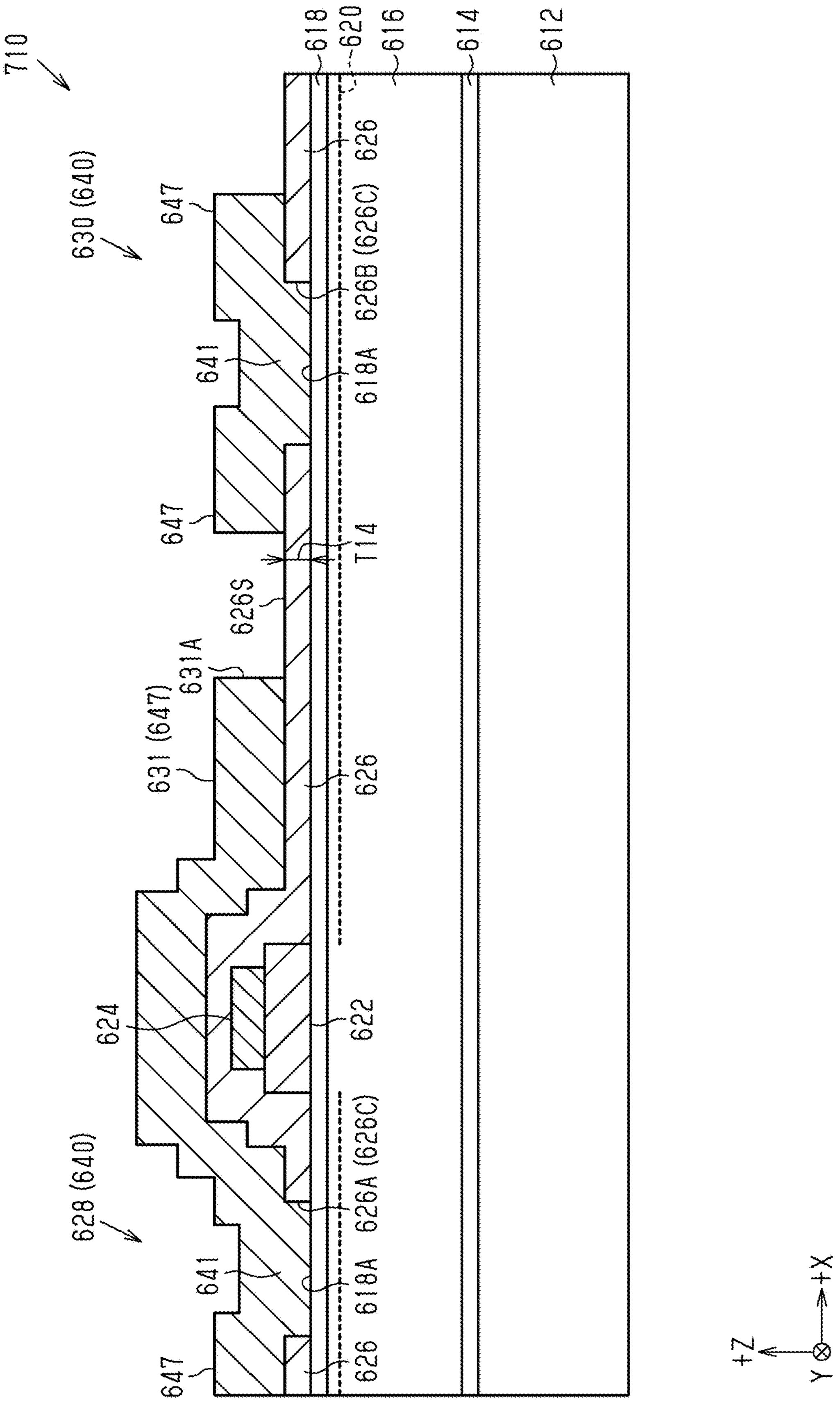
FIG. 40 is a schematic cross-sectional view exemplifying a nitride semiconductor device in accordance with a seventh embodiment.

As shown in FIG. 40, the insulation layer 626, which is a passivation layer, is formed along the surfaces of the gate layer 622 and the gate electrode 624 and thus has an uneven surface 626S. The thickness T14 of the insulation layer 626 is, for example, 200 nm or less. The thickness T14 of the insulation layer 626 may be, for example, the thickness of the part contacting the electron supply layer 618 or the thickness of the part contacting the upper surface of the gate electrode 624. Further, the field plate electrode 631 is formed along the uneven surface 626S of the insulation layer 626. Thus, the field plate electrode 631 also has an uneven surface.

The specified electrode 640 of the seventh embodiment will now be described with reference to FIG. 41 that shows the drain electrode 630.

Figure 41:
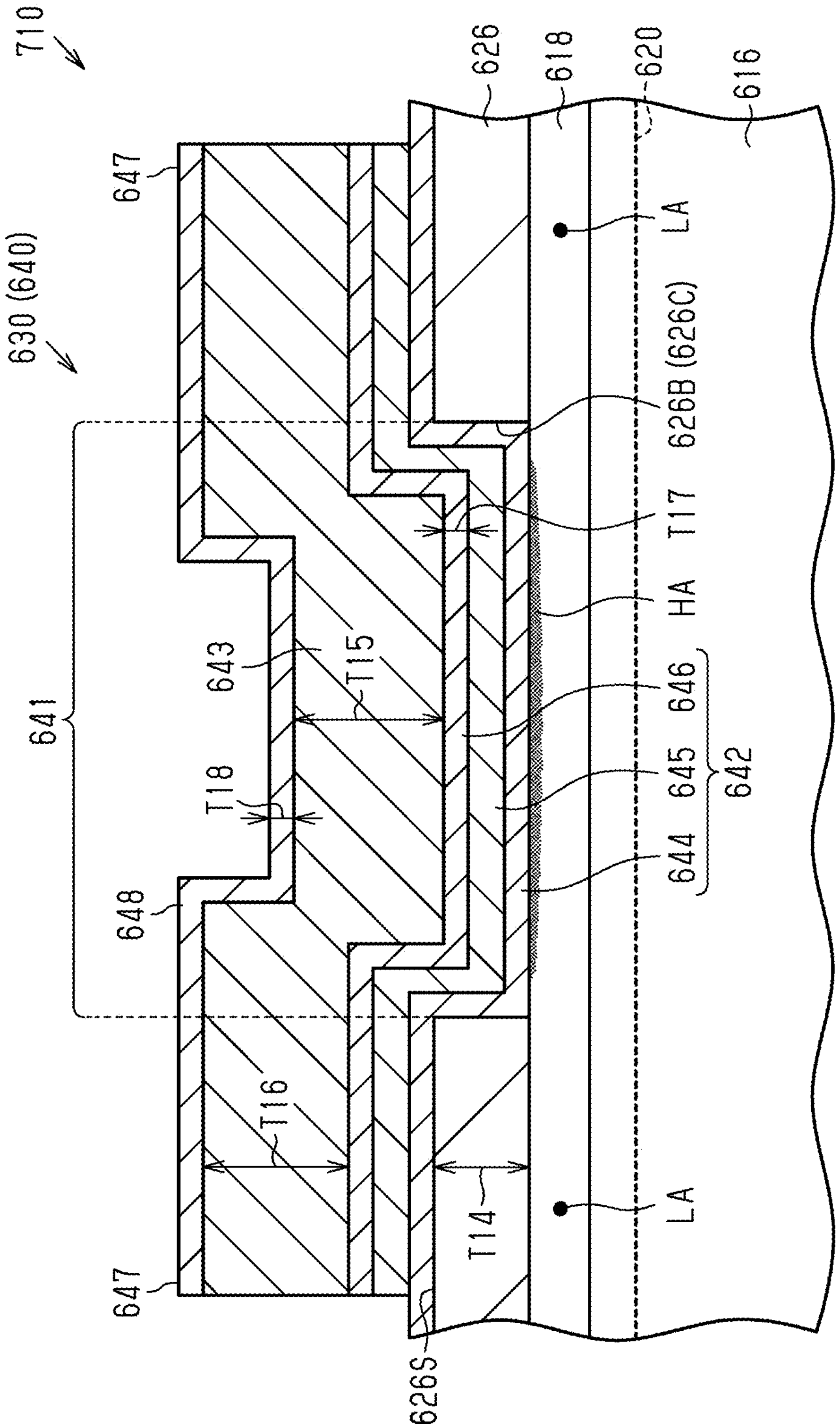
FIG. 41 is an enlarged cross-sectional view of FIG. 40 showing a drain electrode.

As shown in FIG. 41, the specified electrode 640 includes the contact 641, which contacts the electron supply layer 618 through the opening 626C extending through the insulation layer 626, and the extension 647, which is arranged on the insulation layer 626.

The contact 641 and the extension 647 of the specified electrode 640 include the conductive layer 642 and the metal layer 643 formed on the conductive layer 642.

In the contact 641, the conductive layer 642 contacts the electron supply layer exposed at the bottom of the opening 626C and the side wall of the opening 626C. The extension 647 of the conductive layer 642 contacts the surface 626S of the insulation layer 626. The conductive layer 642 is a multilayered structure in which the contact layer 644, the diffusion layer 645, and the protective layer 646 are sequentially arranged from the bottom and the side wall of the opening 626C in the contact 641 and from the surface 626S of the insulation layer 626 in the extension 647.

The metal layer 643 of the seventh embodiment is formed from a material that allows for diffusion of the specified metal contained in the contact layer 644. The specified metal contained in the contact layer 644 is titanium or tantalum. The material allowing for diffusion of the specified metal is, for example, aluminum or an alloy of aluminum and another metal. The alloy of aluminum and another metal is, for example, AlCu, AlTi, AlTiCu, AlTa, or AlTaCu. The metal layer 643 may be formed from the same material as the diffusion layer 645. In one example, the metal layer 643 and the diffusion layer 645 both contain aluminum or an alloy of aluminum and another metal. Further, the metal layer 643 may be formed from a material containing titanium or tantalum that is a specified metal. The material including the specified metal is, for example, AlTi, AlTiCu, AlTa, or AlTaCu.

The metal layer 643 is formed integrally with both of the contact 641 and the extension 647. The thickness T15 of the metal layer 643 at the contact 641 is, for example, 100 nm or greater and 1000 nm or less. Further, the thickness T16 of the metal layer 643 at the extension 647 is, for example, 100 nm or greater and 1000 nm or less. In the metal layer 643, the thickness T15 and the thickness T16 may be the same or be different.

The contact layer 644 and the diffusion layer 645 in the conductive layer 642 each have the same structure as that in the sixth embodiment.

The protective layer 646 is located between the diffusion layer 645 and the metal layer 643. The arrangement of the protective layer 646 between the diffusion layer 645 and the metal layer 643 limits the diffusion of the specified metal (titanium or tantalum), which forms the contact layer 644, beyond the diffusion layer 645 to the metal layer 643. In other words, the protective layer 646 is a wall that prevents the specified metal contained in the contact layer 644 from entering the metal layer 643 through the diffusion layer 645.

When the metal layer 643 is formed from a material allowing the specified material to be diffused, the specified metal contained in the contact layer 644 may be diffused beyond the diffusion layer 645 to the metal layer 643. Over-diffusion of the specified metal contained in the contact layer 644 out of the contact layer 644 will form voids in the contact layer 644. The voids formed in the contact layer 644 will be a resistance source that increases the resistance of the contact layer 644. The arrangement of the protective layer 646 between the diffusion layer 645 and the metal layer 643 limits the diffusion of the specified metal. This reduces the formation of voids in the contact layer 644 and avoids an increase in the resistance of the contact layer 644.

The protective layer 646 is formed from a material containing, for example, the specified metal (titanium or tantalum). A material containing titanium is, for example, titanium nitride (TiN, $Ti_2N$) or TiAlCu. A material containing tantalum is, for example, tantalum nitride (TaN). When the protective layer 646 is formed from a material containing the specified metal, the diffusion of the specified metal from the contact layer 644 to the diffusion layer 645 offsets the diffusion of the specified metal from the protective layer 646 to the diffusion layer 645. This limits the diffusion of the specified metal from the contact layer 644 to the diffusion layer 645.

The thickness T17 of the protective layer 646 in the seventh embodiment is, for example, 30 nm or greater and 100 nm or less. The thickness T17 of the protective layer 646 is, for example, the Z-direction dimension of the part located on the bottom of the opening 626C.

The contact 641 and the extension 647 of the specified electrode 640 further include a surface protective layer 648 that protects the upper surface of the metal layer 643 (surface of specified electrode 640 opposite to surface contacting protective layer 646). The surface protective layer 648 is formed integrally with both of the contact 641 and the extension 647 on the metal layer 643.

The thickness T18 of the surface protective layer 648 is, for example, 10 nm or greater and 100 nm or less. The thickness T18 of the surface protective layer 648 is, for example, the thickness of the surface protective layer 648 at the contact 641.

The surface protective layer 648 is formed from a material containing titanium or tantalum. A material containing titanium is, for example, titanium nitride (TiN). A material containing tantalum is, for example, tantalum nitride (TaN). In one example, the surface protective layer 648 is formed from titanium nitride. Instead of a material containing titanium or a material containing tantalum, the surface protective layer 648 may be formed from a material containing another component.

Advantages

As described above, the nitride semiconductor device 710 of the seventh embodiment has the same advantages as the nitride semiconductor device 610 of the sixth embodiment except for advantages (6-2), (6-3) and (6-4). Additionally, the nitride semiconductor device 710 of the seventh embodiment has the advantages described below.

(7-1) The specified electrode 640 includes the protective layer 646 that contains at least one selected from titanium and tantalum. With this structure, the formation of the protective layer 646 limits the diffusion of the specified metal contained in the contact layer 644 beyond the diffusion layer 645 and to the metal layer 643. This avoids an increase in the resistance of the contact layer 644 that would be caused by over-diffusion of the specified metal contained in the contact layer 644 out of the contact layer 644.

(7-2) The metal layer 643 contains the specified metal (titanium or tantalum). With this structure, the specified metal is also contained in the metal layer 643. Thus, diffusion of the specified metal in the contact layer 644 to the diffusion layer 645 is limited. This avoids an increase in the resistance of the contact layer 644 that would be caused by over-diffusion of the specified metal contained in the contact layer 644 out of the contact layer 644.

Modified Examples

The above embodiments may be modified as described below. The modified examples described below may be combined as long as there is no technical contradiction. In the modified examples described hereafter, same reference characters are given to those components that are the same as the corresponding components of the above embodiments. Such components will not be described in detail.

In the first to fifth embodiments, the source field plate portion 32B may be omitted.

In the first to fifth embodiments, the first insulation layer 27A and the second insulation layer 27B may be formed from different materials.

The metal layer 643 of the sixth embodiment does not have to be formed from a material containing tungsten. For example, the metal layer 643 of the sixth embodiment may be formed from the material forming the metal layer 643 of the seventh embodiment, that is, the material allowing for diffusion of the specified metal. In this case, the protective layer 646 may be modified to the structure of the seventh embodiment. Further, the metal layer 643 of the sixth embodiment may be formed from a known material used for an electrode of a nitride semiconductor device.

The metal layer 643 of the seventh embodiment does not have to be formed from a material allowing the specified metal to be diffused. For example, the metal layer 643 of the seventh embodiment may be formed from the material of the metal layer 643 of the sixth embodiment, that is, material containing tungsten. In this case, the protective layer 646 may be modified to the structure of the sixth embodiment. Further, the metal layer 643 of the seventh embodiment may be formed from a known material used for an electrode of a nitride semiconductor device.

The protective layer 646 may be omitted from the specified electrode 640 in the sixth and seventh embodiments.

Figure 42:
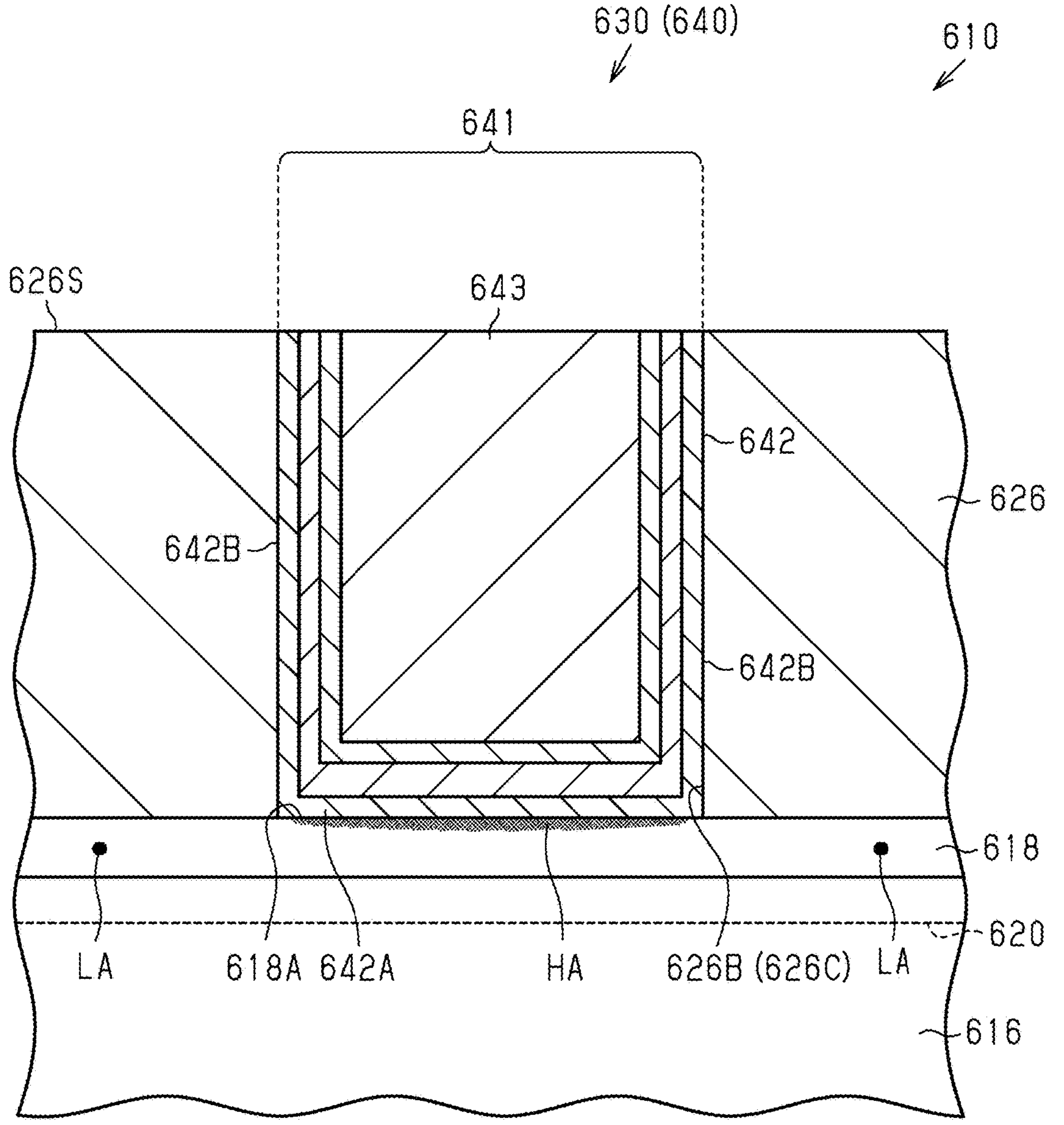
FIG. 42 is a schematic cross-sectional view exemplifying a nitride semiconductor device to illustrate a modified example of a specified electrode.

In the sixth and seventh embodiments, the extension 647 may be partially or entirely omitted from the specified electrode 640. As shown in FIG. 42, when entirely omitting the extension 647, the part of the metal layer 643 in the contact 641 projecting upward from the surface 626S of the insulation layer 626 may be omitted. That is, the upper surface of the metal layer 643 may be located on the same plane (XY plane) as the surface 626S of the insulation layer 626. Further, the side portion 642B may be omitted from the conductive layer 642 of the specified electrode 640. In this case, the metal layer 643 may be in contact with the side wall of the opening 626C.

In the sixth and seventh embodiments, the specified electrode 640 may be only one of the source electrode 628 and the drain electrode 630.

In the sixth and seventh embodiments, the nitride semiconductor devices 610 and 710 do not have to be formed by nitride semiconductor HEMTs and may be formed by nitride semiconductor diodes instead.

The above embodiment and the modified examples described below may be combined as long as there is no technical contradiction.

In this specification, the word "on" includes the meaning of "above" in addition to the meaning of "on" unless otherwise described in the context. Accordingly, the phrase of "first layer formed on second layer" may mean that the first layer is formed directly contacting the second layer in one embodiment and that the first layer is located above the second layer without contacting the second layer in another embodiment. Thus, the word "on" will also allow for a structure in which another layer is formed between the first layer and the second layer.

The Z-axis direction referred to in this specification does not necessarily have to be the vertical direction and does not necessarily have to fully coincide with the vertical direction. Accordingly, in the structures disclosed above (e.g., structure shown in FIG. 2), upward and downward in the Z-axis direction as referred to in this specification is not limited to upward and downward in the vertical direction. For example, the X-axis direction may be the vertical direction. Alternatively, the Y-axis direction may be the vertical direction.

Terms such as "first", "second", and "third" in this disclosure are used to distinguish subjects and not used for ordinal purposes.

Technical concepts that can be understood from each of the above embodiments and modified examples will now be described. Reference characters shown in parenthesis in the embodiments described below denote corresponding elements of the embodiments described above. The reference characters are given as examples to aid understanding and not intended to limit elements to the elements denoted by the reference characters.

CLAUSES

[Clause A1]

A nitride semiconductor device, including:

a substrate (12);

an electron transit layer (16) formed above the substrate (12);

an electron supply layer (18) formed on the electron transit layer (16) and having a band gap that is larger than that of the electron transit layer (16);

a gate layer (22) formed on the electron supply layer (18) and containing an acceptor impurity;

a gate electrode (24, 224) formed on the gate layer (22); and a source electrode (32) and a drain electrode (34) that are located at opposite sides of the gate layer (22) and contact the electron supply layer (18), the gate electrode (24, 224) having a greater length than the gate layer (22) in a first direction (X) in which the source electrode (32), the gate layer (22), and the drain electrode (34) are arranged, and the gate electrode (24, 224) contacting an entire upper surface of the gate layer (22) and extending from the gate layer (22) toward at least one of the source electrode (32) and the drain electrode (34).

[Clause A2]

The nitride semiconductor device according to clause A1, where the gate electrode (24, 224) includes a connecting portion (42) contacting the entire upper surface of the gate layer (22), a source-side extension (44) extending from the connecting portion (42) toward the source electrode (32), and a drain-side extension (46) extending from the connecting portion (42) toward the drain electrode (34).

[Clause A3]

The nitride semiconductor device according to clause A2, where a lower surface of the source-side extension (44) and a lower surface of the drain-side extension (46) are flush with a lower surface of the connecting portion (42).

[Clause A4]

The nitride semiconductor device according to clause A2, where a lower surface of the source-side extension (44) and a lower surface of the drain-side extension (46) are located upward from a lower surface of the connecting portion (42).

[Clause A5]

The nitride semiconductor device according to any one of clauses A2 to A4, where the source-side extension (44) and the drain-side extension (46) are equal in thickness to the connecting portion (42).

[Clause A6]

The nitride semiconductor device according to any one of clauses A2 to A5, where an upper surface of the connecting portion (42) is located closer to the gate layer (22) than upper surfaces of the source-side extension (44) and the drain-side extension (46).

[Clause A7]

The nitride semiconductor device according to any one of clauses A2 to A4, where the source-side extension (44) has a length of 10 nm or greater and 100 nm or less.

[Clause A8]

The nitride semiconductor device according to any one of clauses A2 to A6, where the source-side extension (44) has a length of 60 nm or greater and 90 nm or less.

[Clause A9]

The nitride semiconductor device according to any one of clauses A2 to A8, where the drain-side extension (46) has a length of 10 nm or greater and 100 nm or less.

[Clause A10]

The nitride semiconductor device according to any one of clauses A2 to A8, where the drain-side extension (46) has a length of 60 nm or greater and 90 nm or less.

[Clause A11]

The nitride semiconductor device according to any one of clauses A2 to A10, where the source-side extension (44) is equal in length to the drain-side extension (46).

[Clause A12]

The nitride semiconductor device according to any one of clauses A2 to A10, where the source-side extension (44) differs in length from the drain-side extension (46).

[Clause A13]

The nitride semiconductor device according to any one of clauses A1 to A12, further including a passivation layer covering the gate layer (22) and the gate electrode (24, 224).

[Clause A14]

The nitride semiconductor device according to any one of clauses A1 to A13, further including a passivation layer that includes a first insulation layer (27A) contacting a side surface of the gate layer (22) and a second insulation surface (27B) contacting a side surface and an upper surface of the gate electrode (24, 224).

[Clause A15]

The nitride semiconductor device according to clause A14, where the first insulation layer (27A) and the second insulation layer (27B) are composed of the same material.

[Clause A16]

The nitride semiconductor device according to clause A14, where the first insulation layer (27A) and the second insulation layer (27B) are composed of different materials.

[Clause A17]

The nitride semiconductor device according to any one of clauses A2 to A12, where a lower surface of the source-side extension (44) and a lower surface of the drain-side extension (46) contact an upper surface of the first insulation layer (27A).

[Clause A18]

The nitride semiconductor device according to any one of clauses A1 to A17, where the gate layer (22) includes a ridge contacting part of the gate electrode (24, 224), a source-side step that is thinner than the ridge and extends toward the source electrode (32), and a drain-side step that is thinner than the ridge and extends toward the drain electrode (34).

[Clause A19]

A method for manufacturing a nitride semiconductor device, the method including: forming a first nitride semiconductor layer (16) composed of a nitride semiconductor on a substrate (12);

- forming a second nitride semiconductor layer (18) composed of a nitride semiconductor having a larger band gap than the first nitride semiconductor layer (16) on the first nitride semiconductor layer (16);
- forming a third nitride semiconductor layer (22) composed of a nitride semiconductor containing an acceptor impurity on the second nitride semiconductor layer (18);
- forming a gate layer (22) by etching the third nitride semiconductor layer (22);
- forming a first insulation layer (27A) that contacts a side surface of the gate layer (22);
- forming a gate electrode (24, 224) on the gate layer (22);
- forming a second insulation layer (27B) that covers the gate electrode (24, 224) and the first insulation layer (27A); and
- forming a source electrode (32) and a drain electrode (34) that are located at opposite sides of the gate layer (24, 224) and contact the second nitride semiconductor layer (18),
- the gate electrode (24, 224) having a greater length than the gate layer (22) in a first direction (X) in which the source electrode (32), the gate layer (22), and the drain electrode (34) are arranged, and
- the gate electrode (24, 224) contacting an entire upper surface of the gate layer (22) and extending from the gate layer (22) toward at least one of the source electrode (32) and the drain electrode (34).

[Clause A20]

The method according to clause A19, where the forming a gate layer (22) includes:

- forming a mask layer (64) on the third nitride semiconductor layer (22);
- forming a gate mask (64A) by patterning the mask layer (64); and
- etching the third nitride semiconductor layer (22) with the gate mask (64A) to form the gate layer (22).

[Clause A21]

The method according to clause A20, where the forming a first insulation layer (27A) includes:

- forming a first insulation film (68) that covers the gate mask (64A) and the gate layer (22); and
- flattening the first insulation film (68) and removing the gate mask (64A) to form the first insulation layer (27A) exposing an upper surface of the gate layer (22).

[Clause A22]

The method according to clause A20, where the forming a first insulation layer (27A) includes:

- forming a first insulation film (68) that covers the gate mask and the gate layer (22);
- flattening the first insulation film (68) and leaving part (64B) of the gate mask to form the first insulation layer (27A); and
- removing the part (64B) of the gate mask to expose an upper surface of the gate layer (22).

[Clause A23]

The method according to clause A21 or A22, where:

forming a gate electrode (24, 224) includes forming a metal layer 70 that covers the gate layer (22) and the first insulation layer (27A), and patterning the metal layer (70) to form the gate electrode (24, 224); and the forming a second insulation layer (27B) includes forming a second insulation film (74) that covers the gate electrode (24, 224) and the first insulation layer (27A); and flattening the second insulation film (74) to form the second insulation layer (27B).

[Clause B1]

A nitride semiconductor device (610, 710), including:

an electron transit layer (616) composed of a nitride semiconductor;

an electron supply layer (618) formed on the electron transit layer (616) and composed of a nitride semiconductor having a larger band gap than the electron transit layer (616);

an insulation layer (626) formed on the electron supply layer (618); and a specified electrode (640) including a contact (641) that contacts the electron supply layer (618) through an opening (626A, 626B, 626C) extending through the insulation layer (626), where:

the contact (641) includes a conductive layer (642) that contacts the electron supply layer (618);

the conductive layer (642) includes a contact layer (644) containing at least one selected from titanium and tantalum and contacting a portion (618A) of the electron supply layer (618) exposed through the opening (626A, 626B, 626C), and a diffusion layer (645) containing a diffused metal and formed on the contact layer (644); and the diffused metal is a metal contained in the electron supply layer (618).

[Clause B2]

The nitride semiconductor device (610, 710) according to clause B1, where a part (HA) of the electron supply layer (618) that overlaps the opening (626A, 626B, 626C) in plan view has a higher concentration of the diffused metal than a part (LA) of the electron supply layer (618) that does not overlap the opening (626A, 626B, 626C).

[Clause B3]

The nitride semiconductor device (610, 710) according to clause B1 or B2, where:

the contact (641) includes a metal layer (643) formed on the conductive layer (642) and containing at least one selected from tungsten and aluminum; and the conductive layer (642) includes a protective layer (646) located between the diffusion layer (645) and the metal layer (643) and containing at least one selected from titanium and tantalum.

[Clause B4]

The nitride semiconductor device (610) according to any one of clauses B1 to B3, where:

the conductive layer (642) includes a bottom portion (642A) contacting the electron supply layer (618) and a side portion (642B) rising from the bottom portion (642A) and contacting a side wall of the opening (626C); and the metal layer (643) fills a region in the opening (626C) defined by the bottom portion (642A) and the side portion (642B) of the conductive layer (642).

[Clause B5]

The nitride semiconductor device (610) according to clause B3 or B4, where:

the metal layer (643) contains tungsten;

the diffusion layer (645) contains aluminum; and the protective layer (646) has a lower content ratio of aluminum than the diffusion layer (645).

[Clause B6]

The nitride semiconductor device (710) according to any one of clauses B3 to B5, where:

the contact layer (644) contains titanium; and the protective layer (646) contains titanium.

[Clause B7]

The nitride semiconductor device (710) according to any one of clauses B3 to B6, where:

the contact layer (644) contains tantalum; and the protective layer (646) contains tantalum.

[Clause B8]

The nitride semiconductor device (610, 710) according to any one of clauses B1 to B7, where the diffusion layer (645) has a thickness of 100 nm or less.

[Clause B9]

The nitride semiconductor device (610, 710) according to any one of clauses B1 to B8, where:

the contact layer (644) contains a specified metal selected from titanium and tantalum; and the diffusion layer (645) contains the diffused metal and the specified metal.

[Clause B10]

The nitride semiconductor device (610, 710) according to any one of clauses B1 to B9, where:

the specified electrode (640) includes an extension (647) on the insulation layer (626); and the extension (647) extends continuously from the contact (641).

[Clause B11]

The nitride semiconductor device (610, 710) according to any one of clauses B1 to B10, where the opening (626A, 626B, 626C) includes a source opening (626A) and a drain opening (626B) that are separated from each other, the nitride semiconductor device further including:

a gate electrode (624) located between the source opening (626A) and the drain opening (626B) and covered by the insulation layer (626);

a source electrode (628) that contacts the electron supply layer (618) through the source opening (626A); and a drain electrode (630) that contacts the electron supply layer (618) through the drain opening (626B), at least one of the source electrode (628) and the drain electrode (630) being the specified electrode (648).

[Clause B12]

The nitride semiconductor device (610, 710) according to clause B11, where:

the source electrode (628) is the specified electrode (640);

the source electrode (628) includes an extension (647) on the insulation layer (626);

the extension (647) extends continuously from the contact (641); and the extension (647) includes a field plate electrode (631) extending from the source opening (626A) to a location closer to the drain opening (626B) than the gate electrode (624) in plan view.

[Clause B13]

The nitride semiconductor device (710) according to clause B10 or B12, where the extension (647) extends continuously from the contact (641) and includes the metal layer (643) formed on the conductive layer (642).

[Clause B14]

The nitride semiconductor device (610, 710) according to any one of clauses B1 to B13, where:

the electron transit layer (616) is a GaN layer;

the electron supply layer (618) is an AlGaN layer; and the diffused metal contains aluminum.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A nitride semiconductor device, comprising:

a substrate;

an electron transit layer formed above the substrate;

an electron supply layer formed on the electron transit layer and having a band gap that is larger than that of the electron transit layer;

a gate layer formed on the electron supply layer and containing an acceptor impurity;

a gate electrode formed on the gate layer; and a source electrode and a drain electrode that are located at opposite sides of the gate layer and contact the electron supply layer, wherein the gate electrode has a length that is greater than that of the gate layer in a first direction in which the source electrode, the gate layer, and the drain electrode are arranged, the gate electrode contacts an entire upper surface of the gate layer and extends from the gate layer toward at least one of the source electrode and the drain electrode, and the gate layer and the gate electrode each have a closed-shape to surround the drain electrode in plan view.

2. The nitride semiconductor device according to claim 1, wherein the gate electrode includes a connecting portion contacting the entire upper surface of the gate layer, a source-side extension extending from the connecting portion toward the source electrode, and a drain-side extension extending from the connecting portion toward the drain electrode.

3. The nitride semiconductor device according to claim 2, wherein a lower surface of the source-side extension and a lower surface of the drain-side extension are flush with a lower surface of the connecting portion.

4. The nitride semiconductor device according to claim 2, wherein a lower surface of the source-side extension and a lower surface of the drain-side extension are located upward from a lower surface of the connecting portion.

5. The nitride semiconductor device according to claim 2, wherein the source-side extension and the drain-side extension are equal in thickness to the connecting portion.

6. The nitride semiconductor device according to claim 2, wherein an upper surface of the connecting portion is located closer to the gate layer than upper surfaces of the source-side extension and the drain-side extension.

7. The nitride semiconductor device according to claim 2, wherein the source-side extension has a length of 10 nm or greater and 100 nm or less.

8. The nitride semiconductor device according to claim 2, wherein the source-side extension has a length of 60 nm or greater and 90 nm or less.

9. The nitride semiconductor device according to claim 2, wherein the drain-side extension has a length of 10 nm or greater and 100 nm or less.

10. The nitride semiconductor device according to claim 2, wherein the drain-side extension has a length of 60 nm or greater and 90 nm or less.

11. The nitride semiconductor device according to claim 2, wherein the source-side extension is equal in length to the drain-side extension.

12. The nitride semiconductor device according to claim 2, wherein the source-side extension differs in length from the drain-side extension.

13. The nitride semiconductor device according to claim 1, further comprising a passivation layer covering the gate layer and the gate electrode.

14. The nitride semiconductor device according to claim 1, further comprising a passivation layer that includes a first insulation layer contacting a side surface of the gate layer and a second insulation layer contacting a side surface and an upper surface of the gate electrode.

15. The nitride semiconductor device according to claim 14, wherein the first insulation layer and the second insulation layer are composed of a same material.

16. The nitride semiconductor device according to claim 14, wherein the first insulation layer and the second insulation layer are composed of different materials.

17. The nitride semiconductor device according to claim 2, further comprising a first insulation layer having an upper surface that contacts a lower surface of the source-side extension and a lower surface of the drain-side extension.

18. The nitride semiconductor device according to claim 1, wherein the gate layer includes a ridge contacting part of the gate electrode, a source-side step that is thinner than the ridge and extends toward the source electrode, and a drain-side step that is thinner than the ridge and extends toward the drain electrode.

* * * * *